US012632633B2

(12) United States Patent
Nomura et al.

(10) Patent No.: US 12,632,633 B2
(45) Date of Patent: May 19, 2026

(54) METHOD AND DESIGN APPARATUS

(71) Applicant: Fujitsu Limited, Kawasaki (JP)

(72) Inventors: Tomokazu Nomura, Odawara (JP);
Hideaki Katagiri, Fujisawa (JP)

(73) Assignee: Fujitsu Limited, Kawasaki (JP)

( * ) Notice: Subject to any disclaimer, the term of this patent is extended or adjusted under 35 U.S.C. 154(b) by 711 days.

(21) Appl. No.: 18/081,319

(22) Filed: Dec. 14, 2022

(65) Prior Publication Data

US 2023/0297749 A1    Sep. 21, 2023

(30) Foreign Application Priority Data

Mar. 18, 2022    (JP) ................................. 2022-043428

(51) Int. Cl.
*G06F 30/347* (2020.01)
(52) U.S. Cl.
CPC .................................. *G06F 30/347* (2020.01)
(58) Field of Classification Search
CPC ............................................... G06F 30/347
USPC .......................................................... 716/50
See application file for complete search history.

(56) References Cited

U.S. PATENT DOCUMENTS

| | | | | |
|---|---|---|---|---|
| 2003/0088837 A1* | 5/2003 | Pierrat | ................. | G06F 30/398 |
| | | | | 716/106 |
| 2011/0119311 A1* | 5/2011 | Fukuda | ............... | G09B 29/004 |
| | | | | 707/E17.05 |
| 2011/0239178 A1 | 9/2011 | Yamashita | | |
| 2013/0163356 A1* | 6/2013 | Yanagida | ............... | G11C 29/40 |
| | | | | 365/201 |
| 2015/0220424 A1* | 8/2015 | Yoshida | ............. | G06F 11/0793 |
| | | | | 714/38.1 |
| 2015/0339434 A1* | 11/2015 | Nifong | ................... | G06F 30/20 |
| | | | | 716/112 |
| 2018/0165398 A1* | 6/2018 | Chen | .................... | G06F 30/392 |

FOREIGN PATENT DOCUMENTS

JP         2011-203906         10/2011

* cited by examiner

*Primary Examiner* — Suchin Parihar

(74) *Attorney, Agent, or Firm* — STAAS HALSY LLP

(57) ABSTRACT

A processing unit reads out design information about a highest hierarchical layer from a storage unit, divides the highest hierarchical layer into a plurality of segments (segments, etc.) based on the design information about the highest hierarchical layer, detects overlapping areas (optimum placement areas) in which segments at a corresponding location among a plurality of instances in a lowest hierarchical layer included in the highest hierarchical layer overlap with each other at least partly when the plurality of instances are overlapped with each other, sets, in each of the overlapping areas in the plurality of instances, a temporary placement location in which a test cell used for testing of manufacturing variation in critical dimension is temporarily placed, and outputs information indicating the overlapping areas and the temporary placement locations.

11 Claims, 52 Drawing Sheets

```
#EXAMPLE OF SETTING FILE ABOUT HIGHEST HIERARCHICAL LAYER
#RULE DEFINITIONS
RULE {
  Unit nm ;                          #UNIT SPECIFIABLE IN um OR nm
  CHECK_WINDOW   2000  2000 ;        #CHECK WINDOW (UNIT COMPLIES WITH Unit DEFINITION)
  CHECK_RATIO    80 ;                #NEEDED TCD CELL PLACEMENT RATIO (%)
}
#INSTRUCTION TO HIGHEST HIERARCHICAL LAYER
CHIP {  #SPECIFY MODULE NAME OF HIGHEST HIERARCHICAL LAYER
  Unit nm ;                          #UNIT SPECIFIABLE IN um OR nm
  INHIBIT_AREA   0  0  10000  200000000 ;  #DUMMY TCD CELL PLACEMENT INHIBITION AREA (DEFINED BY COORDINATE SYSTEM IN HIGHEST HIERARCHICAL LAYER)
  INHIBIT_AREA   0  0  200000000  100000 ;  #DUMMY TCD CELL PLACEMENT INHIBITION AREA (DEFINED BY COORDINATE SYSTEM IN HIGHEST HIERARCHICAL LAYER)

#DEFAULT INSTRUCTIONS TO LOWER HIERARCHICAL LAYERS
MODULE COMMON_LOW_MODULE {       #FIXED HIERARCHICAL NAME (RESERVED WORD) OF LOWER HIERARCHICAL LAYER SHARED DEFAULT PARAMETER SETTING
  Unit nm ;                          #UNIT SPECIFIABLE IN um OR nm
  PLACE_RATIO_LOWER_LIMIT  80 ;      #DUMMY TCD CELL PLACEMENT RATIO (LOWER LIMIT) IN LOWER HIERARCHICAL LAYER
  PLACE_RATIO_UPPER_LIMIT  80 ;      #DUMMY TCD CELL PLACEMENT RATIO (UPPER LIMIT) IN LOWER HIERARCHICAL LAYER
  PLACE_AREA_LOWER_LIMIT   400000000 ;  #LOWER LIMIT SIZE (AREA) OF TCD CELL PLACEMENT AREAS GIVEN TO LOWER HIERARCHICAL LAYER
  RESERVE_RATIO            10 ;      #RESERVE AREA CREATION RATIO IN LOWER HIERARCHICAL LAYER (% INSTRUCTED)
}

#INSTRUCTIONS TO LOWER HIERARCHICAL LAYER
MODULE MODULE_A {       #SPECIFY MODULE NAME OF LOWER HIERARCHICAL LAYER
  Unit nm ;                          #UNIT SPECIFIABLE IN um OR nm
  INHIBIT_AREA   5000   1000   10000  2000 ;     #DUMMY TCD CELL PLACEMENT INHIBITION AREA (DEFINED IN LOWER HIERARCHICAL LAYER)
  INHIBIT_AREA   15000  10000  20000  200000 ;   #DUMMY TCD CELL PLACEMENT INHIBITION AREA (DEFINED IN LOWER HIERARCHICAL LAYER)
  PLACE_RATIO_LOWER_LIMIT  60 ;      #DUMMY TCD CELL PLACEMENT RATIO (LOWER LIMIT) IN LOWER HIERARCHICAL LAYER
  PLACE_RATIO_UPPER_LIMIT  70 ;      #DUMMY TCD CELL PLACEMENT RATIO (UPPER LIMIT) IN LOWER HIERARCHICAL LAYER
  PLACE_AREA_LOWER_LIMIT   400000000 ;  #LOWER LIMIT SIZE (AREA) OF TCD CELL PLACEMENT AREAS GIVEN TO LOWER HIERARCHICAL LAYER
  RESERVE_RATIO            10 ;      #RESERVE AREA CREATION RATIO IN LOWER HIERARCHICAL LAYER
  CONST_FILE   xxxx/yyyy/zzzzz/a_moduleA_const.txt   #CONSTRAINT FILE FOR LOWER HIERARCHICAL LAYER
}
```

FIG. 11

```
#CONSTRAINT MATTER FROM LOWER HIERARCHICAL LAYER TO HIGHEST HIERARCHICAL LAYER
MODULE_A {  #SPECIFY MODULE NAME OF LOWER HIERARCHICAL LAYER
  Unit mm;                          #UNIT SPECIFIABLE IN um OR mm
  INHIBIT_AREA     5000  1000  10000  20000 ;   #DUMMY TCD CELL PLACEMENT INHIBITION AREA (DEFINED IN LOWER HIERARCHICAL LAYER)
  INHIBIT_AREA    15000 10000 200000 200000 ;   #DUMMY TCD CELL PLACEMENT INHIBITION AREA (DEFINED IN LOWER HIERARCHICAL LAYER)
  PLACE_RATIO_LOWER_LIMIT  60 ;     #DUMMY TCD CELL PLACEMENT RATIO (LOWER LIMIT) IN LOWER HIERARCHICAL LAYER
  PLACE_RATIO_UPPER_LIMIT  70 ;     #DUMMY TCD CELL PLACEMENT RATIO (UPPER LIMIT) IN LOWER HIERARCHICAL LAYER
  PLACE_AREA_LOWER_LIMIT  40200800000 ;  #LOWER LIMIT SIZE (AREA) OF TCD CELL PLACEMENT AREAS GIVEN TO LOWER HIERARCHICAL LAYER
  RESERVE_RATIO 10 ;                #RESERVE AREA CREATION RATIO IN LOWER HIERARCHICAL LAYER (% INSTRUCTED)
}
```

FIG. 12

DummyTCD Window
| ParameterSet | PLACE | CHECK |
| Const.FileOutDir. | | |
EXEC
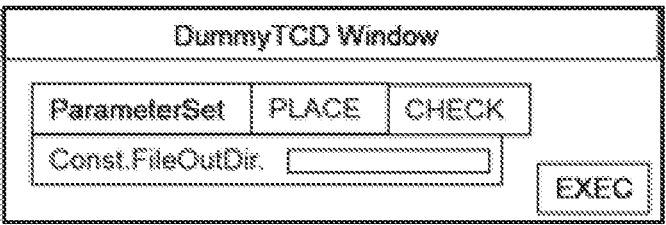
DummyTCD Setting Window
FILE: IN  OUT  _____  OK
RULE : Unit    um   nm
Check_Window   X 2000   Y 2000
Check_Ratio   50 %
Module
Select:
CHIP
COMMON_LOW_MODULE
MODULE_A
MODULE_B
MODULE_C
OK
FIG. 13

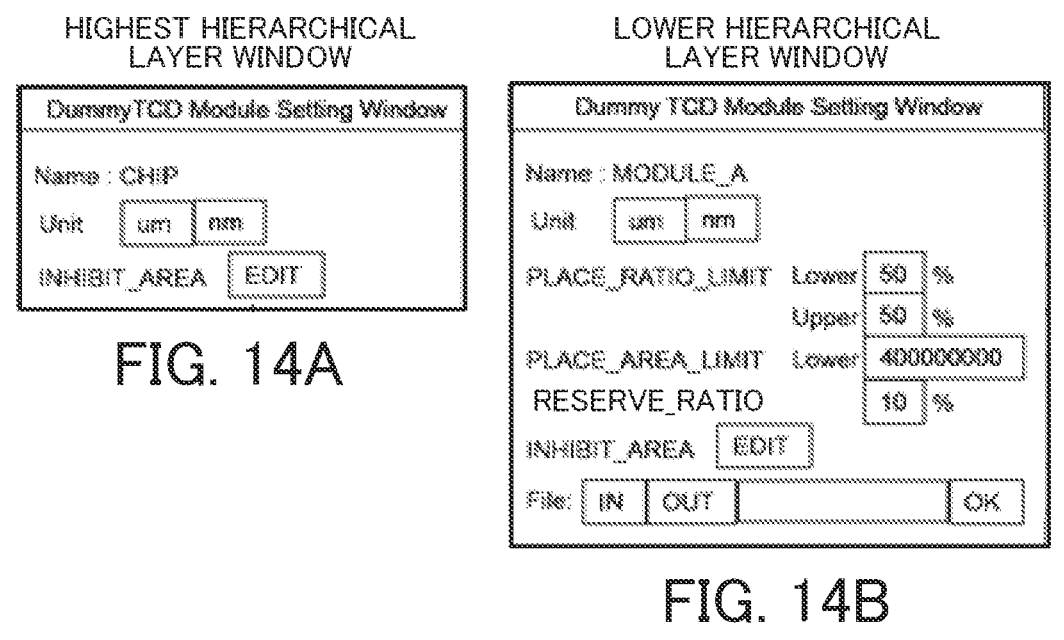

HIGHEST HIERARCHICAL
LAYER WINDOW

| DummyTCD Module Setting Window |
| --- |
| Name : CHIP |
| Unit [ um ] [ mm ] |
| INHIBIT_AREA [ EDIT ] |

FIG. 14A

LOWER HIERARCHICAL
LAYER WINDOW

| Dummy TCD Module Setting Window |
| --- |
| Name : MODULE_A |
| Unit [ um ] [ mm ] |
| PLACE_RATIO_LIMIT   Lower [ 50 ] %   Upper [ 50 ] % |
| PLACE_AREA_LIMIT   Lower [ 400000000 ] |
| RESERVE_RATIO   [ 10 ] % |
| INHIBIT_AREA [ EDIT ] |
| File: [ IN ] [ OUT ] [            ] [ OK ] |

FIG. 14B

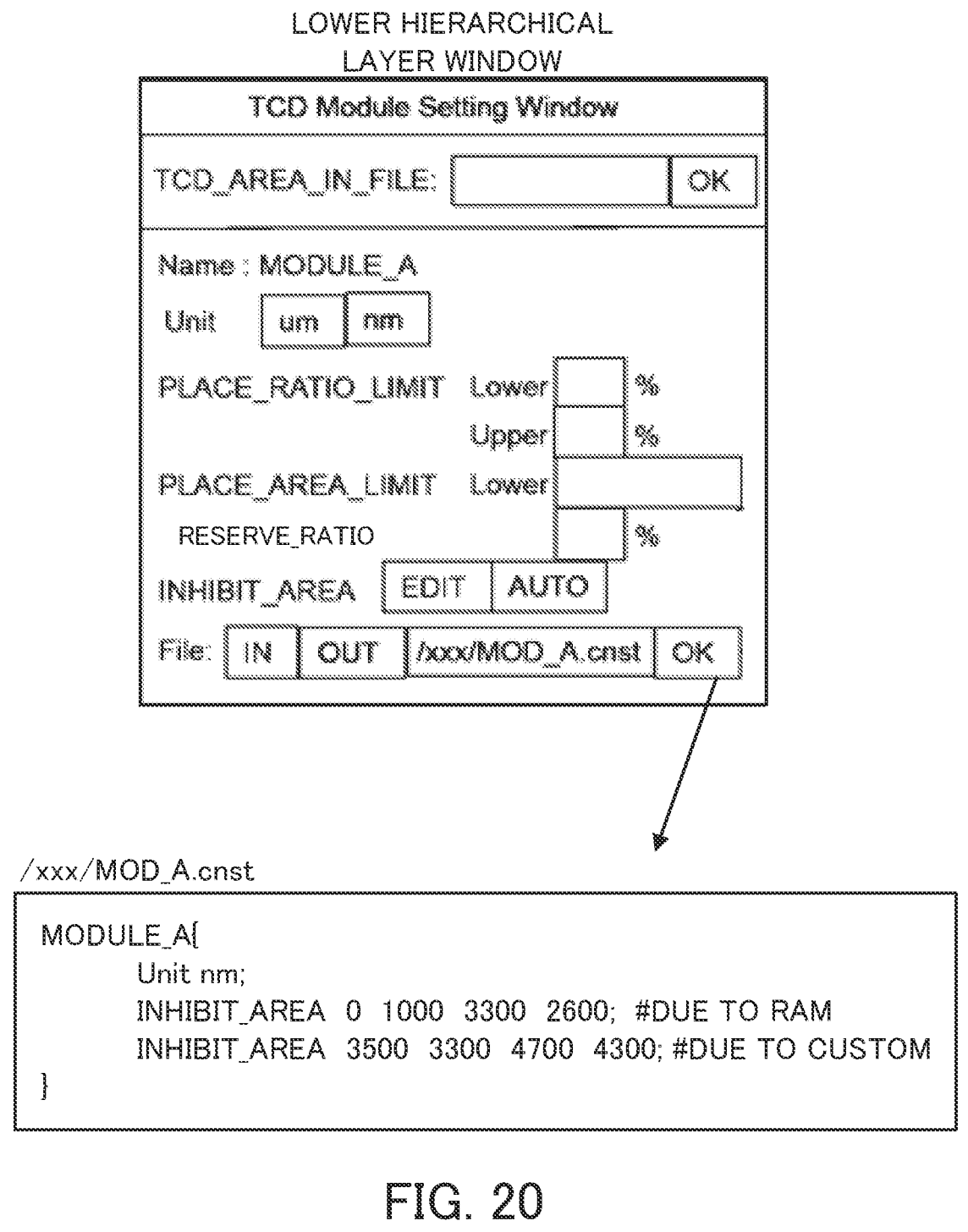

LOWER HIERARCHICAL
LAYER WINDOW

TCD Module Setting Window

TCD_AREA_IN_FILE: [＿＿＿＿＿＿＿] [ OK ]

Name : MODULE_A

Unit [ um | nm ]

PLACE_RATIO_LIMIT   Lower [＿] %

Upper [＿] %

PLACE_AREA_LIMIT   Lower [＿＿＿＿＿]

RESERVE_RATIO            [＿] %

INHIBIT_AREA   [ EDIT | AUTO ]

File: [ IN | OUT | /xxx/MOD_A.cnst | OK ]

/xxx/MOD_A.cnst

```
MODULE_A[
    Unit nm;
    INHIBIT_AREA  0  1000  3300  2600;  #DUE TO RAM
    INHIBIT_AREA  3500  3300  4700  4300;  #DUE TO CUSTOM
]
```

FIG. 20

Figure 21:
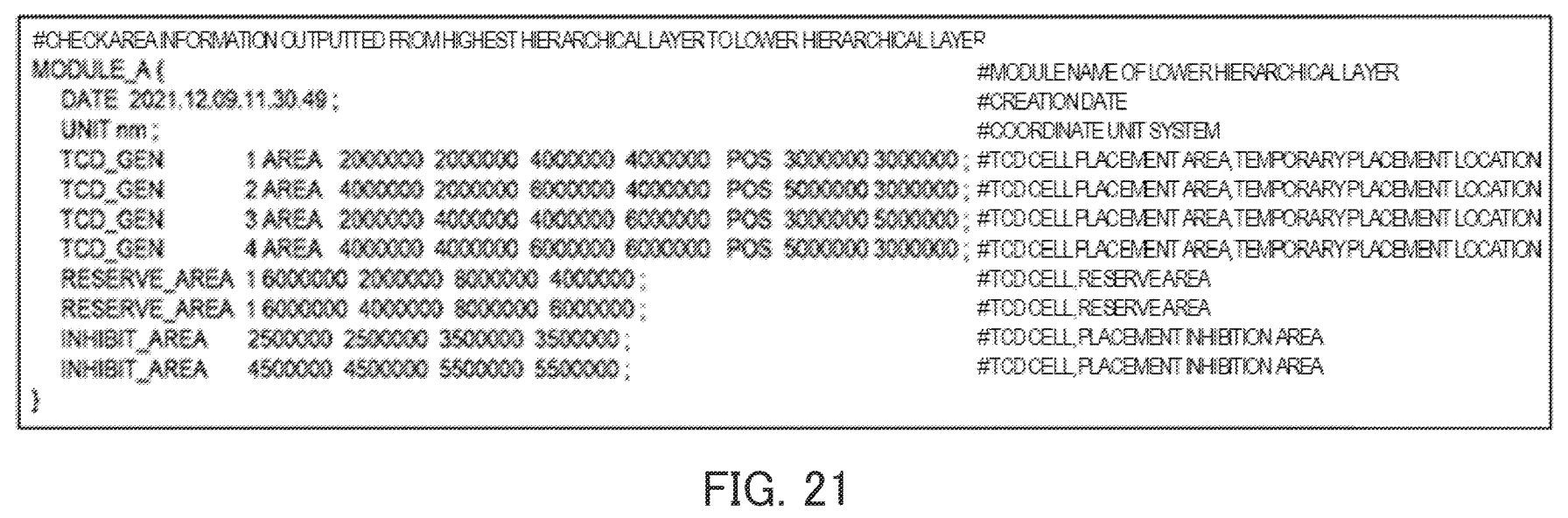

CHECK AREA INFORMATION OUTPUTTED FROM HIGHEST HIERARCHICAL LAYER TO LOWER HIERARCHICAL LAYER

MODULE_A (
DATE 2021.12.09.11.30.49 ;
UNIT nm ;

TOD_GEN    1 AREA   2000000  2000000  4000000  POS  30000000 30000000 ; #MODULE NAME OF LOWER HIERARCHICAL LAYER
TOD_GEN    2 AREA   4000000  2000000  8000000  POS  50000000 30000000 ; #CREATION DATE
TOD_GEN    3 AREA   2000000  4000000  6000000  POS  30000000 50000000 ; #COORDINATE UNIT SYSTEM
TOD_GEN    4 AREA   4000000  4000000  8000000  POS  50000000 30000000 ;

RESERVE_AREA  1 6000000  2000000  8000000  4000000 ; #TOD CELL PLACEMENT AREA TEMPORARY PLACEMENT LOCATION
RESERVE_AREA  1 6000000  4000000  8000000  8000000 ; #TOD CELL PLACEMENT AREA TEMPORARY PLACEMENT LOCATION
                                                     #TOD CELL PLACEMENT AREA TEMPORARY PLACEMENT LOCATION
INHIBIT_AREA   2500000  2500000  3500000  3500000 ; #TOD CELL PLACEMENT AREA TEMPORARY PLACEMENT LOCATION
INHIBIT_AREA   4500000  4500000  5500000  5500000 ;

TOD CELL RESERVE AREA
                                                     #TOD CELL RESERVE AREA

TOD CELL PLACEMENT INHIBITION AREA
                                                     #TOD CELL PLACEMENT INHIBITION AREA

(1) PLACE INSTANCES IN DIRECTION WITHOUT FLIP
INSTANCE a          INSTANCE b          INSTANCE c
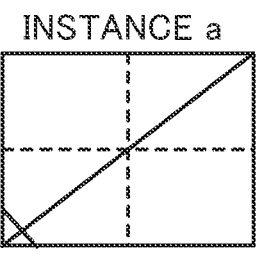 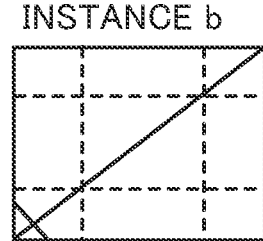 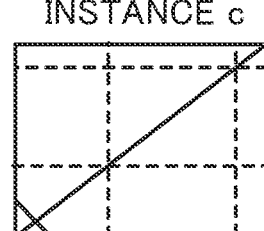
(2) DETERMINE REFERENCE INSTANCE
INSTANCE a          INSTANCE b          INSTANCE c
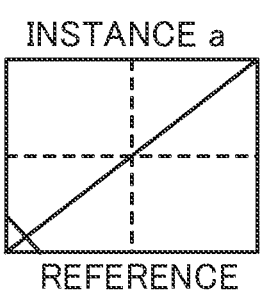 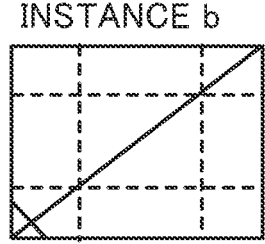 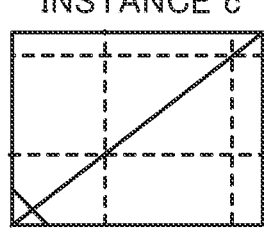
REFERENCE
INSTANCE
(3) DETERMINE PROCESSING ORDER
INSTANCE a          INSTANCE b          INSTANCE c
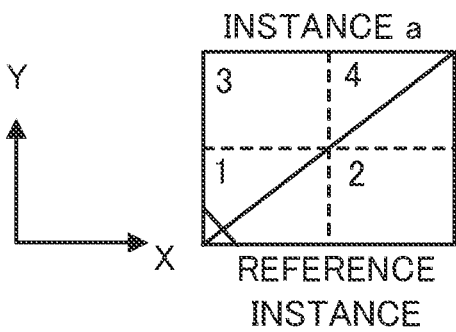 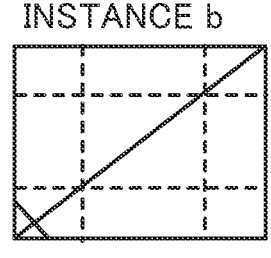 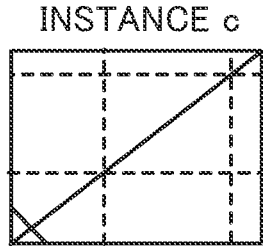
REFERENCE
INSTANCE
FIG. 25

\<PROCESSING ON REFERENCE AREA No.1 IN REFERENCE INSTANCE\>
(4) ACQUIRE CONTACT AREA
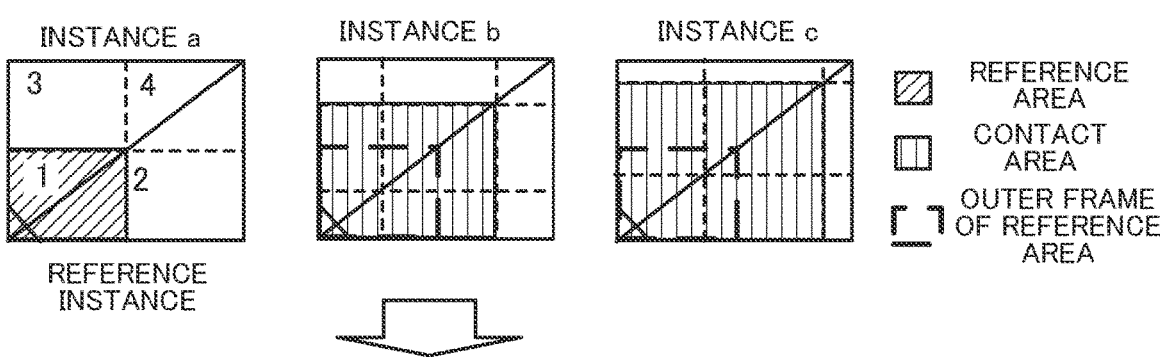
(5) DETECT AND AREA (OPTIMUM PLACEMENT AREA)
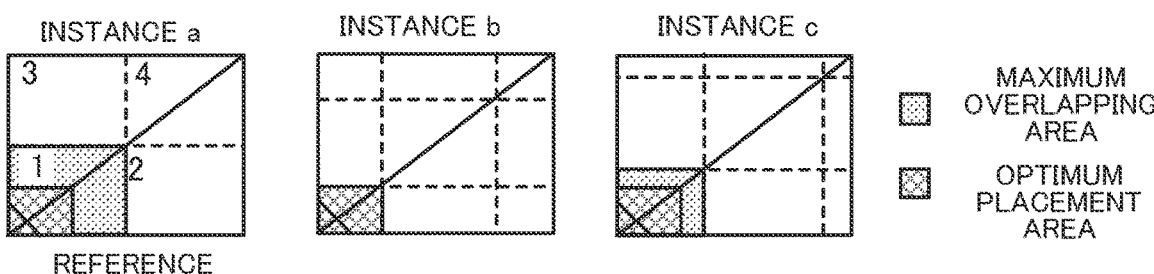
FIG. 26

<PROCESSING ON REFERENCE AREA No.2 IN REFERENCE INSTANCE>
(6) ACQUIRE CONTACT AREA
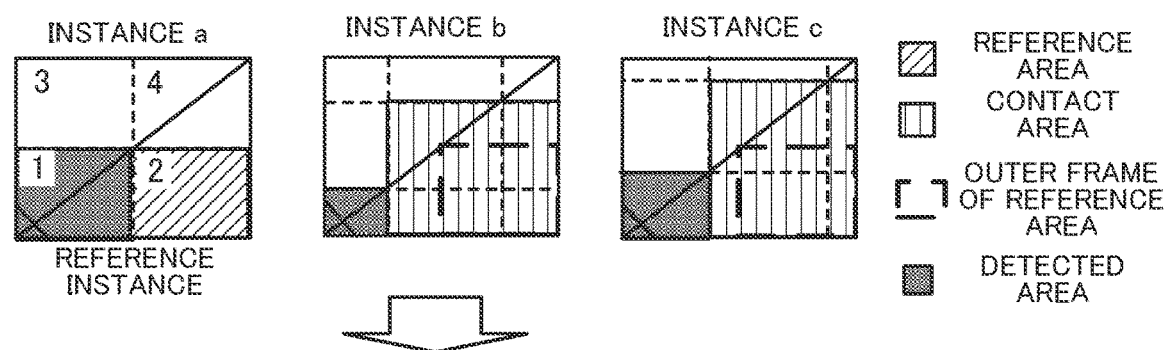
(7) DETECT AND AREA (OPTIMUM PLACEMENT AREA)
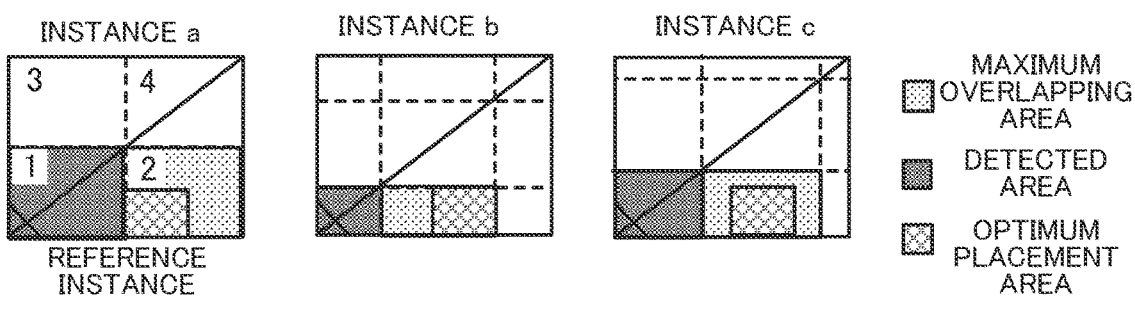
FIG. 27

<PROCESSING ON REFERENCE AREA No.3 IN REFERENCE INSTANCE>
(8) ACQUIRE CONTACT AREA
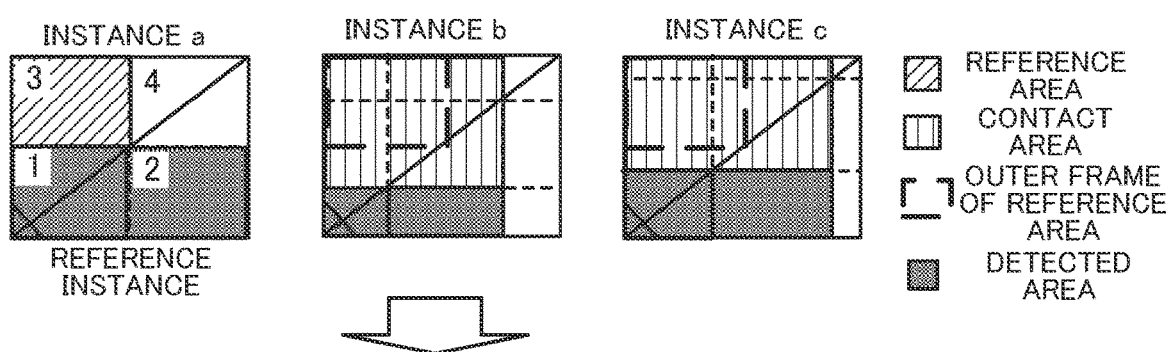
(9) DETECT AND AREA (OPTIMUM PLACEMENT AREA)
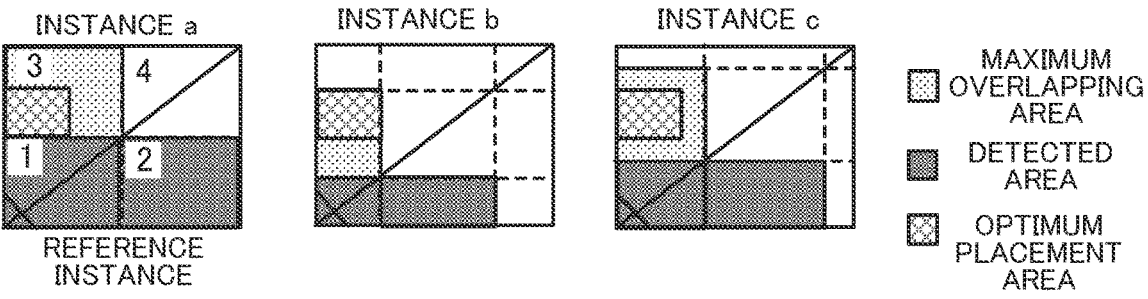
FIG. 28

<PROCESSING ON REFERENCE AREA No.4 IN REFERENCE INSTANCE>
(10) ACQUIRE CONTACT AREA
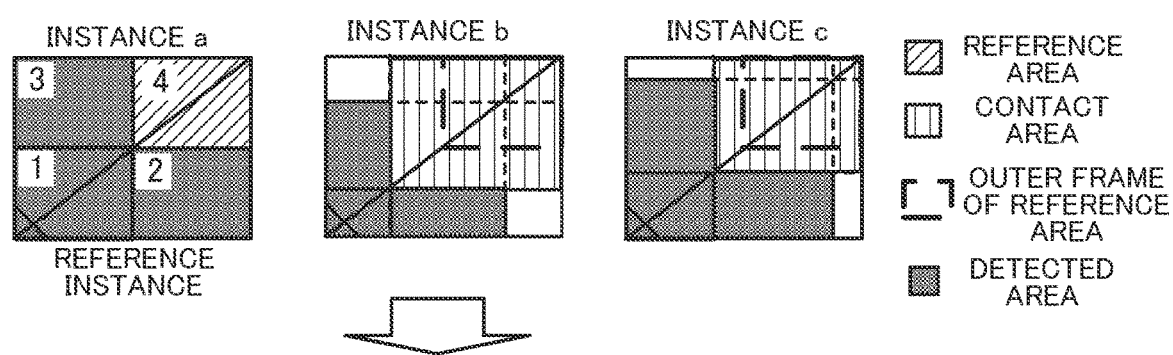
(11) DETECT AND AREA (OPTIMUM PLACEMENT
AREA)
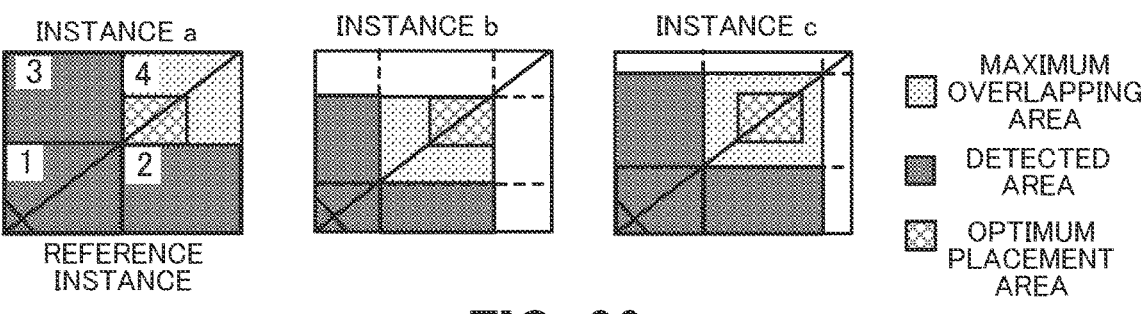
FIG. 29

<DUMMY TCD CELL PLACEMENT PROCESSING>

INSTANCE a          INSTANCE b          INSTANCE c

OPTIMUM
PLACEMENT AREA

DUMMY TCD CELL

<DUMMY TCD CELL EXPANSION FUNCTION>

■ DUMMY TCD CELL

▤ EXPANDED DUMMY
  TCD CELL

⬚ CHECK WINDOW
  (SEGMENT)

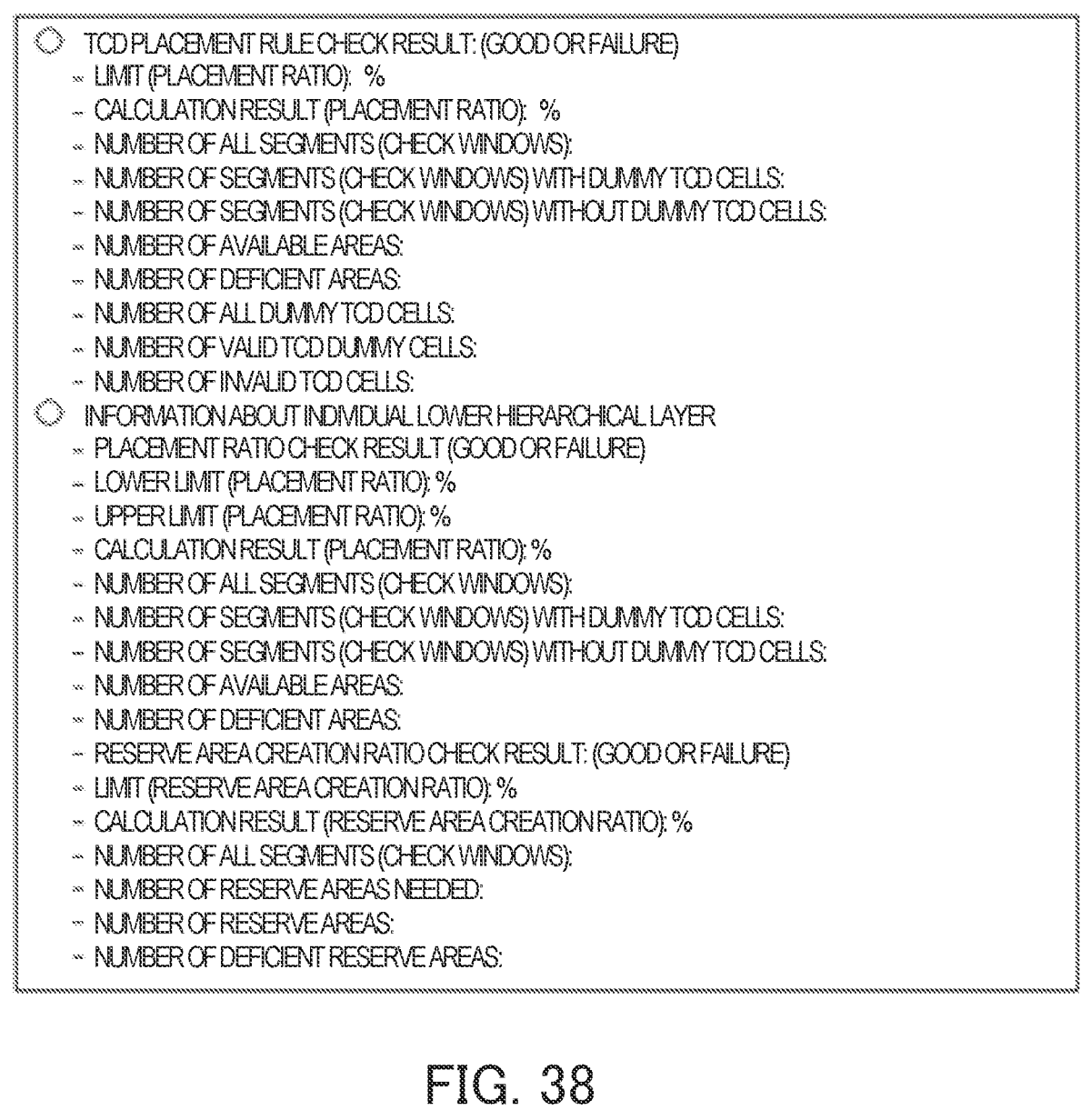

○  TCD PLACEMENT RULE CHECK RESULT: (GOOD OR FAILURE)
  ~ LIMIT (PLACEMENT RATIO): %
  ~ CALCULATION RESULT (PLACEMENT RATIO): %
  ~ NUMBER OF ALL SEGMENTS (CHECK WINDOWS):
  ~ NUMBER OF SEGMENTS (CHECK WINDOWS) WITH DUMMY TCD CELLS:
  ~ NUMBER OF SEGMENTS (CHECK WINDOWS) WITHOUT DUMMY TCD CELLS:
  ~ NUMBER OF AVAILABLE AREAS:
  ~ NUMBER OF DEFICIENT AREAS:
  ~ NUMBER OF ALL DUMMY TCD CELLS:
  ~ NUMBER OF VALID TCD DUMMY CELLS:
  ~ NUMBER OF INVALID TCD CELLS:
○  INFORMATION ABOUT INDIVIDUAL LOWER HIERARCHICAL LAYER
  ~ PLACEMENT RATIO CHECK RESULT (GOOD OR FAILURE)
  ~ LOWER LIMIT (PLACEMENT RATIO): %
  ~ UPPER LIMIT (PLACEMENT RATIO): %
  ~ CALCULATION RESULT (PLACEMENT RATIO): %
  ~ NUMBER OF ALL SEGMENTS (CHECK WINDOWS):
  ~ NUMBER OF SEGMENTS (CHECK WINDOWS) WITH DUMMY TCD CELLS:
  ~ NUMBER OF SEGMENTS (CHECK WINDOWS) WITHOUT DUMMY TCD CELLS:
  ~ NUMBER OF AVAILABLE AREAS:
  ~ NUMBER OF DEFICIENT AREAS:
  ~ RESERVE AREA CREATION RATIO CHECK RESULT: (GOOD OR FAILURE)
  ~ LIMIT (RESERVE AREA CREATION RATIO): %
  ~ CALCULATION RESULT (RESERVE AREA CREATION RATIO): %
  ~ NUMBER OF ALL SEGMENTS (CHECK WINDOWS):
  ~ NUMBER OF RESERVE AREAS NEEDED:
  ~ NUMBER OF RESERVE AREAS:
  ~ NUMBER OF DEFICIENT RESERVE AREAS:

FIG. 38

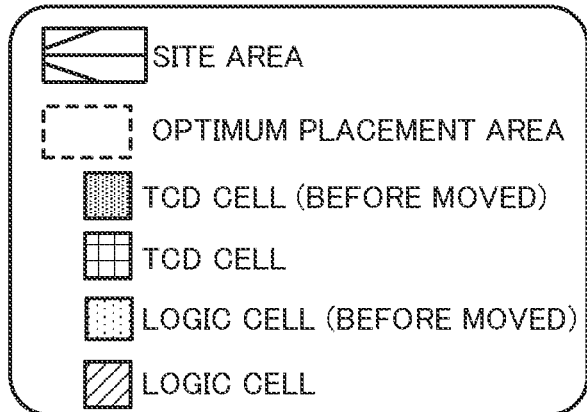
<CASE 1: SUCTION TO SITE AREA (LEGALIZE)>
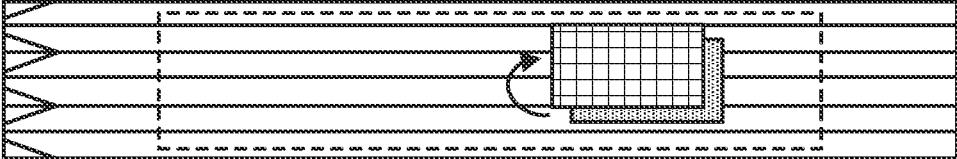
<CASE 2: OVERLAP RESOLVING PROCESSING>
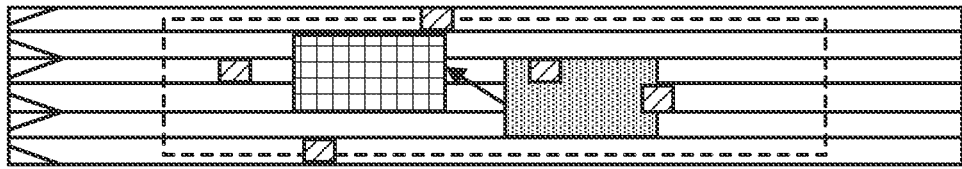
<CASE 3: MODIFICATION OF PLACEMENT>
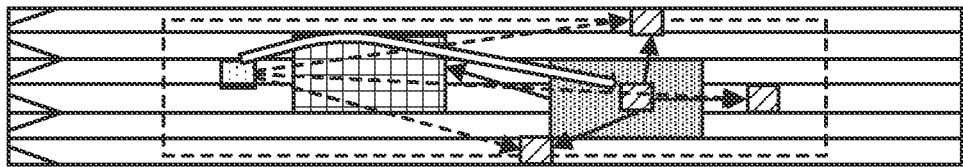
FIG. 48

Figure 50:
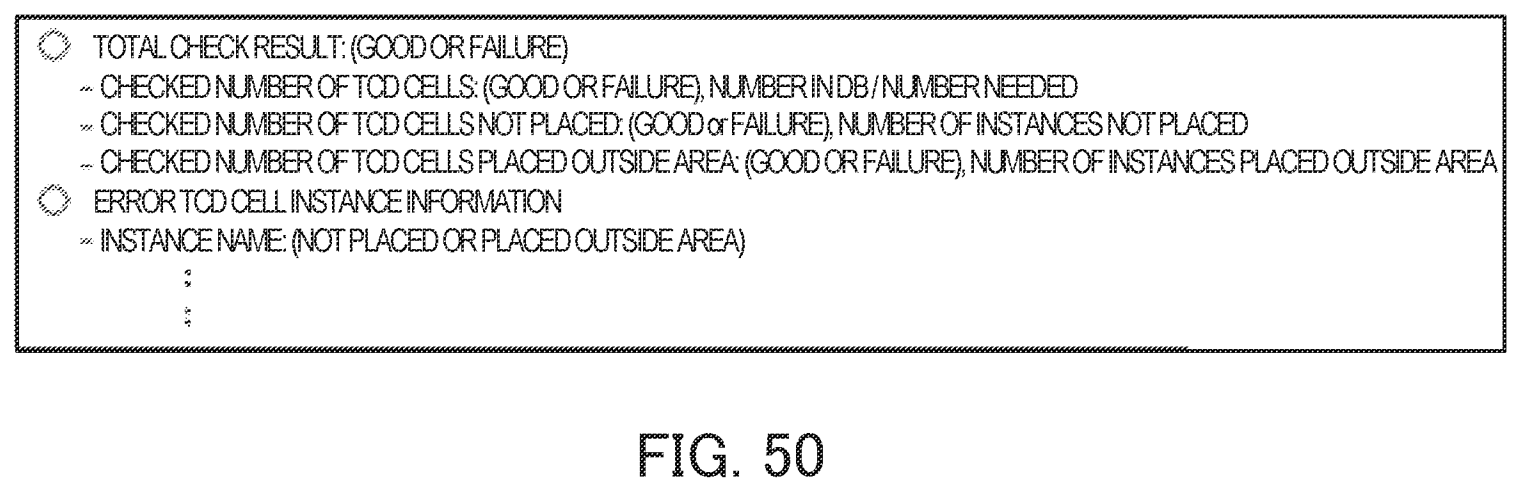

◇ TOTAL CHECK RESULT: (GOOD OR FAILURE)

~ CHECKED NUMBER OF TCD CELLS: (GOOD OR FAILURE), NUMBER IN DB / NUMBER NEEDED

≈ CHECKED NUMBER OF TCD CELLS NOT PLACED: (GOOD or FAILURE), NUMBER OF INSTANCES NOT PLACED

~ CHECKED NUMBER OF TCD CELLS PLACED OUTSIDE AREA: (GOOD OR FAILURE), NUMBER OF INSTANCES PLACED OUTSIDE AREA

◇ ERROR TCD CELL INSTANCE INFORMATION

≈ INSTANCE NAME (NOT PLACED OR PLACED OUTSIDE AREA)

METHOD AND DESIGN APPARATUS

CROSS-REFERENCE TO RELATED APPLICATION

This application is based upon and claims the benefit of priority of the prior Japanese Patent Application No. 2022-043428, filed on Mar. 18, 2022, the entire contents of which are incorporated herein by reference.

FIELD

The embodiments discussed herein relate to a design method and a design apparatus.

BACKGROUND

Miniaturization has progressed in semiconductor integrated circuits. As a method for improving manufacturing variation in critical dimension (CD) of these semiconductor integrated circuits, there is a method in which variation in manufacturing process on a die (which will be hereinafter referred to as a chip) is monitored.

Specifically, structures, each of which is called a test-key critical dimension (TCD) structure and has a bulk layer and a metal layer internally, are disposed on a chip. By checking the quality of these structures disposed on the chip, it is possible to monitor the variation in manufacturing process. The bulk layers are each a layer on a semiconductor substrate, and elements such as transistors, capacitors, and resistors are patterned on the bulk layers in a substrate process. The metal layers are layers where wirings connected to the individual elements as described above are formed in a wiring process. Each of the TCD structures is included in a dedicated cell referred to as a TCD cell.

According to a design rule check (DRC) placement rule, placing TCD cells in at least a predetermined ratio of segments (also referred to as check windows) obtained by dividing a whole chip at constant intervals is a tape-out condition. The placement of a TCD cell could be determined invalid, depending on the placement location of the TCD cell (see FIG. 2).

In many cases, when a large-scale semiconductor integrated circuit is designed, hierarchical design is conducted (see, for example, Japanese Laid-open Patent Publication 2011-203906). TCD cells are placed in cell placement areas, which are called site areas and which are set in view of power supply. When hierarchical design is conducted, the site areas are located in a lowest hierarchical layer. That is, the TCD cells are placed in a lowest hierarchical layer.

Validation based on the DRC placement rule is performed in the highest hierarchical layer. Thus, if TCD cells are not placed in at least a predetermined ratio of segments due to, for example, occurrence of many invalid TCD cells, TCD cells are placed again in the lowest hierarchical layer, the highest hierarchical layer is assembled, and the validation is performed again in the highest hierarchical layer. Therefore, the design period could be consequently extended.

SUMMARY

In one aspect, there is provided a non-transitory computer-readable recording medium storing therein a design program that causes a computer to execute a process including: reading out first design information about a highest hierarchical layer from a memory and dividing the highest hierarchical layer into a plurality of segments based on the first design information; detecting overlapping areas in which segments at a corresponding location among a plurality of instances in a lowest hierarchical layer included in the highest hierarchical layer overlap with each other at least partly when the plurality of instances are overlapped with each other; setting, in each of the overlapping areas in the plurality of instances, a temporary placement location in which a test cell used for testing of manufacturing variation in critical dimension is temporarily placed; and outputting information indicating the overlapping areas and the temporary placement locations.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 11 illustrates an example of setting information about a highest hierarchical layer;

FIG. 12 illustrates an example of setting information about a lowest hierarchical layer;

FIG. 13 illustrates a setting information generation example using an interactive editor;

FIGS. 14A and 14B illustrate examples of a highest hierarchical layer setting screen and a lowest hierarchical layer setting screen;

FIG. 20 illustrates a generation example of a setting file including setting information about a lowest hierarchical layer by using the interactive editor;

FIG. 21 illustrates an example of check area information;

FIG. 25 is a first diagram illustrating an example of optimum placement area detection processing;

FIG. 26 is a second diagram illustrating the example of the optimum placement area detection processing;

FIG. 27 is a third diagram illustrating the example of the optimum placement area detection processing;

FIG. 28 is a fourth diagram illustrating the example of the optimum placement area detection processing;

FIG. 29 is a fifth diagram illustrating the example of the optimum placement area detection processing;

FIG. 38 illustrates an example of an outputted validation result;

FIG. 48 illustrates TCD cell placement modification examples;

FIG. 50 illustrates an example of an outputted validation result;

DESCRIPTION OF EMBODIMENTS

Hereinafter, embodiments will be described with reference to drawings.

First Embodiment

Figure 1:
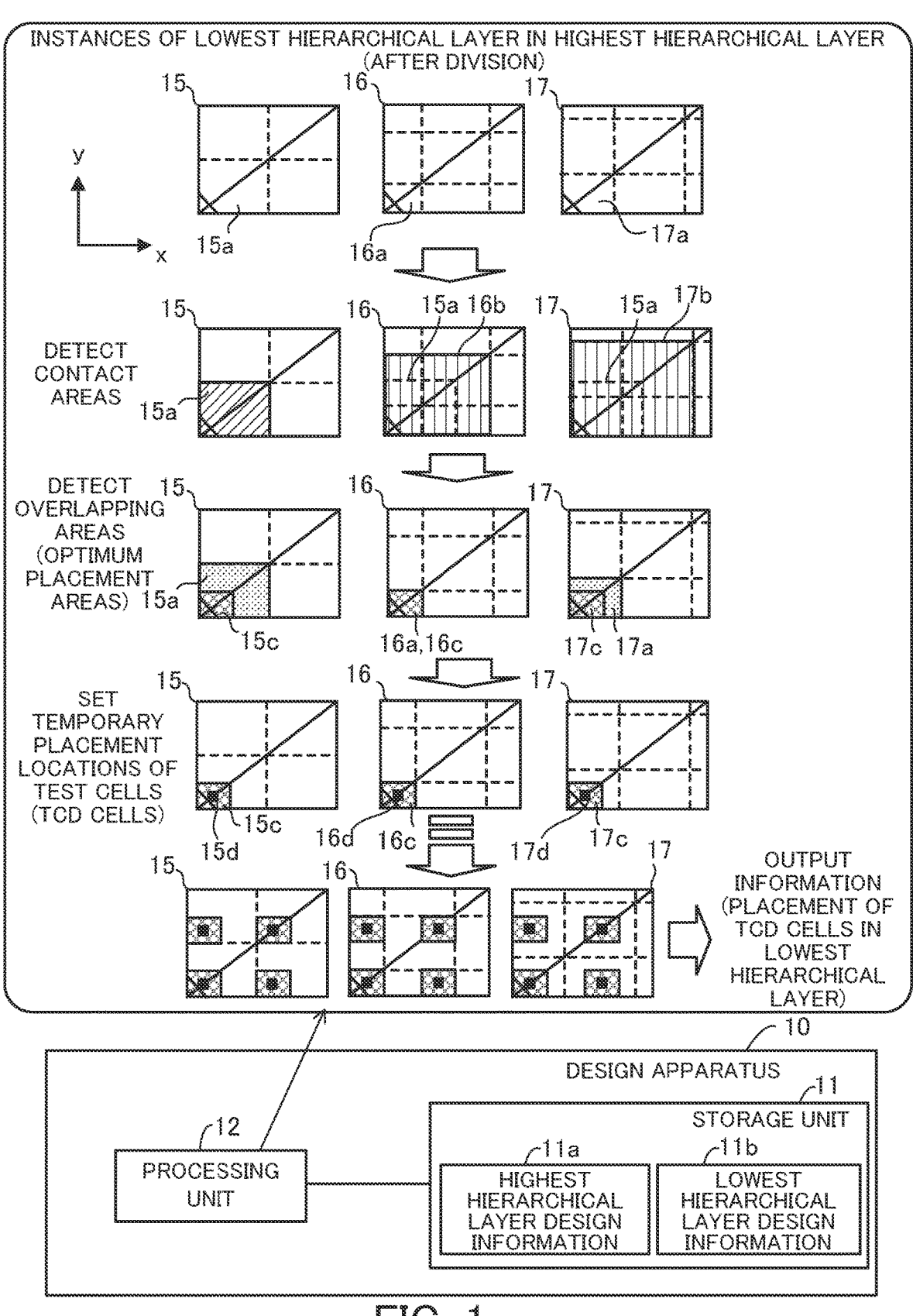
FIG. 1 illustrates an example of a design apparatus and a design method of a first embodiment.

FIG. 1 illustrates an example of a design apparatus and a design method of a first embodiment.

A design apparatus 10 of the first embodiment performs hierarchical design.

The design apparatus 10 includes a storage unit 11 and a processing unit 12.

The storage unit 11 is, for example, a volatile storage device such as a random access memory (RAM) or a non-volatile storage device such as a hard disk drive (HDD) or a flash memory.

The storage unit 11 stores highest hierarchical layer design information 11a and lowest hierarchical layer design information 11b.

The highest hierarchical layer design information 11a includes design information about a highest hierarchical layer including a plurality of instances of a lowest hierarchical layer. The plurality of instances of the lowest hierarchical layer may include vertically or horizontally inverted instances of a certain instance, for example. The highest hierarchical layer may include instances of a plurality of lowest hierarchical layers. For example, the plurality of lowest hierarchical layers may have different sizes or functions from each other.

The lowest hierarchical layer design information 11b includes design information about the lowest hierarchical layer used in the highest hierarchical layer. The lowest hierarchical layer design information 11b may include design information about a plurality of lowest hierarchical layers.

For example, the highest hierarchical layer design information 11a and the lowest hierarchical layer design information 11b may be generated by the design apparatus 10 based on input by a designer or may be generated by another design apparatus. In the latter case, the highest hierarchical layer design information 11a and the lowest hierarchical layer design information 11b may be acquired by the design apparatus 10 and stored in the storage unit 11.

The processing unit 12 may be realized by, for example, a hardware processor such as a central processing unit (CPU), a graphics processing unit (GPU), or a digital signal processor (DSP). The processing unit 12 may include an electronic circuit such as an application specific integrated circuit (ASIC) or a field programmable gate array (FPGA). The processor executes a program stored in a memory such as a RAM. For example, the processor executes a design program for causing the design apparatus 10 to perform the processing described below. A group of processors may be referred to as a "multiprocessor" or simply a "processor", as needed.

The processing unit 12 sets temporary placement locations for the above TCD cells, which are examples of test cells used in testing of manufacturing variation in critical dimension in the highest hierarchical layer.

For example, the temporary placement locations are set as follows.

The processing unit 12 reads out the highest hierarchical layer design information 11a from the storage unit 11 and divides the highest hierarchical layer into a plurality of segments based on the highest hierarchical layer design information 11a. Next, the processing unit 12 detects overlapping areas in which segments at a corresponding location among a plurality of instances in a lowest hierarchical layer (a plurality of instances in a single lowest hierarchical layer when there are a plurality of lowest hierarchical layers, and the same applies to the following description) included in the highest hierarchical layer overlap with each other at least partly when the plurality of instances are overlapped with each other.

FIG. 1 illustrates a plurality of instances 15 to 17 of a lowest hierarchical layer in the highest hierarchical layer. In the instances 15 to 17, dashed lines represent boundaries of segments obtained by dividing the highest hierarchical layer. The number of segments and the size of the individual segment may differ among the instances 15 to 17, depending on the placement location or direction of the individual instance in the highest hierarchical layer, for example.

For example, the instance 15 includes four segments including a segment 15a. The instance 16 includes nine segments including a segment 16a. The instance 17 includes nine segments including a segment 17a.

In each of the instances 15 to 17, a diagonal line and a line orthogonal thereto represent the direction of this instance.

When the overlapping areas are detected, the instances 15 to 17 extracted from the highest hierarchical layer are placed in the same direction (without a flip).

Because the area of the left bottom segment of the instance 15 is the largest among the areas of the left bottom segments of the instances 15 to 17, the processing unit 12 sets the instance 15 as a reference instance. Next, the processing unit 12 determines the segments of the other instances at the locations corresponding to the segments of the reference instance as follows, for example.

The processing unit 12 sets, as a reference area one by one, the four segments of the instance 15, which is set as the reference instance, for example, in ascending order of the x coordinates or y coordinates (the bottom left corner of each of the instances 15 to 17 is x=y=0). FIG. 1 illustrates an example in which the segment 15a is set as the reference area.

Next, in each of the instances 16 and 17, the processing unit 12 detects at least one segment (hereinafter referred to as a contact area) that comes into contact with the segment 15a set as the reference area when the instances 15 to 17 are overlapped with each other.

In the example in FIG. 1, in the instance 16, a contact area 16b formed by four segments that come into contact with the segment 15a is detected. In addition, in the instance 17, a contact area 17b formed by four segments that come into contact with the segment 15a is detected.

Next, in each of the contact areas 16b and 17b, the processing unit 12 determines a segment that overlaps with the segment 15a set as the reference area most as a segment at a location corresponding to the segment 15a. In the example in FIG. 1, in the instance 16, the segment 16a is determined as a segment at a location corresponding to the segment 15a, and in the instance 17, the segment 17a is determined as a segment at a location corresponding to the segment 15a.

Next, the processing unit 12 detects overlapping areas (AND areas) in which segments at a corresponding location among the instances 15 to 17 overlap with each other at least partly. Because these overlapping areas could be used as optimum placement areas for TCD cells, these overlapping areas will hereinafter be referred to as optimum placement areas.

In the example in FIG. 1, optimum placement areas 15c to 17c are obtained for the instances 15 to 17, respectively. The optimum placement areas 15c to 17c are areas that have the same size and that are set at the same location as the segment 16a of the instance 16.

In addition, the processing unit 12 sets a temporary placement location in which a TCD cell is temporarily placed in each of the optimum placement areas 15c to 17c in the instances 15 to 17. As illustrated in FIG. 1, the setting of the temporary placement locations may be performed by placing dummy cells (hereinafter referred to as dummy TCD cells) 15d to 17d, each of which has the same size as a TCD cell, in the optimum placement areas 15c to 17c, respectively.

According to the physical definitions of a TCD cell, the TCD cell includes information about its size, bulk, wiring, etc. However, according to the physical definitions of a dummy TCD cell, the dummy TCD cell may include only the information about its size. In addition, while there is a constraint that TCD cells need to be placed in site areas, there is no such constraint for dummy TCD cells. In addition, no library is needed for the dummy TCD cells, and a person who is not a TCD cell designer is able to define the dummy TCD cells. Thus, as will be described below, before the TCD cells are provided officially, placement validation may be performed in advance by using the dummy TCD cells. In addition, the dummy TCD cells differ from the TCD cells in that, for example, the dummy TCD cells do not need to be registered in a database.

The dummy TCD cells 15d to 17d may be placed in their respective optimum placement areas 15c to 17c based on user input. Alternatively, the processing unit 12 may place each of the dummy TCD cells 15d to 17d in an area (for example, in a center portion) in the corresponding one of the optimum placement areas 15c to 17c.

The processing unit 12 performs the processing as described above by using each segment in the reference instance set as the reference area.

In addition, the processing unit 12 performs placement validation of whether the placement rule is satisfied on the highest hierarchical layer including the instances 15 to 17 in which the dummy TCD cells are placed. As described above, according to the DRC placement rule, placing TCD cells in at least a predetermined ratio of segments of the plurality of segments obtained by dividing a whole chip at constant intervals is a tape-out condition. According to the design method of the present embodiment, the placement validation of whether the placement rule is satisfied is performed on the highest hierarchical layer including the instances 15 to 17 in which dummy TCD cells are placed, instead of on the highest hierarchical layer in which TCD cells are placed.

If the processing unit 12 determines that the placement rule is not satisfied, for example, the processing unit 12 adjusts various kinds of parameters used for the placement of the dummy TCD cells. These parameters will be described below.

If the processing unit 12 determines that the placement rule is satisfied, the processing unit 12 outputs information indicating the individual optimum placement areas and temporary placement locations (the placement locations of the dummy TCD cells). The processing unit 12 may output information indicating the individual optimum placement areas and temporary placement locations to a display device (not illustrated) and may cause the display device to display the information. The processing unit 12 may output the information to the storage unit 11 and may cause the storage unit 11 to store the information. In addition, the processing unit 12 may output (transmit) the information to an apparatus outside the design apparatus 10.

While described in detail below, for example, the processing unit 12 performs processing for placing TCD cells in the temporary placement locations in the lowest hierarchical layer, based on the lowest hierarchical layer design information 11b and the information indicating the individual optimum placement areas and temporary placement locations (the locations where the dummy TCD cells are placed). If another cell is placed in a temporary placement location in the lowest hierarchical layer, the processing unit 12 may shift the placement area of the TCD cell from the temporary placement location within the corresponding optimum placement area.

The processing for placing TCD cells in the lowest hierarchical layer may be performed by another design apparatus other than the design apparatus 10.

With the above design apparatus 10 and design method of the first embodiment, the setting of the temporary placement locations of the TCD cells is performed on the plurality of instances of the lowest hierarchical layer included in the highest hierarchical layer, based on the segments of the highest hierarchical layer. Thus, occurrence of TCD cells determined invalid in the highest hierarchical layer is reduced, and the number of times that TCD cells are placed again in the lowest hierarchical layer, the number of times that the highest hierarchical layer is assembled, and the number of times that validation is performed again in the highest hierarchical layer are reduced. Therefore, the design period (design turnaround time (TAT)) in the hierarchical design is shortened.

The following description will be made on why many invalid TCD cells occur when TCD cell placement areas are determined in a lowest hierarchical layer as in a conventional technique.

(Why Many Invalid TCD Cells Occur when TCD Cell Placement Areas are Determined in Lowest Hierarchical Layer)

Figure 2:
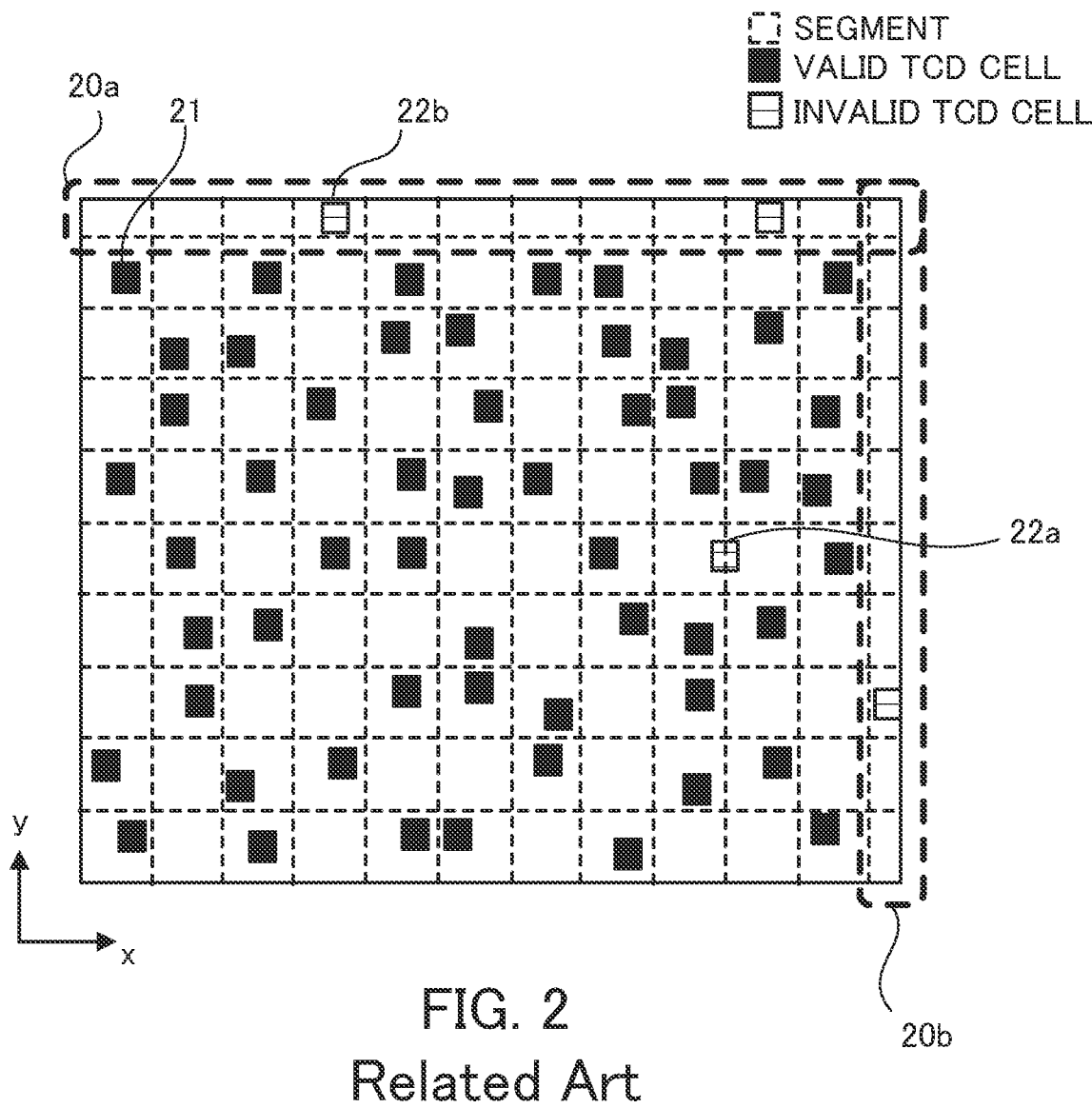
FIG. 2 illustrates a validation example of a TCD cell placement rule.

FIG. 2 illustrates a validation example of a TCD cell placement rule.

This chip has been divided into areas at constant intervals by using the bottom left corner as the start point of the area division. For example, assuming that this chip has a length of 11500 μm in the x direction and a length of 9500 μm in the y direction and is divided at intervals of 1000 μm in both of the x and y directions, eleven segments are generated in the x direction and nine segments are generated in the y direction, as illustrated in FIG. 2. Areas 20a and 20b whose interval is less than 1000 μm are not recognized as segments.

When validation of the TCD cell placement rule is performed, if TCD cells are placed in at least a predetermined ratio of segments of all the segments, the placement rule is determined to be satisfied. For example, when the predetermined ratio is 50% and the number of segments is 99 as in FIG. 2, if TCD cells are placed in at least 50 segments, the placement rule is determined to be satisfied.

The individual TCD cell is determined valid or invalid depending on the placement location of the TCD cell. A TCD cell (for example, a TCD cell 21) placed in a segment is determined valid. In contrast, a TCD cell (for example, a TCD cell 22a) placed over a plurality of segments and a TCD cell (for example, a TCD cell 22b) placed in the area 20a or 20b, which is not recognized as a segment, is determined invalid.

Many invalid TCD cells as described above could occur when hierarchical design is performed.

Figure 3:
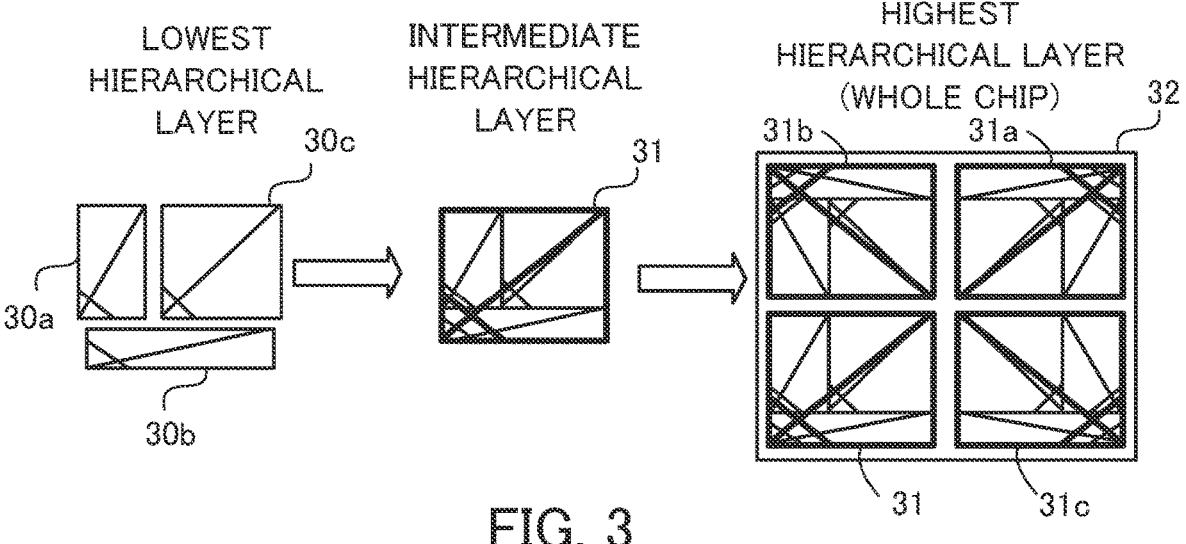
FIG. 3 illustrates an outline of hierarchical design.

FIG. 3 illustrates an outline of hierarchical design.

FIG. 3 illustrates an example in which an intermediate hierarchical layer 31 is designed from three lowest hierarchical layers 30a to 30c, and a highest hierarchical layer 32 (representing a whole chip) is designed from the intermediate hierarchical layer 31 and three intermediate hierarchical layers 31a to 31c obtained by inverting the intermediate hierarchical layer 31. If the intermediate hierarchical layer 31 is used at the design of the highest hierarchical layer 32, only the intermediate hierarchical layer 31 and the three intermediate hierarchical layers 31a to 31c obtained by inverting the intermediate hierarchical layer 31 need to be placed, and therefore, the design is performed easily.

TCD cells are placed in cell placement areas referred to as site areas. The site areas are cell placement areas to which power is supplied. Because the site areas exist in the lowest hierarchical layers 30a to 30c, the TCD cells are placed in the lowest hierarchical layers 30a to 30c.

Figure 4:
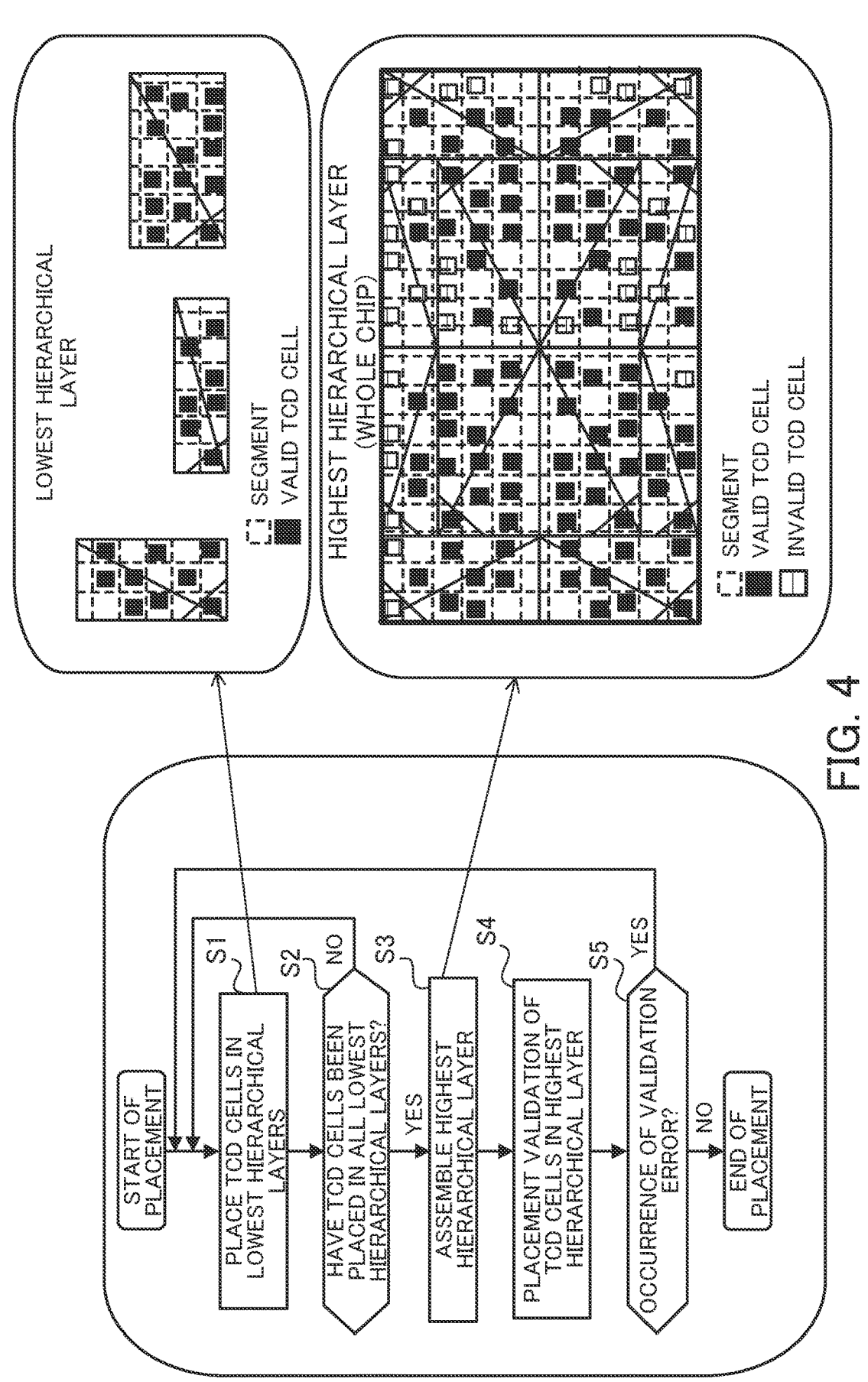
FIG. 4 is a flowchart illustrating TCD cell placement processing performed when TCD cell placement areas are determined and TCD cells are placed in a lowest hierarchical layer.

FIG. 4 is a flowchart illustrating TCD cell placement processing performed when TCD cell placement areas are determined and TCD cells are placed in a lowest hierarchical layer.

Step S1: In a lowest hierarchical layer, TCD cells are placed such that the placement rule is satisfied. If a plurality of instances of a lowest hierarchical layer are included in the highest hierarchical layer, the size and location of the individual segment are unknown at the time of design of the lowest hierarchical layer. Thus, for example, by dividing the area at certain intervals by using the bottom left corner as the start point of the area division, the individual segments are assumed. The segments assumed as described above will be hereinafter referred to as assumed segments. After the assumed segments are obtained, TCD cells are placed in the individual assumed segments such that the placement rule (for example, a rule that TCD cells are placed at least in 50% of all the assumed segments in the individual lowest hierarchical layer) is satisfied.

FIG. 4 illustrates an example in which TCD cells are placed in three lowest hierarchical layers such that the placement rule is satisfied. All the TCD cells placed in the individual lowest hierarchical layers are placed in assumed segments and are valid TCD cells.

Step S2: Whether TCD cells have been placed in all the lowest hierarchical layers is determined. If TCD cells have not been placed yet in all the lowest hierarchical layers, the processing returns to step S1. If TCD cells have been placed in all the lowest hierarchical layers, the processing proceeds to step S3.

Step S3: The highest hierarchical layer is assembled by using the plurality of lowest hierarchical layers. In step S3, intermediate hierarchical layers as illustrated in FIG. 3 may be used. In the example in FIG. 4, the highest hierarchical layer including four instances, each of which includes the above three lowest hierarchical layers, is assembled.

Step S4: Placement validation of determining whether the TCD cells in the highest hierarchical layer satisfy the DRC placement rule is performed. In the placement validation in the highest hierarchical layer, as illustrated in FIG. 2, the chip is divided into areas at constant intervals by using the bottom left corner of the chip as the start point of the area division. In this case, a difference (offset) is caused between the segments obtained by the area division in the highest hierarchical layer and the assumed segments obtained in the individual lowest hierarchical layer. Thus, as illustrated in FIG. 4, many invalid TCD cells, each of which is placed over a plurality of segments, and many invalid TCD cells, each of which is placed in an area not recognized as a segment, could be generated.

Step S5: Whether the TCD cells satisfy the DRC placement rule, that is, whether a validation error has occurred, is determined. If occurrence of a validation error is determined, the processing returns to step S1. In this case, in step S1, modification of the TCD cell placement areas is performed.

If no occurrence of a validation error is determined, the TCD cell placement processing is ended.

Figure 5:
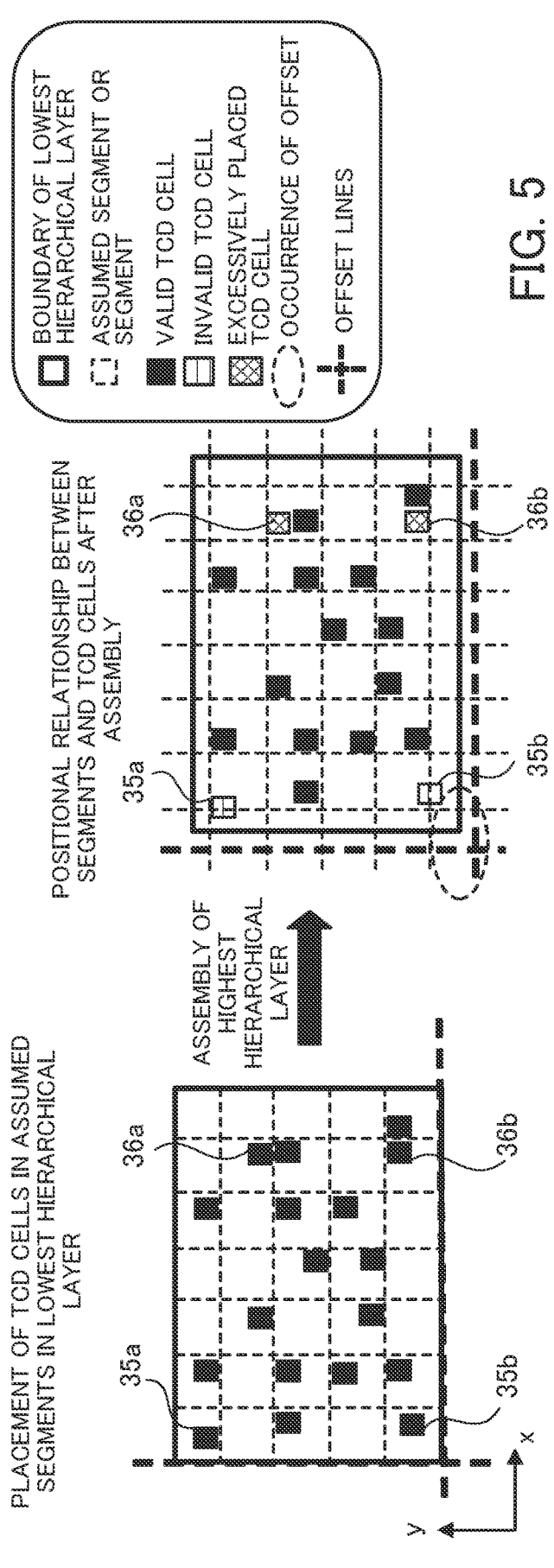
FIG. 5 illustrates an example of a case in which a validation error occurs.

FIG. 5 illustrates an example of a case in which a validation error occurs.

FIG. 5 illustrates an example in which, after TCD cells are placed in the assumed segments in a lowest hierarchical layer, a highest hierarchical layer is assembled by using the TCD cells, and the segments are set. As illustrated in FIG. 5, in the lowest hierarchical layer, the offset lines extending in the x and y directions from the start point of the area division match the boundary of the lowest hierarchical layer in the two directions, and thus, there is no offset.

However, after the highest hierarchical layer is assembled by using the TCD cells, the offset lines are deviated from the boundary of the lowest hierarchical layer in the two directions, resulting in an offset.

Thus, as illustrated in FIG. 5, because TCD cells 35*a* and 35*b* determined valid in the placement validation in the lowest hierarchical layer are placed over a plurality of segments in the placement validation in the highest hierarchical layer, these TCD cells 35*a* and 35*b* are determined invalid in the placement validation in the highest hierarchical layer. In addition, as illustrated in FIG. 5, because a TCD cell 36*a* determined valid in the placement validation in the lowest hierarchical layer is placed in a single segment with another TCD cell in the highest hierarchical layer, the TCD cell 36*a* is determined as an excessively placed TCD cell. The same holds true for a TCD cell 36*b*.

Thus, because the number of segments including valid TCD cells is reduced, a validation error could consequently occur.

Hereinafter, some examples of cases in which excessive placement occurs will be described.

Figure 6:
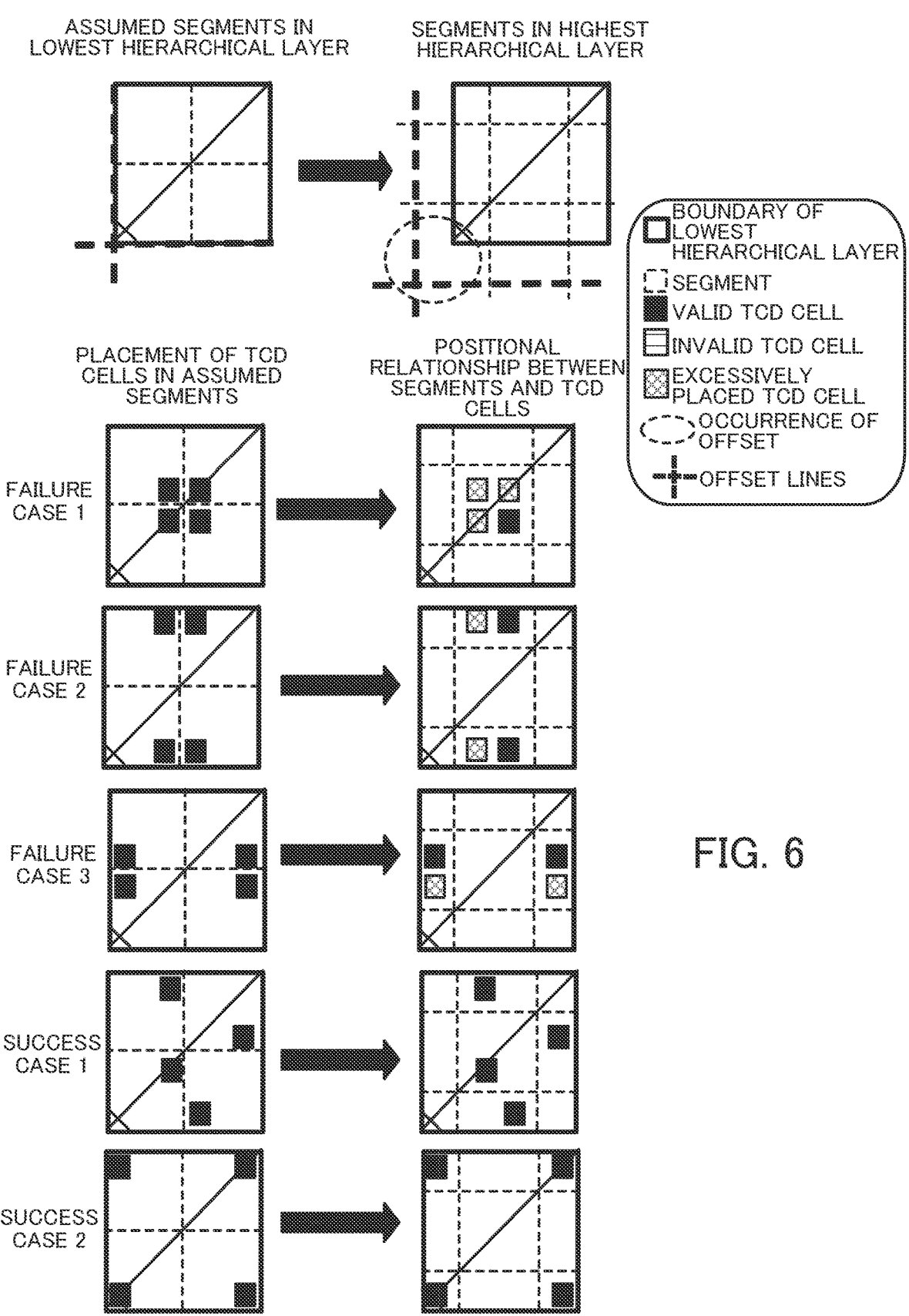
FIG. 6 illustrates examples of cases in which excessive placement occurs and examples of cases in which excessive placement does not occur.

FIG. 6 illustrates examples of cases in which excessive placement occurs and examples of cases in which excessive placement does not occur.

In a first case (failure case 1) in which excessive placement occurs, while a TCD cell is placed in each of the four assumed segments, these TCD cells are included in a single segment in the highest hierarchical layer. In this case, three TCD cells are determined as excessive TCD cells.

In a second case (failure case 2) and a third case (failure case 3) in which excessive placement occurs, while a TCD cell is placed in each of the four assumed segments, two of the TCD cells are included in one segment in the highest hierarchical layer, and the other two TCD cells are included in another segment in the highest hierarchical layer. In this case, in each of the two segments, one TCD cell is determined as an excessive TCD cell.

In a first case (success case 1) and a second case (success case 2) in which excessive placement does not occur, a TCD cell is placed in each of the four assumed segments, and a TCD cell is also placed in each of the segments in the highest hierarchical layer.

When the highest hierarchical layer includes a plurality of instances of a lowest hierarchical layer, the plurality of instances have different offsets. Thus, it is difficult to determine optimum TCD cell placement areas such that the excessive placement as described above does not occur.

The individual TCD cell is a relatively large cell having a bulk layer and a metal layer internally and could become an obstacle when another cell is placed or when wiring is performed. If the number of segments including valid TCD cells is increased and if the TCD cell placement number is excessively increased such that the placement rule is satisfied, the placement of other cells and the wiring properties are affected.

In contrast to the TCD cell placement processing illustrated in FIG. 4, the design apparatus 10 of the first embodiment performs TCD cell placement processing as follows, for example.

(Flowchart Illustrating TCD Cell Placement Processing Performed by Design Apparatus 10 of First Embodiment)

Figure 7:
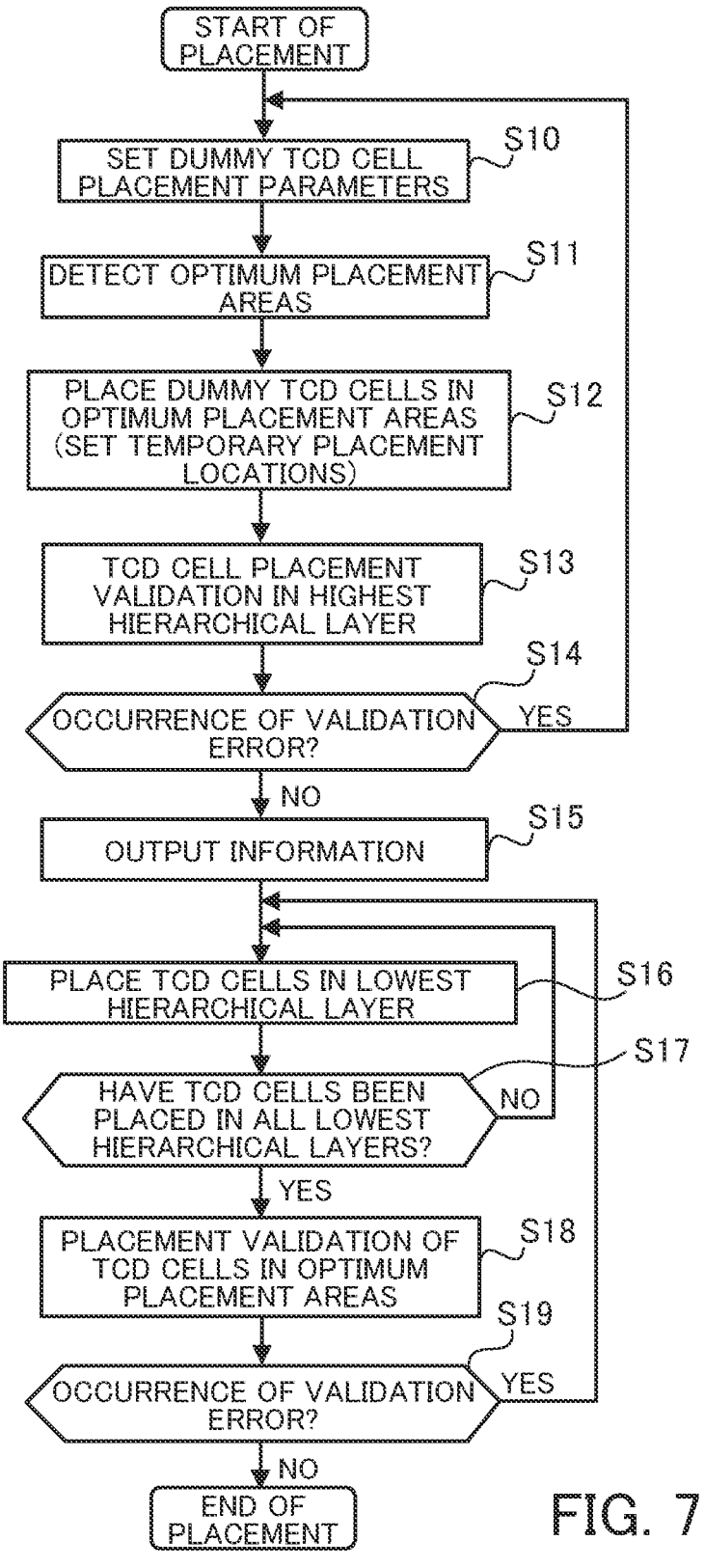
FIG. 7 is a flowchart illustrating an example of TCD cell placement processing performed by the design apparatus of the first embodiment.

FIG. 7 is a flowchart illustrating an example of TCD cell placement processing performed by the design apparatus of the first embodiment.

Step S10: The processing unit 12 sets parameters for placing dummy TCD cells. These parameters for placing dummy TCD cells include, for example, a parameter that represents a dummy TCD cell placement rule in a highest hierarchical layer.

Step S11: The processing unit 12 detects optimum placement areas in a plurality of instances of a lowest hierarchical layer by performing the processing as illustrated in FIG. 1.

Step S12: The processing unit 12 sets temporary placement locations of TCD cells by placing dummy TCD cells in the optimum placement areas, based on the dummy TCD cell placement parameters.

Step S13: The processing unit 12 performs placement validation of the TCD cells in the highest hierarchical layer. In step S13, of all the segments, whether dummy TCD cells have been placed in at least a predetermined ratio of segments is determined.

Step S14: The processing unit 12 determines whether a validation error has occurred in the placement validation. If the processing unit 12 determines that a validation error has occurred, the processing returns to step S10. In this case, in step S10, for example, the dummy TCD cell placement parameters are adjusted such that no validation error occurs in the placement validation. If the processing unit 12 determines that no validation error has occurred, the processing proceeds to step S15.

Step S15: The processing unit 12 outputs information indicating the individual optimum placement areas and temporary placement locations (the locations in which the dummy TCD cells are placed). When there are a plurality of lowest hierarchical layers, this information is generated and outputted per lowest hierarchical layer.

The following description will be made assuming that the processing unit 12 places TCD cells in the lowest hierarchical layer based on this information.

Step S16: The processing unit 12 performs processing for placing TCD cells, for example, in the temporary placement locations in the optimum placement areas in the lowest hierarchical layer, based on the lowest hierarchical layer design information 11*b* and the information indicating the individual optimum placement areas and temporary placement locations.

Step S17: The processing unit 12 determines whether TCD cells have been placed in all the lowest hierarchical layers. If the processing unit 12 determines that TCD cells have not been placed in all the lowest hierarchical layers, the processing returns to step S16. If the processing unit 12 determines that TCD cells have been placed in all the lowest hierarchical layers, the processing proceeds to step S18.

Step S18: The processing unit 12 performs placement validation of the TCD cells in the optimum placement areas. For example, the processing unit 12 determines whether a TCD cell does not overlap with another cell or has been placed at a location where proper wiring is possible, for example.

Step S19: The processing unit 12 determines whether a validation error has occurred in the TCD cell placement validation in the lowest hierarchical layers. If the processing unit 12 determines that a validation error has occurred, the processing returns to step S16. In this case, in step S16, for example, adjustment is made such that a validation error does not occur in the placement validation. For example, a TCD cell placement location is shifted. If the processing unit 12 determines that a validation error has not occurred, the processing unit 12 ends the TCD cell placement processing.

As is clear from the comparison between the TCD cell placement processing illustrated in FIG. 7 and the TCD cell placement processing illustrated in FIG. 4, in the TCD cell placement processing illustrated in FIG. 7, the highest hierarchical layer does not need to be assembled repeatedly, and the validation in the highest hierarchical layer does not need to be performed again. Thus, the design TAT is shortened.

In addition, even when a plurality of instances of a lowest hierarchical layer are included in the highest hierarchical layer, the design apparatus 10 detects the above-described overlapping areas as optimum placement areas and sets temporary placement locations of TCD cells in the overlapping areas. Thus, optimization of the placement areas such that TCD cells are not determined invalid is performed in the highest hierarchical layer. In this way, the TCD cell placement number is minimized. Thus, there is no need to place TCD cells excessively in a lowest hierarchical layer in order to prevent occurrence of a validation error in the placement validation in the highest hierarchical layer, and therefore, the placement and wiring properties are improved.

In addition, in a lowest hierarchical layer, even when a TCD cell overlaps with the placement area of another cell, the placement location is adjustable within the optimum placement area. In this way, even after the highest hierarchical layer is assembled, the TCD cell will not be determined invalid. Thus, the placement location is modified easily, and the design TAT is not significantly extended by the modification of the placement location. In addition, because it is possible to modify the placement of the TCD cells even in a later phase of the design of the implementation (in a phase in which the TCD cells have already been placed) (see FIG. 48), the placement and wiring properties are improved.

Second Embodiment

Next, a second embodiment will be described.

Figure 8:
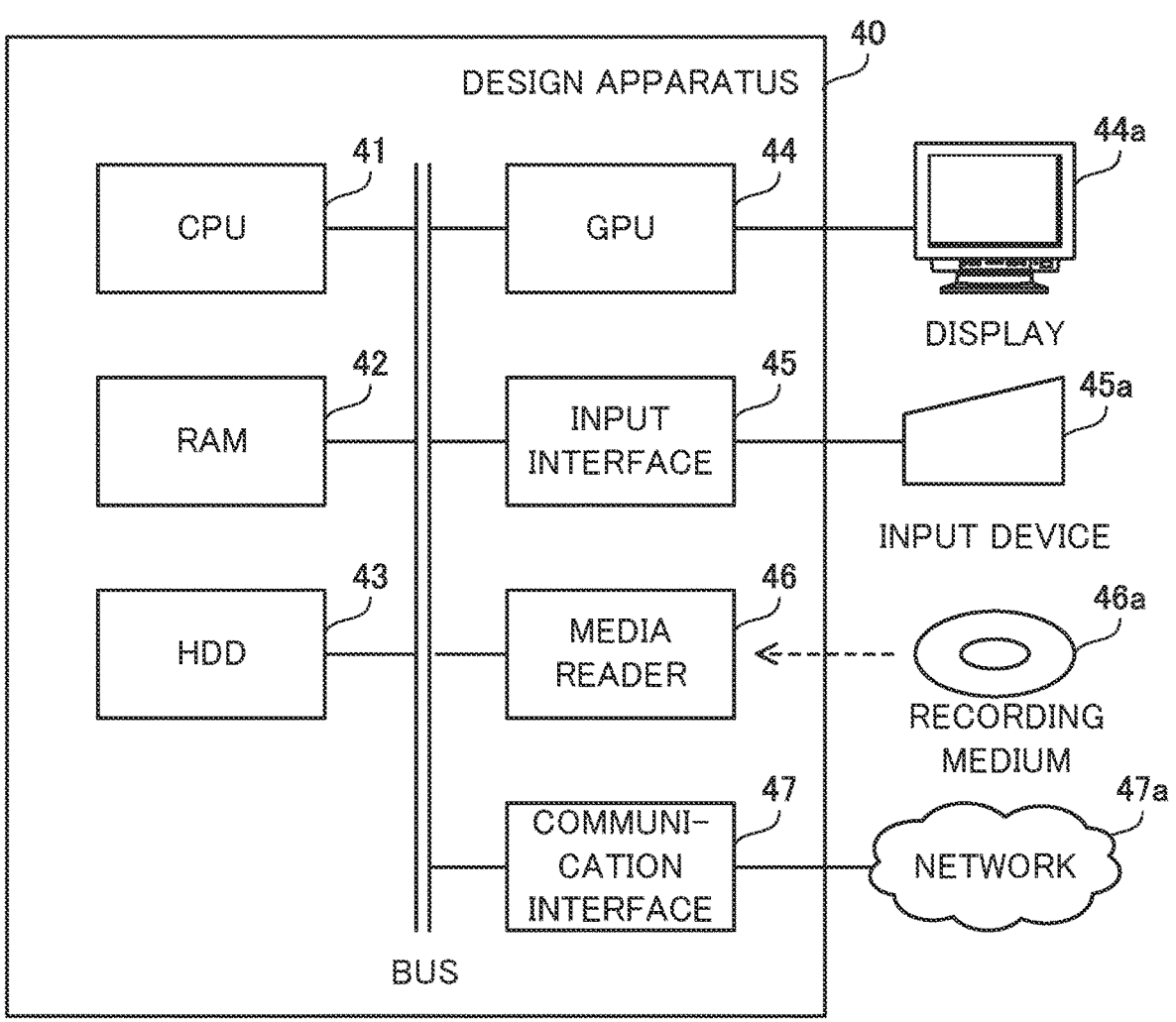
FIG. 8 is a block diagram illustrating a hardware example of a design apparatus of a second embodiment.

FIG. 8 is a block diagram illustrating a hardware example of a design apparatus.

This design apparatus 40 is realized by a computer as illustrated in FIG. 8. The design apparatus 40 includes a CPU 41, a RAM 42, an HDD 43, a GPU 44, an input interface 45, a media reader 46, and a communication interface 47. These units are connected to a bus.

The CPU 41 is a processor including a computation circuit that executes program commands. The CPU 41 loads a program and at least part of the data stored in the HDD 43 to the RAM 42 and executes the program. The CPU 41 may include a plurality of processor cores. The design apparatus 40 may include a plurality of processors. The processing to be described below may be performed in parallel by using a plurality of processors or processor cores. A group of processors (a multiprocessor) may be referred as a "processor".

The RAM 42 is a volatile semiconductor memory that temporarily stores a program executed by the CPU 41 and data used by the CPU 41 for computation. The design apparatus 40 may include a different kind of memory other than a RAM or may include a plurality of memories.

The HDD 43 is a non-volatile storage device that stores an operating system (OS), middleware, software programs such as application software, and data. For example, the programs include a design program that causes the design apparatus 40 to perform processing for hierarchical design. The design apparatus 40 may include a different kind of storage device, such as a flash memory or a solid state drive (SSD), or may include a plurality of non-volatile storage devices.

The GPU 44 outputs an image to a display 44a connected to the design apparatus 40 in accordance with a command from the CPU 41. Examples of the display 44a include a cathode ray tube (CRT) display, a liquid crystal display (LCD), a plasma display panel (PDP), and an organic electro-luminescence (OEL) display.

The input interface 45 acquires an input signal from an input device 45a connected to the design apparatus 40 and outputs the signal to the CPU 41. Examples of the input device 45a include a pointing device such as a mouse, a touch panel, a touchpad, or a trackball, a keyboard, a remote controller, and a button switch. A plurality of kinds of input devices may be connected to the design apparatus 40.

The media reader 46 is a reading device that reads out a program or data recorded in a recording medium 46a. Examples of the recording medium 46a include a magnetic disk, an optical disc, a magneto-optical disk (MO), and a semiconductor memory. Examples of the magnetic disk include a flexible disk (FD) and an HDD, and examples of the optical disc include a compact disc (CD) and a digital versatile disc (DVD).

For example, the media reader 46 copies the program or data read out from the recording medium 46a to another recording medium such as the RAM 42 or the HDD 43. The read program is executed by the CPU 41, for example. The recording medium 46a may be a portable recording medium and may be used for distribution of the program or data. The recording medium 46a and the HDD 43 may each be referred to as a computer-readable recording medium.

The communication interface 47 is an interface that is connected to a network 47a and communicates with other information processing apparatuses via the network 47a. The communication interface 47 may be a wired communication interface connected to a communication device such as a switch by a cable. Alternatively, the communication interface 47 may be a wireless communication interface connected to a base station by a radio link.

Next, functions of the design apparatus 40 will be described.

Figure 9:
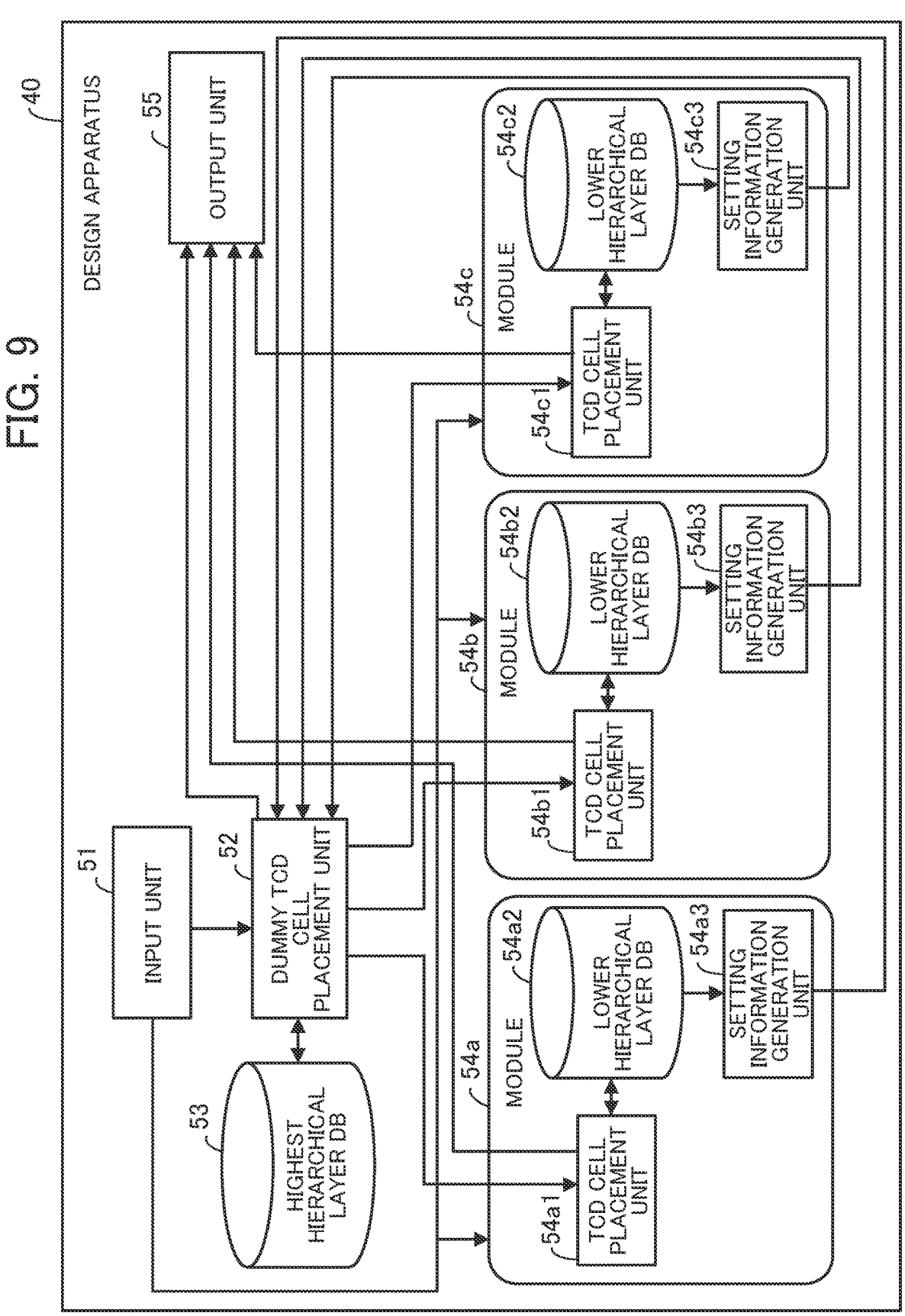
FIG. 9 is a block diagram illustrating a functional example of the design apparatus.

FIG. 9 is a block diagram illustrating a functional example of the design apparatus.

The design apparatus 40 includes an input unit 51, a dummy TCD cell placement unit 52, a highest hierarchical layer database (DB) 53, modules 54a to 54c, and an output unit 55. The modules 54a to 54c include TCD cell placement units 54a1 to 54c1, lower hierarchical layer DBs 54a2 to 54c2, and setting information generation units 54a3 to 54c3, respectively.

The highest hierarchical layer DB 53 and the lower hierarchical layer DBs 54*a*2 to 54*c*2 may be implemented by using storage areas allocated in the RAM 42 or the HDD 43, for example. The input unit 51, the dummy TCD cell placement unit 52, the TCD cell placement units 54*a*1 to 54*c*1, the setting information generation units 54*a*3 to 54*c*3, and the output unit 55 may be implemented by using program modules executed by the CPU 41, for example. The input unit 51, the dummy TCD cell placement unit 52, the TCD cell placement units 54*a*1 to 54*c*1, the setting information generation units 54*a*3 to 54*c*3, and the output unit 55 are functional examples executed by the processing unit 12 illustrated in FIG. 1.

A user enters information by operating the input device 45*a*, and the input unit 51 acquires the information. The input unit 51 acquires, for example, setting information about a highest hierarchical layer. The input unit 51 may acquire information entered by using an interactive editor or the like.

The dummy TCD cell placement unit 52 places dummy TCD cells and performs the placement validation of the dummy TCD cells, based on the setting information about the highest hierarchical layer, setting information about the individual lowest hierarchical layer outputted from the modules 54*a* to 54*c*, and design information about the highest hierarchical layer stored in the highest hierarchical layer DB 53. The dummy TCD cells are placed for each of the lowest hierarchical layers corresponding to their respective modules 54*a* to 54*c*. The dummy TCD cell placement unit 52 may place dummy TCD cells based on information inputted by the user.

Information including the dummy TCD cell placement result (the optimum placement areas and the temporary placement locations of the TCD cells (the locations in which the dummy TCD cells are placed)) (hereinafter also referred to as check area information) is also outputted per lowest hierarchical layer (per module). A check area information generation example will be described below (see FIG. 21).

The highest hierarchical layer DB 53 stores, for example, the design information about the highest hierarchical layer.

The modules 54*a* to 54*c* perform TCD cell placement processing in their respective lowest hierarchical layers. That is, while three lowest hierarchical layers are used in the present embodiment, the number of applicable lowest hierarchical layers is not limited to 3. The number of modules may be changed depending on the number of lowest hierarchical layers.

The TCD cell placement unit 54*a*1 places TCD cells, based on the check area information about the module 54*a* outputted by the dummy TCD cell placement unit 52 and the design information about the lowest hierarchical layer stored in the lower hierarchical layer DB 54*a*2. The TCD cell placement unit 54*a*1 may place TCD cells based on information inputted by the user. The TCD cell placement result may be stored in the lower hierarchical layer DB 54*a*2. The TCD cell placement units 54*b*1 and 54*c*1 in the modules 54*b* and 54*c* also have the same function as that of the TCD cell placement unit 54*a*1.

The lower hierarchical layer DB 54*a*2 stores, for example, design information about the lowest hierarchical layer processed by the module 54*a*. The lower hierarchical layer DBs 54*b*2 and 54*c*2 in the modules 54*b* and 54*c* also have the same function as that of the lower hierarchical layer DB 54*a*2.

The setting information generation unit 54*a*3 generates setting information, based on the design information about the lowest hierarchical layer stored in the lower hierarchical layer DB 54*a*2. The setting information includes, for example, information about placement inhibition areas of dummy TCD cells (for example, areas in which cells other than the TCD cells have already been placed). The setting information generation unit 54*a*3 may generate setting information based on information inputted by the user. A setting information generation example will be described below (see FIG. 12). The setting information generation units 54*b*3 and 54*c*3 in the modules 54*b* and 54*c* also have the same function as that of the setting information generation unit 54*a*3.

The output unit 55 outputs, for example, the dummy TCD cell placement result, the TCD cell placement result, the placement validation result, and error information. The output unit 55 may output, for example, the dummy TCD cell placement result, the TCD cell placement result, the placement validation result, and the error information to the display 44*a* and causes the display 44*a* to display the results and information. The output unit 55 may output the results and information to the HDD 43 and causes the HDD 43 to store the results and information. The output unit 55 may output (or transmit), for example, the dummy TCD cell placement result, the TCD cell placement result, the placement validation result, and the error information to an apparatus outside the design apparatus 40.

The setting information about the highest hierarchical layer and lowest hierarchical layer and the check area information may be stored in a storage unit (not illustrated) as a file. This storage unit may also be implemented by using a storage area allocated in the RAM 42 or the HDD 43, for example.

Figure 10:
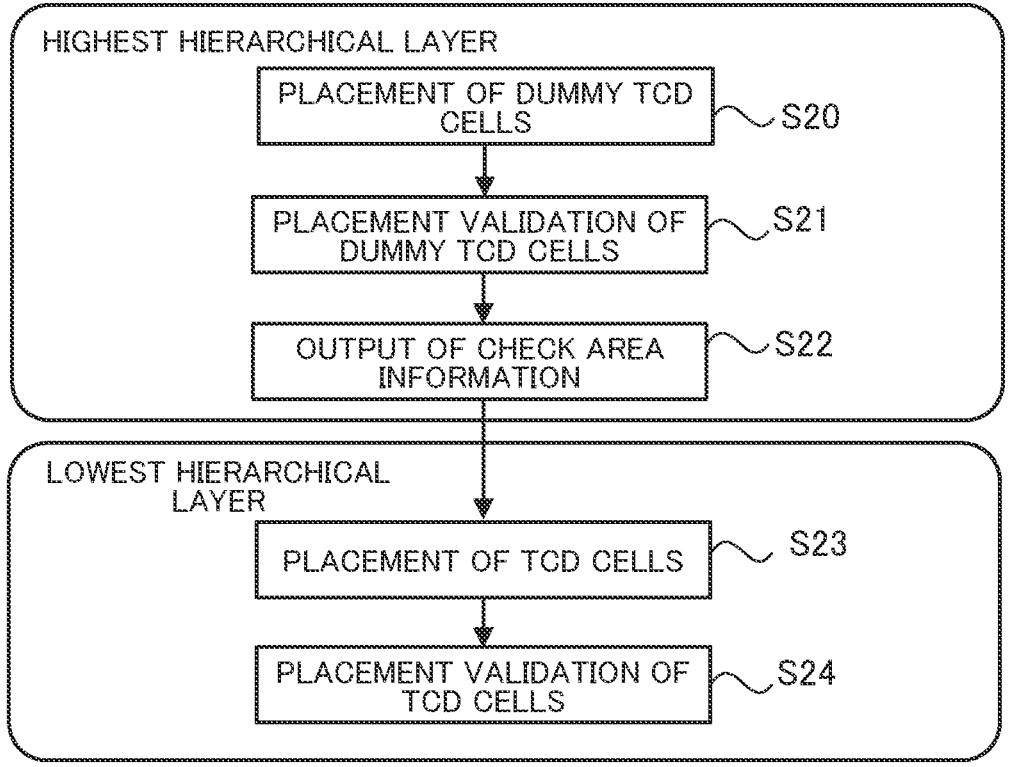
FIG. 10 illustrates an outline of TCD cell placement processing performed by the design apparatus.

FIG. 10 illustrates an outline of TCD cell placement processing performed by the design apparatus of the second embodiment.

As processing in the highest hierarchical layer, the design apparatus 40 of the second embodiment performs placement of dummy TCD cells (step S20), placement validation of the dummy TCD cells (step S21), and output of check area information (step S22). The design apparatus 40 outputs the check area information for each of the modules 54*a* to 54*c*.

In addition, as processing in the lowest hierarchical layers, the design apparatus 40 performs placement of TCD cells (step S23) and placement validation of the TCD cells (step S24) per lowest hierarchical layer (per module).

The individual processing may be performed automatically by a program that performs batch processing or part of the processing may be performed based on input by a user (a designer, for example) by using an interactive editor or the like.

The user may choose whether part of the processing is performed based on input by the user, depending on the progress of the design (for example, whether the design is in an initial phase or in a final phase) or the purpose of the design (for example, to conduct a trial, to check a status, or to conduct an actual operation). For example, if a trial is conducted in an initial phase of the design, the design apparatus 40 automatically places dummy TCD cells by using a program that performs batch processing. In an intermediate phase of the design, after the design apparatus 40 automatically places dummy TCD cells, the user adjusts the placement locations by using an interactive editor or the like. In a final phase of the design, in a case in which manual placement is mainly performed and automatic placement is partly performed, manual placement is performed by using an interactive editor, and thereafter, automatic placement is performed by using the interactive editor. That is, the user may choose automatic placement or manual placement, as needed.

(Example of Setting Information about Highest Hierarchical Layer)

FIG. 11 illustrates an example of setting information about a highest hierarchical layer.

The setting information is inputted to the design apparatus 40 as a setting file about the highest hierarchical layer, for example.

The following setting items (a) to (d) are included in the setting information. A lower hierarchical layer illustrated in FIG. 12 signifies a lowest hierarchical layer.

(a) Dummy TCD cell placement rule "RULE" in highest hierarchical layer (b) Dummy TCD cell placement inhibition areas "INHIBIT_AREA" (defined in the highest hierarchical layer and in the lowest hierarchical layer)

(c) Lower limit "PLACE_RATIO_LOWER_LIMIT" and upper limit "PLACE_RATIO_UPPER_LIMIT" of placement ratio of dummy TCD cells in lowest hierarchical layer (d) Lower limit size (area) "PLACE_AREA_LOWER_LIMIT" of optimum placement areas that is given to modules 54*a* to 54*c*

(e) Reserve area creation ratio "RESERVE_RATIO" in lowest hierarchical layer (f) Name "CONST_FILE" of file including setting information about lowest hierarchical layer The individual setting items will be described in detail below.

(Example of Setting Information about Lowest Hierarchical Layer)

FIG. 12 illustrates an example of setting information about a lowest hierarchical layer.

The setting information about the lowest hierarchical layer is generated by the setting information generation unit 54*a*3, 54*b*3, or 54*c*3 in the module 54*a*, 54*b*, or 54*c*.

The following setting items (a) to (d) are included in the setting information. The lower hierarchical layer illustrated in FIG. 12 signifies a lowest hierarchical layer.

(a) Dummy TCD cell placement inhibition areas "INHIBIT_AREA" (defined in the lowest hierarchical layer)

(b) Lower limit "PLACE_RATIO_LOWER_LIMIT" and upper limit "PLACE_RATIO_UPPER_LIMIT" of placement ratio of dummy TCD cells in lowest hierarchical layer (c) Lower limit size "PLACE_AREA_LOWER_LIMIT" of optimum placement areas that is given to module 54*a*, 54*b*, or 54*c*

(d) Reserve area creation ratio "RESERVE_RATIO" in lowest hierarchical layer

The name of a setting file including the setting information about the lowest hierarchical layer is specified as "CONST_FILE" in FIG. 11.

The individual setting items will be described in detail below.

(Setting Information Generation Example Using Interactive Editor)

Hereinafter, an example in which the setting information as described above is generated by using an interactive editor will be described.

FIG. 13 illustrates a setting information generation example using an interactive editor.

First, "Dummy TCD Window" as illustrated in FIG. 13 is displayed on the screen of the display 44*a*. When the user selects "ParameterSet" and presses "EXEC" by operating the input device 45*a*, "Dummy TCD Setting Window" is displayed.

When "IN" is selected and "OK" is pressed on "Dummy TCD Setting Window", a file selection screen (not illustrated) is displayed. When a setting file including setting information as illustrated in FIG. 11 or 12 is selected, the setting information becomes displayable on the screen. A new setting file may be created on the file selection screen.

The user may adjust the parameters "RULE" by operating the input device 45*a* on "Dummy TCD Setting Window".

A dummy TCD cell placement inhibition area in the highest hierarchical layer may be set on a screen displayed by selecting "CHIP" and pressing "OK" in the section "Module Select" on "Dummy TCD Setting Window". Various kinds of parameters in the lowest hierarchical layer may be set on a screen displayed, for example, by selecting "MODULE_A" and pressing "OK" in the section "Module Select" on "Dummy TCD Setting Window".

When "OUT" is selected and "OK" is pressed on "Dummy TCD Setting Window", a setting file on which the values of the inputted parameters have been reflected is outputted.

FIGS. 14A and 14B illustrate examples of a highest hierarchical layer setting screen and a lowest hierarchical layer setting screen.

On the highest hierarchical layer setting screen "highest hierarchical layer window", when "EDIT" is pressed, a dummy TCD cell placement inhibition area setting screen is displayed.

On the lowest hierarchical layer setting screen "lower hierarchical layer window", the lower limit and the upper limit of the placement ratio of dummy TCD cells in the lowest hierarchical layer, the lower limit size of optimum placement areas given to each of the modules 54*a* to 54*c*, and the reserve area creation ratio may be set. In addition, when "EDIT" is pressed, a dummy TCD cell placement inhibition area setting screen is displayed.

In addition, when "IN" is selected and "OK" is pressed on the screen, a file selection screen not illustrated is displayed. When a setting file including setting information as illustrated in FIG. 12 is selected, the setting information becomes displayable on the screen. On the file selection screen, a new setting file may be created. When "OUT" is selected and "OK" is pressed on the screen, a setting file on which the values of the inputted parameters have been reflected is outputted.

(Individual Setting Items of Setting information)

(a) "RULE"

The dummy TCD cell placement rule "RULE" in the highest hierarchical layer illustrated in FIG. 11 includes the size of a check window signifying a segment described in the first embodiment and the TCD cell placement ratio. While values based on the DRC placement rule are used as the check window size and the TCD cell placement ratio, the values may be changed based on user input. For example, the placement ratio may be changed to a value stricter than that specified by the DRC placement rule, based on user input.

"RULE" may be specified or changed on a setting file as illustrated in FIG. 11. Alternatively, "RULE" may be specified or changed on "Check_Window" for specifying the check window size or on "Check_Ratio" for specifying the placement ratio. "Check_Window" and "Check_Ratio" are provided by the interactive editor illustrated in FIG. 13.

The placement validation of the dummy TCD cells, which will be described below, is performed based on the specified check window size and placement ratio.

(b) "INHIBIT_AREA"

When dummy TCD cells are placed in the highest hier-archical layer, there is an area in which a dummy TCD cell is not placeable because of a reason relating to the highest hierarchical layer. In this case, a dummy TCD cell placement inhibition area "INHIBIT_AREA" is set based on the high-est hierarchical layer or the lowest hierarchical layer.

The placement inhibition areas may be specified or changed on the setting file as illustrated in FIG. 11. The placement inhibition areas may also be specified or changed on the dummy TCD cell placement inhibition area setting screen displayed, by pressing "EDIT" on "highest hierar-chical layer window" or "lower hierarchical layer window" of the interactive editors illustrated in FIGS. 14A and 14B.

Figure 15:
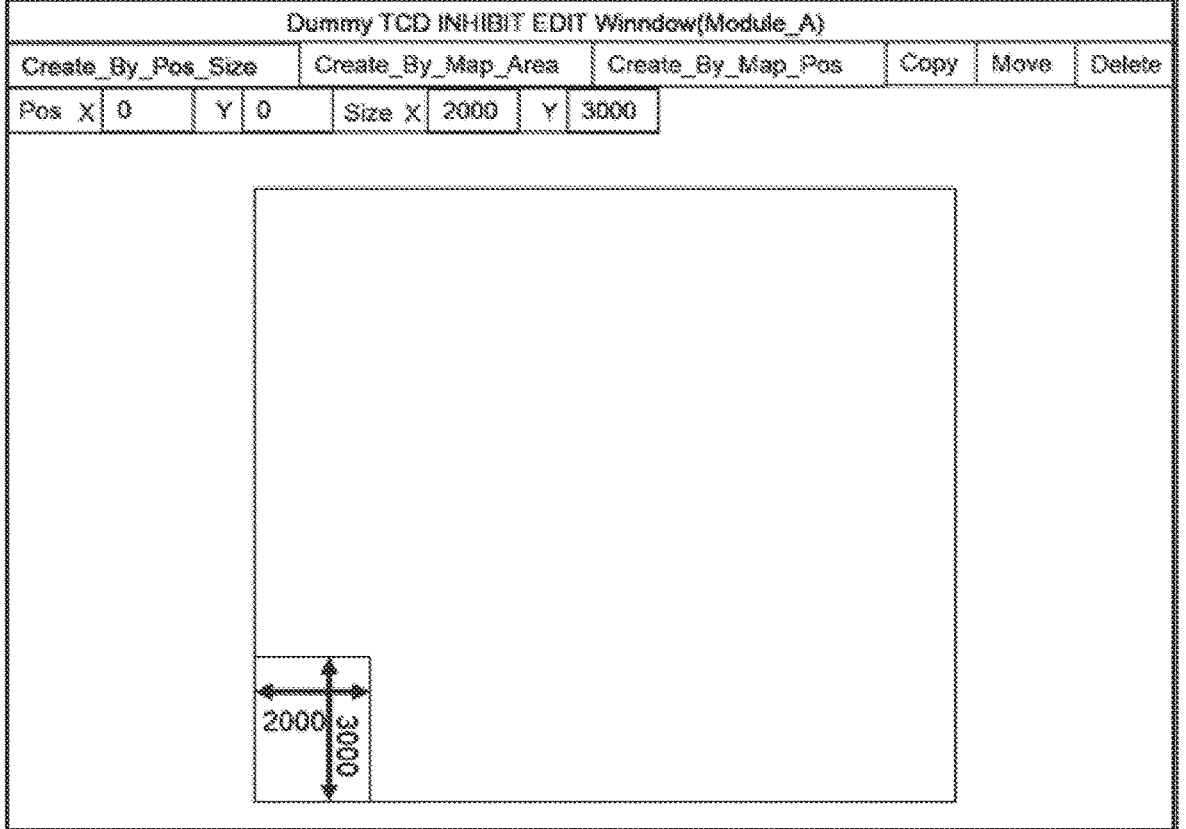
FIG. 15 illustrates a first example of specification of a placement inhibition area by using the interactive editor.

FIG. 15 illustrates a first example of specification of a placement inhibition area by using the interactive editor.

On the dummy TCD cell placement inhibition area setting screen, a placement inhibition area is specified by "Pos", which is the bottom left coordinates of the placement inhibition area, and "Size", which is represented by the length in the x axis direction and the length in the y axis direction. In addition, when "Copy", "Move", or "Delete" is pressed, a placement inhibition area is copied, moved, or deleted.

Figure 16:
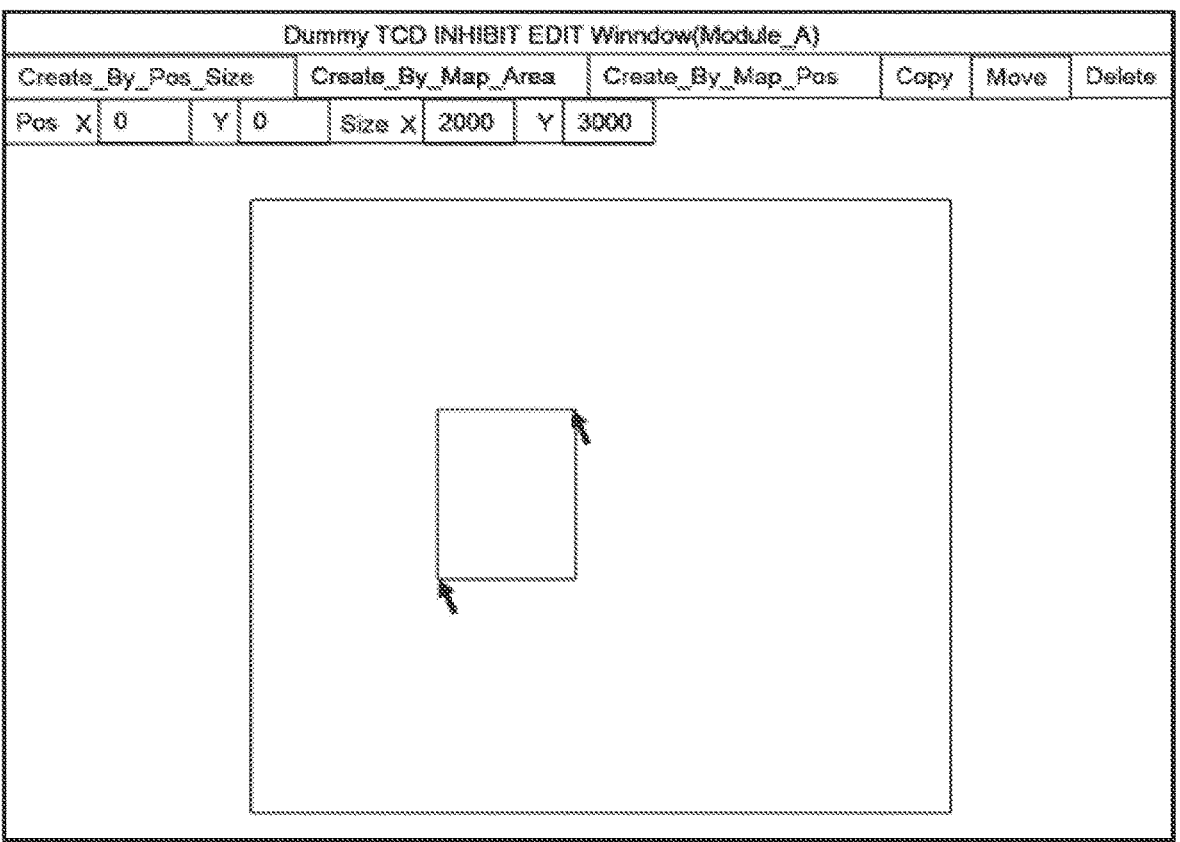
FIG. 16 illustrates a second example of specification of a placement inhibition area by using the interactive editor.

FIG. 16 illustrates a second example of specification of a placement inhibition area by using the interactive editor.

On the dummy TCD cell placement inhibition area setting screen, the user may operate a mouse to specify a placement inhibition area having two points specified as bottom left coordinates and top right coordinates by a mouse pointer (two arrows in FIG. 16).

Figure 17:
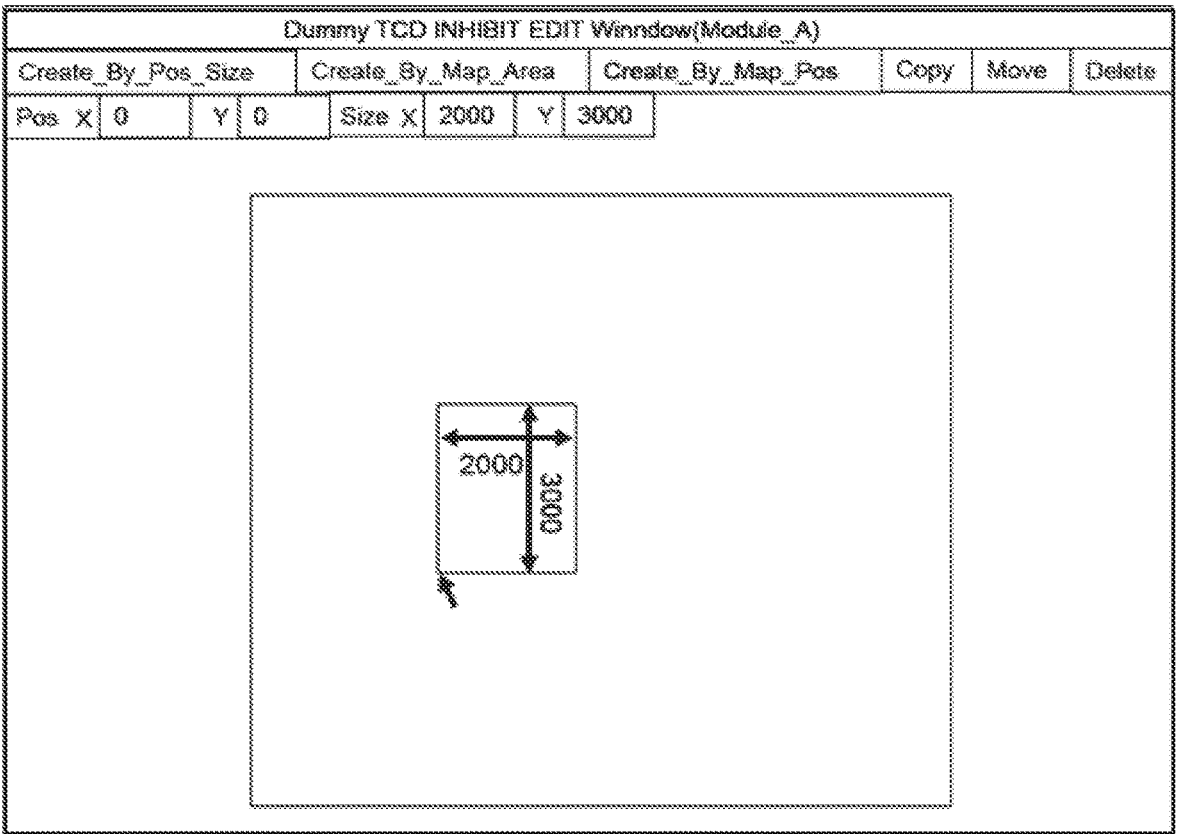
FIG. 17 illustrates a third example of specification of a placement inhibition area by using the interactive editor.

FIG. 17 illustrates a third example of specification of a placement inhibition area by using the interactive editor.

On the dummy TCD cell placement inhibition area setting screen, the user may operate a mouse to specify a placement inhibition area having a point specified as bottom left coordinates by a mouse pointer (an arrow in FIG. 17). The lengths of the placement inhibition area in the x axis direction and the y axis direction are indicated by "Size".

"INHIBIT_AREA" in the setting information about the lowest hierarchical layer illustrated in FIG. 12 may also be specified by using the setting file or the interactive editor, as in "INHIBIT_AREA" in the setting information about the highest hierarchical layer.

(c) "PLACE_RATIO_LOWER_LIMIT" and "PLACE_RA-TIO_UPPER_LIMIT"

When there are a plurality of lowest hierarchical layers, because different lowest hierarchical layers have different logic functions, these lowest hierarchical layers have differ-ent logic scales. Thus, there are cases in which these lowest hierarchical layers have different physical sizes and cell usage ratios.

Thus, in each lowest hierarchical layer, it is desirable to place TCD cells in a different placement ratio per lowest hierarchical layer, instead of placing TCD cells in the same placement ratio. For this reason, the design apparatus 40 of the present embodiment is able to freely specify the lower limit "PLACE_RATIO_LOWER_LIMIT" and the upper limit "PLACE_RATIO_UPPER_LIMIT" of the dummy TCD cell placement ratio per lowest hierarchical layer.

The upper limit and the lower limit of the dummy TCD cell placement ratio may also be specified or changed on the setting file as illustrated in FIG. 11 or 12. The upper limit and the lower limit of the dummy TCD cell placement ratio may be specified or changed on "lower hierarchical layer win-dow" of the interactive editor illustrated in FIG. 14B.

The dummy TCD cell placement validation to be described below is performed based on the specified "PLACE_RATIO_LOWER_LIMIT" and "PLACE_RA-TIO_UPPER_LIMIT".

(d) "PLACE_AREA_LOWER_LIMIT"

When the optimum placement areas given to the lowest hierarchical layer (modules 54a to 54c) are too narrow for the TCD cells, there are cases in which, for example, the TCD cell placement adjustment in the lowest hierarchical layer is difficult.

To avoid this situation, the design apparatus 40 of the present embodiment is able to specify the lower limit size (area) "PLACE_AREA_LOWER_LIMIT" of the optimum placement area given to each of the modules 54a to 54c.

The lower limit size may be specified or changed on the setting file as illustrated in FIG. 11 or 12 or on "lower hierarchical layer window" of the interactive editor illus-trated in FIG. 14B.

The optimum placement areas smaller than the lower limit size are determined invalid and are not given to the corre-sponding lowest hierarchical layer.

(e) "RESERVE_RATIO"

In a lowest hierarchical layer, TCD cells are placed in its optimum placement areas given from the highest hierarchi-cal layer. However, depending on the design situation of the lowest hierarchical layer, some logic cells may become obstacles, and there may be a case in which placement of TCD cells is not possible.

To avoid this situation, the design apparatus 40 sets, among the plurality of optimum placement areas, a prede-termined creation ratio "RESERVE_RATIO" of optimiza-tion areas as reserve areas in which dummy TCD cells are not placed (in which temporary placement locations are not set). Next, the design apparatus 40 outputs information indicating these reserve areas (notifies the lowest hierarchi-cal layer of the information).

Figure 18:
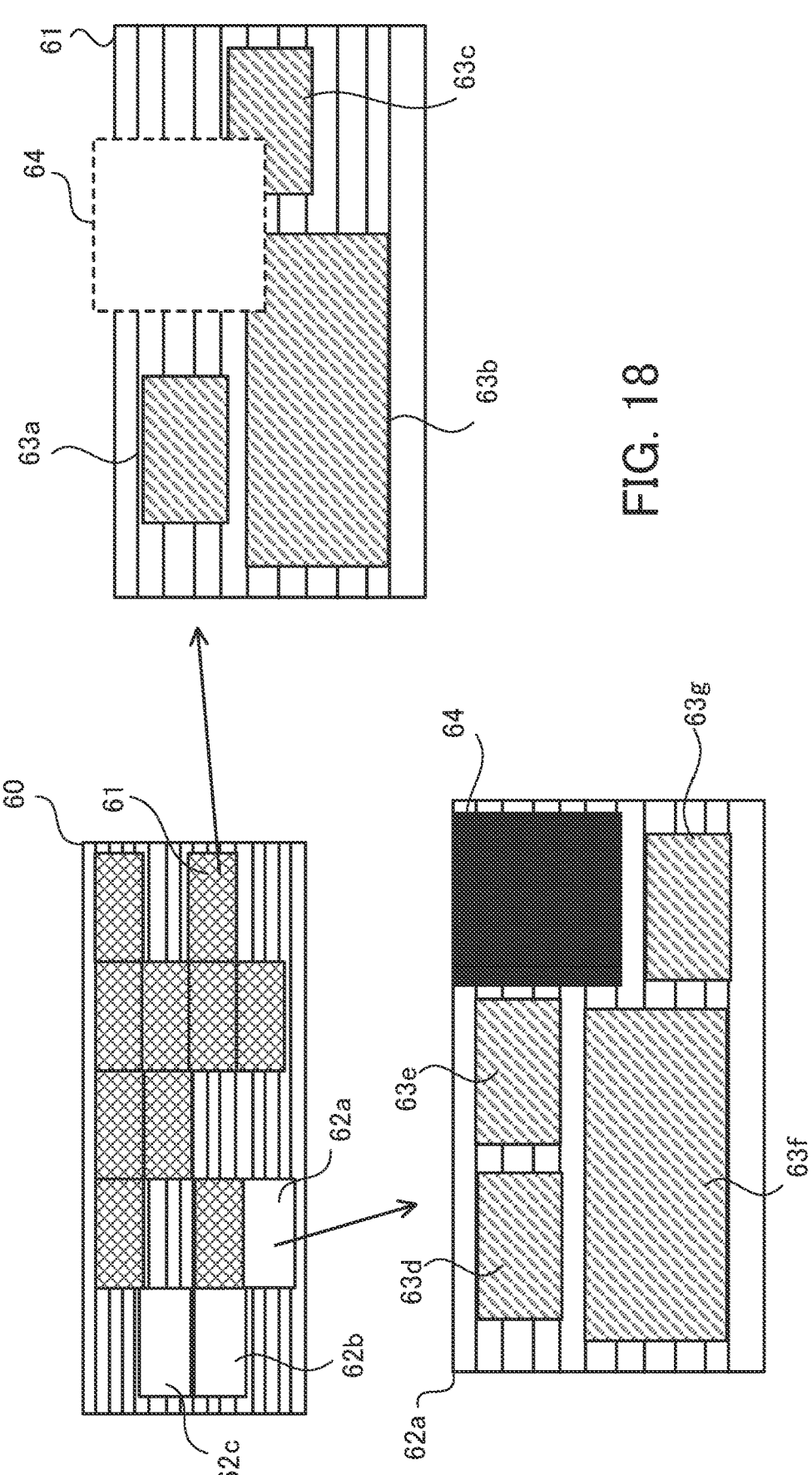
FIG. 18 illustrates a reserve area creation example.

FIG. 18 illustrates a reserve area creation example.

In a lowest hierarchical layer 60, optimum placement areas (for example, an optimum placement area 61) and reserve areas 62a to 62c are set based on the information given from the highest hierarchical layer.

In the optimum placement area 61, if there are fixed logic cells 63a to 63c, a TCD cell 64 is not placeable due to these logic cells 63a to 63c.

In contrast, while the reserve area 62a includes fixed logic cells 63d to 63g, there is a space for the TCD cell 64. Thus, when the TCD cell 64 is placed in the lowest hierarchical layer 60, for example, the TCD cell 64 is placed by replacing the optimum placement area 61 by the reserve area 62a.

The reserve area creation ratio may be specified or changed on the setting file as illustrated in FIG. 11 or 12 or on "lower hierarchical layer window" of the interactive editor illustrated in FIG. 14B.

(f) "CONST_FILE"

"CONST_FILE" is a setting item indicating the file name of a setting file including the setting information about the lowest hierarchical layer as illustrated in FIG. 11. In the example in FIG. 11, a file name "/xxx/yyy/zzz/tcd_modu-leA.cnst.txt" is specified.

Generally, for example, when a chip floor plan has already been determined in an initial phase of the design, in many cases, the size of the highest hierarchical layer, the place-ment location of a lowest hierarchical layer included in the highest hierarchical layer, the number of instances, and the logic size and physical size of the lowest hierarchical layer have already been determined.

In this case, because it is difficult to determine detailed constraint conditions in the lowest hierarchical layer, it is desirable to specify the constraint conditions (various kinds of setting items as described above) about the lowest hierarchical layer in the highest hierarchical layer side as needed, as in the setting file illustrated in FIG. 11.

However, in a phase in which the design of the lowest hierarchical layer has progressed, the areas in which TCD cells are placeable are limited. This is because, for example, when cells having a large physical size such as a RAM and a custom macro or macros greatly relating to the performance such as a clock-system macro and a flip-flop are preferentially placed, TCD cells are not placeable on the locations where these cells or macros are placed.

Thus, because placement of dummy TCD cells in the locations where these cells or macros are placed needs to be inhibited also in the highest hierarchical layer, the dummy TCD cell placement inhibition areas are set as descried above.

However, for example, there are cases in which the person who designs the highest hierarchical layer is different from the person who designs the lowest hierarchical layer. In this case, it is difficult for the designer of the highest hierarchical layer to grasp the placement situation of the cells, the macros, etc. in the lowest hierarchical layer. Thus, it is desirable that the designer of the lowest hierarchical layer specify the constraint conditions. Thus, for example, based on the design information about the lowest hierarchical layer stored in the lower hierarchical layer DBs 54a2 to 54c2, the setting information generation units 54a3 to 54c3 illustrated in FIG. 9 each generate setting information about the corresponding lowest hierarchical layer and outputs a setting file including the setting information.

Figure 19:
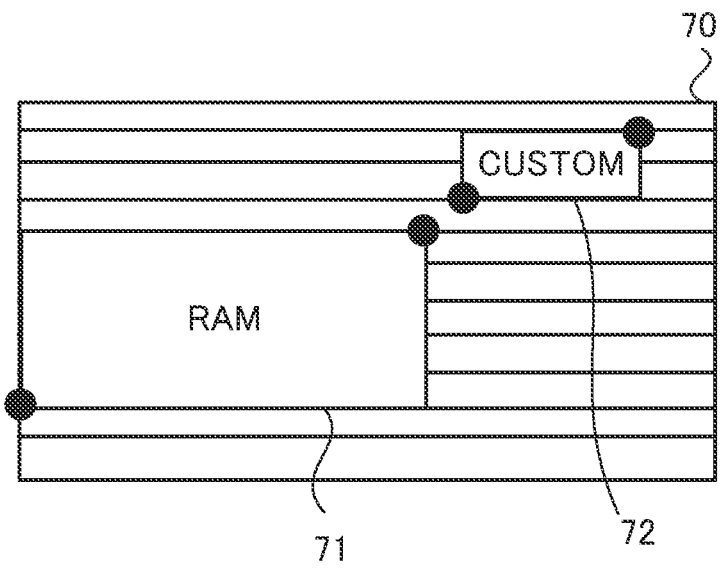
FIG. 19 illustrates a design example in a lowest hierarchical layer.

FIG. 19 illustrates a design example in a lowest hierarchical layer.

A RAM 71 and a custom macro 72 are placed in a lowest hierarchical layer 70.

Next, an example in which a setting file is automatically generated by using an interactive editor based on design information about a lowest hierarchical layer will be described.

FIG. 20 illustrates a generation example of a setting file including setting information about a lowest hierarchical layer by using an interactive editor.

This "lower hierarchical layer window" of the interactive editor illustrated in FIG. 20 differs from that illustrated in FIG. 14B in that this "lower hierarchical layer window" includes "TCD_AREA_IN_FILE" and "AUTO" in the section "INHIBIT_AREA". The name of a file including the check area information that the modules 54a, 54b, or 54c acquires is entered in "TCD_AREA_IN_FILE".

When "AUTO" is pressed on the screen of "lower hierarchical layer Window", placement inhibition areas are automatically specified based on the design information about the lowest hierarchical layer as illustrated in FIG. 19. By pressing "EDIT", the user is able to specify placement inhibition areas as in FIGS. 15 to 17 described above.

Next, a setting file is created by pressing "OUT", entering a file name, and pressing "OK".

In the case of the setting file in FIG. 20, two placement inhibition areas have been specified. One of the placement inhibition areas is for the RAM 71 in FIG. 19 and is indicated by the bottom left coordinates "0 1000" and the top right coordinates "3300 2600" of the RAM 71. The other placement inhibition area is for the custom macro 72 in FIG.

19 and is indicated by the bottom left coordinates "3500 3300" and the top right coordinates "4700 4300" of the custom macro 72.

The file name of the lowest hierarchical layer setting file created as described is specified by "CONST_FILE" illustrated in FIG. 11 such that the setting file is referable when dummy TCD cells are placed in the highest hierarchical layer. The above setting file also becomes referrable in the highest hierarchical layer by pressing "IN", inputting the file name of the setting file, and pressing "OK" on the screen of "lower hierarchical layer Window" in FIG. 14B.

(Example of Check Area Information)

FIG. 21 illustrates an example of check area information.

The check area information is generated by the dummy TCD cell placement unit 52.

The following information items (1) to (6) are included in the check area information. A lower hierarchical layer indicated in FIG. 21 signifies a lowest hierarchical layer.

(1) Module Name to which the Check Area Information is Applied (Outputted)

In the example in FIG. 21, "MODULE_A" is specified as the module name. The information inside curly brackets in "MODULE_A{ }" is applied to a module (any one of the modules 54a to 54c illustrated in FIG. 9) of "MODULE_A".

(2) Creation Date

The creation date indicates the creation date of the file including the check area information by the dummy TCD cell placement unit 52. The creation date is represented by "DATE year, month, date, hour, minute, second".

The creation date is used, for example, by the module 54a, 54b, or 54c to check whether check area information created at the same date is used. The creation date may be used, for example, by the module 54a, 54b, or 54c to check the version of the file including check area information read by the module 54a, 54b, or 54c.

(3) Coordinate Unit System

The coordinate unit system is a unit for numbers representing the coordinates of the optimum placement areas, the temporary placement locations, the placement inhibition areas, and the reserve areas. The coordinate unit system is represented by "UNIT". In the example in FIG. 21, the unit is nm.

(4) Optimum Placement Areas and Temporary Placement Locations

The optimum placement areas and the temporary placement locations of the TCD cells in the optimum placement areas (the dummy TCD cell placement locations) are represented as "TCD_GEN Num AREA MinX MinY MaxX MaxY POS X Y".

"Num" represents a serial number, and the maximum number of Num is the number of TCD cells needed in the lowest hierarchical layer.

"AREA" is a keyword indicating that an optimum placement area will be represented next.

"MinX" represents the X-coordinate of the bottom left corner of the optimum placement area, and "MinY" represents the Y-coordinate of the bottom left corner of the optimum placement area. "MaxX" represents the X-coordinate of the top right corner of the optimum placement area, and "MaxY" represents the Y-coordinate of the top right corner of the optimum placement area.

"POS" is a keyword indicating that a temporary placement location will be represented next.

"X" represents the X-coordinate of the temporary placement location, and "Y" represents the Y-coordinate of the temporary placement location.

(5) Reserve Areas

Reserve areas, for example, illustrated in the above FIG. 18 are represented as "RESERVE AREA Num MinX MinY MaxX MaxY".

"Num" represents a serial number.

"MinX" represents the X-coordinate of the bottom left corner of the reserve area, and "MinY" represents the Y-coordinate of the bottom left corner of the reserve area. "MaxX" represents the X-coordinate of the top right corner of the reserve area, and "MaxY" represents the Y-coordinate of the top right corner of the reserve area.

(6) Placement Inhibition Areas

TCD cell placement inhibition areas, for example, illustrated in the above FIGS. 15 to 17 are represented as "INHIBIT_AREA MinX MinY MaxX MaxY".

"MinX" represents the X-coordinate of the bottom left corner of a placement inhibition area, and "MinY" represents the Y-coordinate of the bottom left corner of the placement inhibition area. "MaxX" represents the X-coordinate of the top right corner of the placement inhibition area, and "MaxY" represents the Y-coordinate of the top right corner of the placement inhibition area.

By placing TCD cells in accordance with the check area information as described above, the module 54a, 54b, or 54c is able to satisfy the DRC placement rule regarding the TCD cell placement on a whole chip.

For example, when a program that executes the function of the dummy TCD cell placement unit 52 is executed, the check area information file is outputted and stored under a directory specified by an argument of a storage unit not illustrated.

The check area information file may be outputted by using an interactive editor. When the function of the dummy TCD cell placement unit 52 is executed, for example, "PLACE" is selected and "EXEC" is pressed on "Dummy TCD Window" in FIG. 13. In this case, the check area information file is outputted and stored under a directory of a storage unit not illustrated, the directory having a directory name entered in "Const.FileOutDir."

For example, when a program that executes the function of the TCD cell placement unit 54a1, 54b1, or 54c1 is executed, since the name of the check area information file is specified by the argument, the module 54a, 54b, or 54c is able to acquire the check area information from the storage unit.

The check area information file may be acquired by using the interactive editor. When the name of the check area information file is entered in "TCD_AREA_IN_FILE" and "OK" is pressed on "lower hierarchical layer window" illustrated in the above FIG. 20, the module 54a, 54b, or 54c acquires the check area information file having the file name.

Next, the dummy TCD cell placement processing in the highest hierarchical layer illustrated in FIG. 10 will be described in detail. The following description will be made on a case in which the dummy TCD cell placement unit 52 automatically places dummy TCD cells and a case in which dummy TCD cells are placed by using an interactive editor.

(Automatic Dummy TCD Cell Placement Processing)

Figure 22:
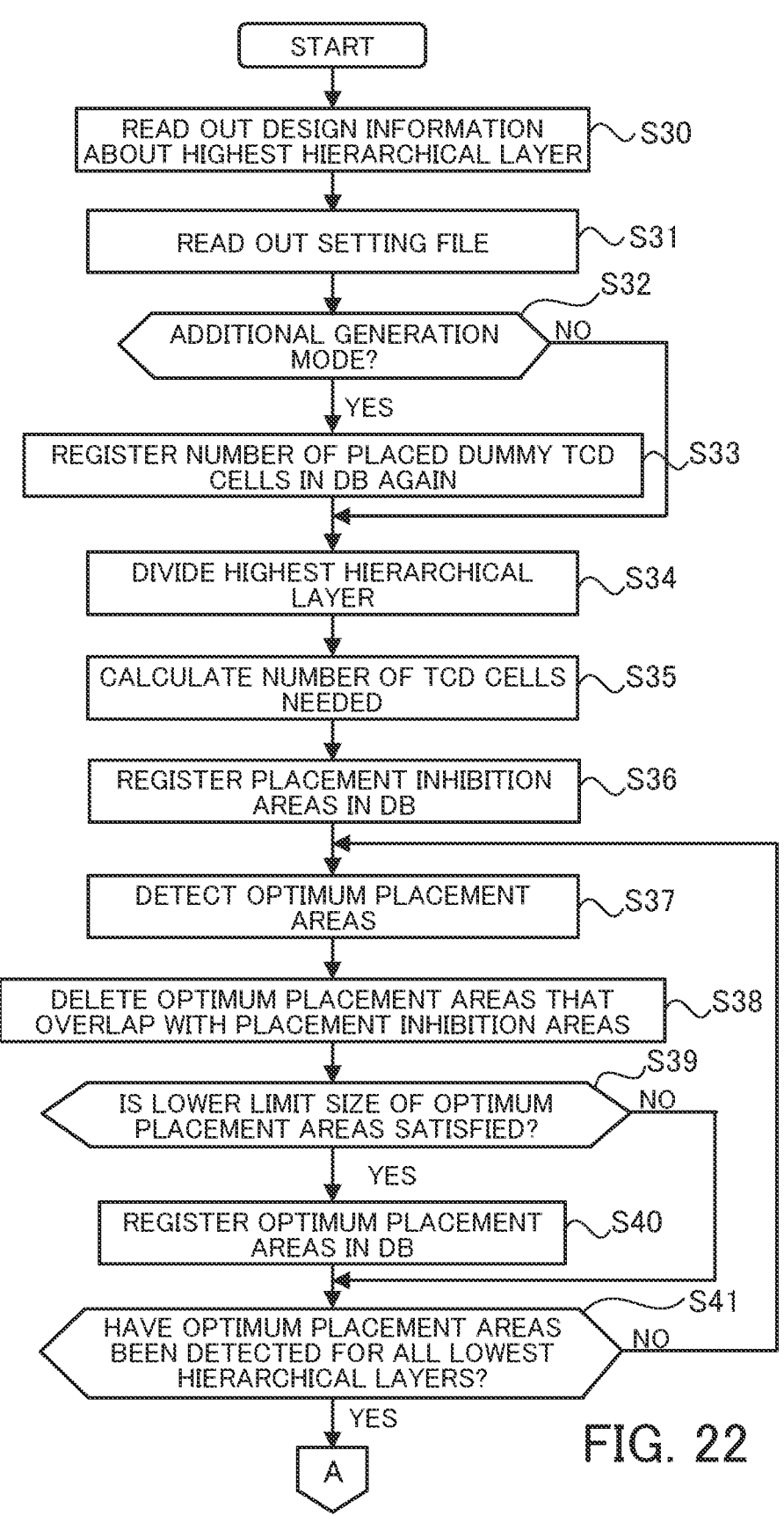
FIG. 22 is a first flowchart illustrating an example of automatic dummy TCD cell placement processing.
Figure 23:
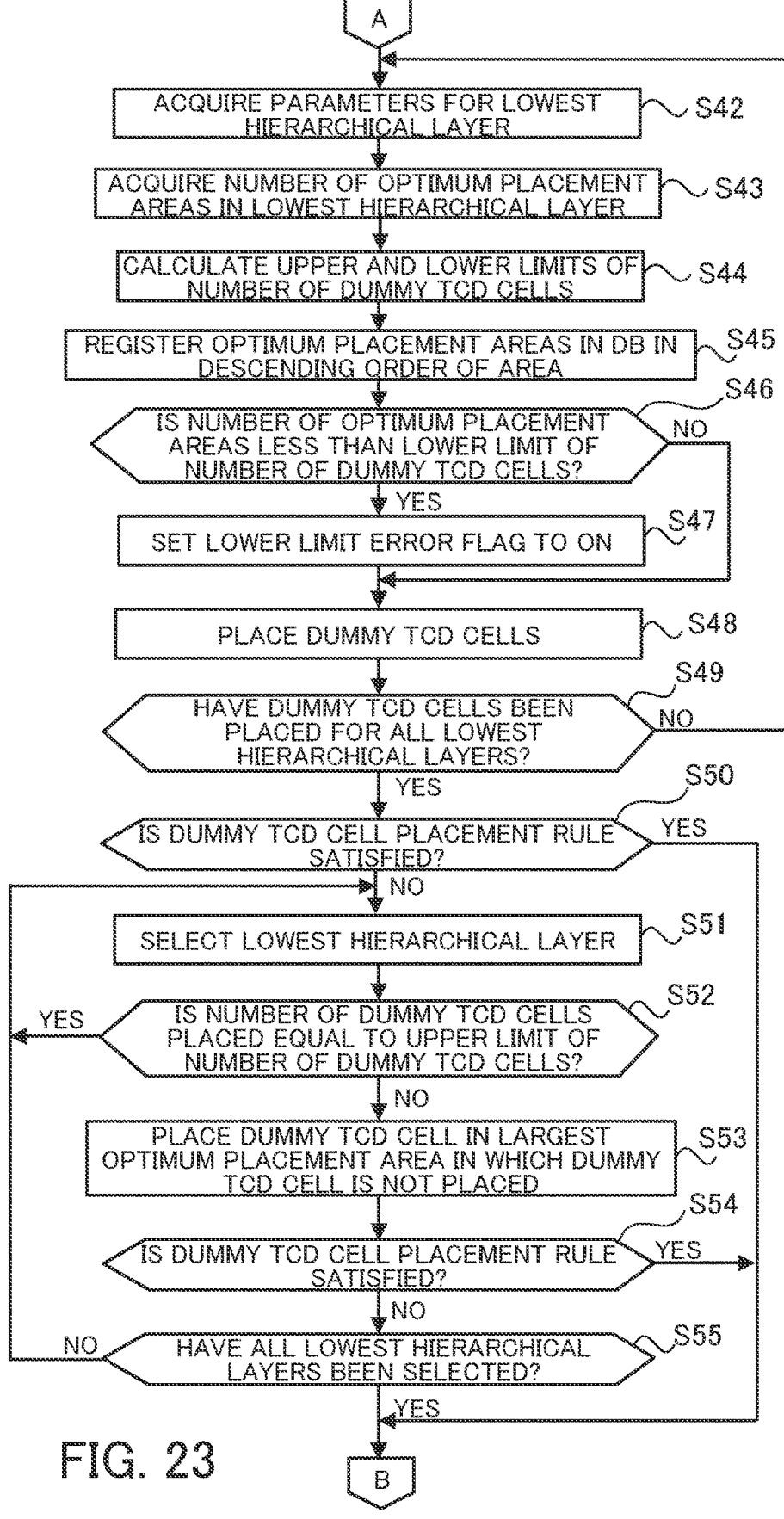
FIG. 23 is a second flowchart illustrating the example of the automatic dummy TCD cell placement processing.
Figure 24:
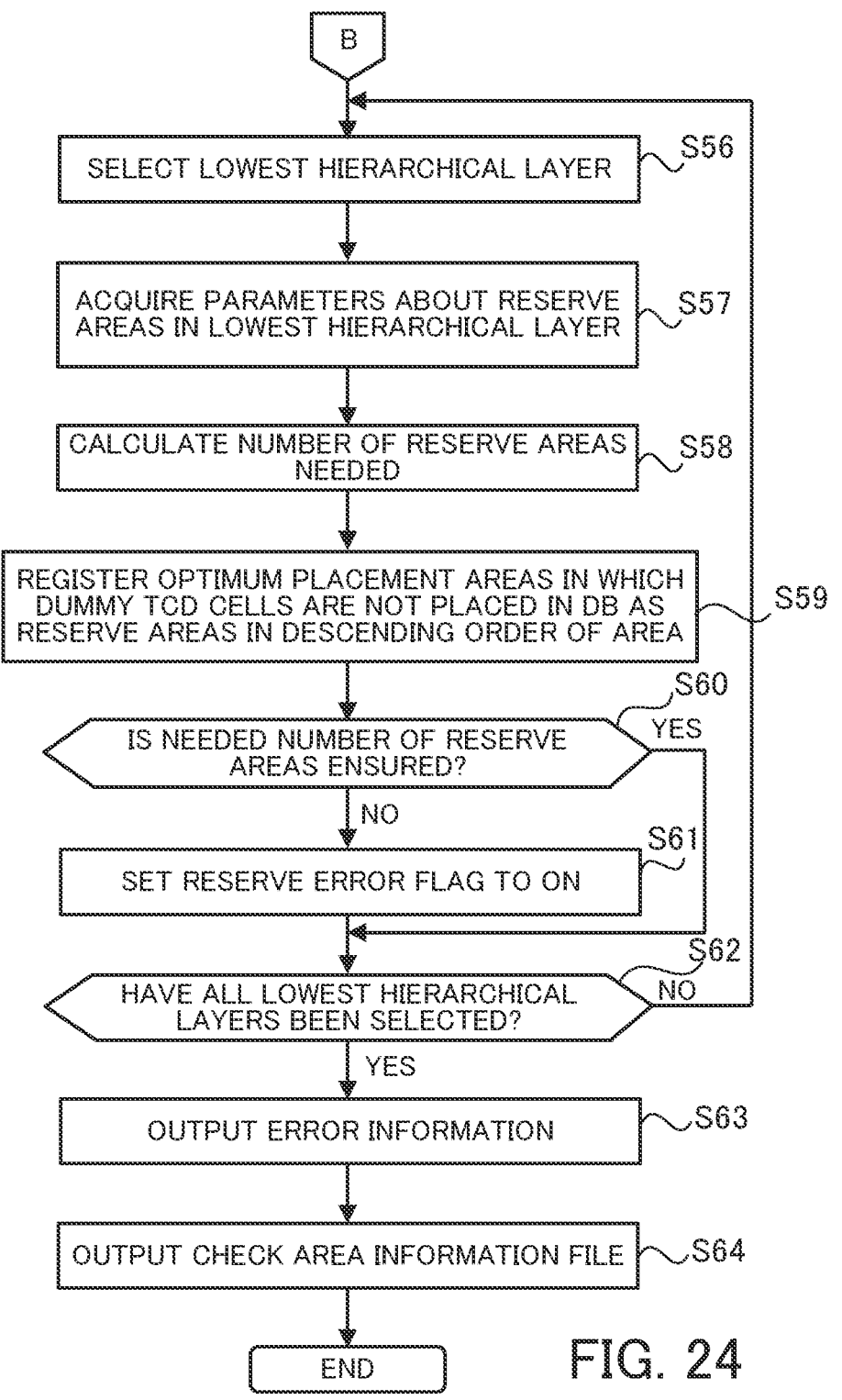
FIG. 24 is a third flowchart illustrating the example of the automatic dummy TCD cell placement processing.

FIGS. 22 to 24 illustrate a flowchart illustrating an example of automatic dummy TCD cell placement processing.

Step S30: The dummy TCD cell placement unit 52 reads out the design information about the highest hierarchical layer from the highest hierarchical layer DB 53.

Step S31: The dummy TCD cell placement unit 52 reads out the setting file (see FIG. 11) about the above highest hierarchical layer.

Step S32: The dummy TCD cell placement unit 52 determines whether the dummy TCD cell generation mode is an additional generation mode. If the dummy TCD cell placement unit 52 determines that the dummy TCD cell generation mode is the additional generation mode, the dummy TCD cell placement unit 52 keeps information in an internal database relating to the placement status about the dummy TCD cells, the information having been created in the highest hierarchical layer DB 53, and the processing proceeds to step S33. If the dummy TCD cell placement unit 52 determines that the dummy TCD cell generation mode is not the additional generation mode (if the dummy TCD cell placement unit 52 determines that the dummy TCD cell generation mode is a new generation mode), the dummy TCD cell placement unit 52 clears the information in the internal database about the dummy TCD cells, the information having been stored in the highest hierarchical layer DB 53, and the processing proceeds to step S34.

Step S33: The dummy TCD cell placement unit 52 calculates, per lowest hierarchical layer, the number of placed dummy TCD cells from the placement situation of the existing dummy TCD cells and registers the number in the internal database again. Next, the processing proceeds to step S34.

Step S34: The dummy TCD cell placement unit 52 divides the highest hierarchical layer into a plurality of check windows in accordance with the above dummy TCD cell placement rule.

Step S35: The dummy TCD cell placement unit 52 calculates the number of TCD cells needed, based on the placement ratio specified by the above dummy TCD cell placement rule and the check window number.

Step S36: If dummy TCD cell placement inhibition areas are set in the highest hierarchical layer, the dummy TCD cell placement unit 52 registers the placement inhibition areas in the internal database.

Step S37: The dummy TCD cell placement unit 52 detects optimum placement areas in an individual instance of an individual lowest hierarchical layer included in the highest hierarchical layer. The detection of the optimum placement areas will be described in detail below.

Step S38: The dummy TCD cell placement unit 52 deletes optimum placement areas that overlap with placement inhibition areas.

Step S39: The dummy TCD cell placement unit 52 determines whether the optimum placement areas satisfy the above lower limit size. If the dummy TCD cell placement unit 52 determines that the optimum placement areas satisfy the lower limit size, the processing proceeds to step S40. If the dummy TCD cell placement unit 52 determines that the optimum placement areas do not satisfy the lower limit size, the processing proceeds to step S41.

Step S40: The dummy TCD cell placement unit 52 registers the optimum placement areas in the internal database. In addition, the dummy TCD cell placement unit 52 registers the optimum placement areas in which the existing dummy TCD cells have been placed in the internal database as TCD cell placement areas.

Step S41: The dummy TCD cell placement unit 52 determines whether optimum placement areas have been detected for all the lowest hierarchical layers. If the dummy TCD cell placement unit 52 determines that optimum placement areas have been detected for all the lowest hierarchical layers, the processing proceeds to step S42. If the dummy TCD cell placement unit 52 determines that optimum placement areas have not been detected for all the lowest hierarchical layers, the processing returns to step S37.

Step S42: The dummy TCD cell placement unit 52 acquires the parameters defined for a lowest hierarchical layer.

Step S43: The dummy TCD cell placement unit 52 acquires the number of optimum placement areas in the lowest hierarchical layer.

Step S44: The dummy TCD cell placement unit 52 acquires, for the lowest hierarchical layer, the upper and lower limits of the dummy TCD cell placement ratio specified as described above and calculates the upper and lower limits of the number of dummy TCD cells.

Step S45: The dummy TCD cell placement unit 52 registers, in the internal database, the optimum placement areas detected for the lowest hierarchical layer in the descending order of area.

Step S46: The dummy TCD cell placement unit 52 determines whether the number of optimum placement areas detected in the lowest hierarchical layer is less than the lower limit of the number of dummy TCD cells. If the dummy TCD cell placement unit 52 determines that the number of optimum placement areas detected in the lowest hierarchical layer is less than the lower limit of the number of dummy TCD cells, the processing proceeds to step S47. If the dummy TCD cell placement unit 52 determines that the number of optimum placement areas detected in the lowest hierarchical layer is more than or equal to the lower limit of the number of dummy TCD cells, the processing proceeds to step S48.

Step S47: The dummy TCD cell placement unit 52 sets a lower limit error flag indicating occurrence of an error to ON.

Step S48: The dummy TCD cell placement unit 52 places dummy TCD cells one by one in the optimum placement areas in the descending order of area until the number of dummy TCD cells placed reaches the lower limit of the dummy TCD cells. The dummy TCD cell placement unit 52 places dummy TCD cells and registers the optimum placement areas in which the dummy TCD cells have been placed in the internal database as TCD cell placement areas.

For example, each individual dummy TCD cell is placed in the middle of an optimum placement area.

Step S49: The dummy TCD cell placement unit 52 determines, for all the lowest hierarchical layers, whether the dummy TCD cells have been placed. If the dummy TCD cell placement unit 52 determines that, for all the lowest hierarchical layers, the dummy TCD cells have been placed, the processing proceeds to step S50. If the dummy TCD cell placement unit 52 determines that, for all the lowest hierarchical layers, the dummy TCD cells have not been placed, the processing returns to step S42.

Step S50: The dummy TCD cell placement unit 52 determines whether the dummy TCD cell placement rule is satisfied. If the dummy TCD cell placement unit 52 determines that the dummy TCD cell placement rule is satisfied, the dummy TCD cell placement unit 52 sets a placement rule OK flag to ON, and the processing proceeds to step S56. If the dummy TCD cell placement unit 52 determines that the dummy TCD cell placement rule is not satisfied, the processing proceeds to step S51.

Step S51: The dummy TCD cell placement unit 52 selects a lowest hierarchical layer.

Step S52: The dummy TCD cell placement unit 52 determines whether the number of dummy TCD cells placed is equal to the upper limit of the number of dummy TCD cells. If the dummy TCD cell placement unit 52 determines that the number of TCD cells placed in the selected lowest hierarchical layer is equal to the upper limit of the number of dummy TCD cells, the processing returns to step S51. If the dummy TCD cell placement unit 52 determines that the number of dummy TCD cells placed is not equal to the upper limit of the number of dummy TCD cells, the processing proceeds to step S53.

If, regarding the selected lowest hierarchical layer, the above lower limit error flag is set to ON or if a dummy TCD cell is placed in each optimum placement area, regardless of the result of the above determination, step S51 is performed.

Step S53: The dummy TCD cell placement unit 52 places a dummy TCD cell in the largest optimum placement area in which a dummy TCD cell is not placed. The dummy TCD cell placement unit 52 places dummy TCD cells and registers the optimum placement areas in which the dummy TCD cells have been placed in the highest hierarchical layer DB 53 as TCD cell placement areas.

For example, each individual dummy TCD cell is placed in the middle of an optimum placement area.

Step S54: The dummy TCD cell placement unit 52 determines whether the dummy TCD cell placement rule is satisfied. If the dummy TCD cell placement unit 52 determines that the dummy TCD cell placement rule is satisfied, the dummy TCD cell placement unit 52 sets the placement rule OK flag to ON, and the processing proceeds to step S56. If the dummy TCD cell placement unit 52 determines that the dummy TCD cell placement rule is not satisfied, the processing proceeds to step S55.

Step S55: The dummy TCD cell placement unit 52 determines whether all the lowest hierarchical layers have been selected. If the dummy TCD cell placement unit 52 determines that all the lowest hierarchical layers have been selected, the processing proceeds to step S56. If the dummy TCD cell placement unit 52 determines that all the lowest hierarchical layers have not been selected yet, the processing returns to step S51.

Step S56: The dummy TCD cell placement unit 52 selects a lowest hierarchical layer.

Step S57: The dummy TCD cell placement unit 52 acquires the parameters about the reserve areas in the selected lowest hierarchical layer.

Step S58: The dummy TCD cell placement unit 52 calculates the number of reserve areas needed in the selected lowest hierarchical layer.

Step S59: The dummy TCD cell placement unit 52 registers optimum placement areas in which dummy TCD cells are not placed in the internal database as reserve areas in the selected lowest hierarchical layer in the descending order of area until the above needed number is reached.

Step S60: The dummy TCD cell placement unit 52 determines whether the above needed number of reserve areas is ensured in the selected lowest hierarchical layer. If the dummy TCD cell placement unit 52 determines that the above needed number of reserve areas is ensured, the processing proceeds to step S62. If the dummy TCD cell placement unit 52 determines that the above needed number of reserve areas is not ensured, the processing proceeds to step S61.

Step S61: The dummy TCD cell placement unit 52 sets a reserve error flag indicating occurrence of an error to ON.

Step S62: The dummy TCD cell placement unit 52 determines whether all the lowest hierarchical layers have been selected. If the dummy TCD cell placement unit 52 determines that all the lowest hierarchical layers have been selected, the processing proceeds to step S63. If the dummy TCD cell placement unit 52 determines that all the lowest hierarchical layers have not been selected, the processing returns to step S56.

Step S63: If the dummy TCD cell placement unit 52 has set the above lower limit error flag or reserve error flag to ON, the dummy TCD cell placement unit 52 causes the output unit 55 to output error information indicating occurrence of the lower limit error or reserve error.

Step S64: The dummy TCD cell placement unit 52 outputs the check area information (see FIG. 21) obtained by the above processing to all the lowest hierarchical layers (the modules 54a to 54c).

Next, the dummy TCD cell placement unit 52 ends the processing for placing dummy TCD cells in the highest hierarchical layer.

The order of the steps of the above processing is an example, and thus, the order may be changed as needed. (Examples of Optimum Placement Area Detection Processing and Dummy TCD Cell Placement Processing)

Hereinafter, examples of optimum placement area detection processing and dummy TCD cell placement processing in step S37 will be described.

FIGS. 25 to 29 illustrate an example of optimum placement area detection processing.

FIG. 25 illustrates a plurality of instances a to c of a lowest hierarchical layer in a highest hierarchical layer. In the instances a to c, dashed lines indicate boundaries of segments obtained by dividing the highest hierarchical layer. The number and size of segments differ among the instances a to c, depending on the locations of the instances a to c in the highest hierarchical layer.

In each of the instances a to c, a diagonal line and a line orthogonal thereto are illustrated. These lines indicate the direction of the instances a to c.

(1) As illustrated in FIG. 25, the dummy TCD cell placement unit 52 first places the plurality instances (instances a to c) in a direction without a flip.

(2) Next, the dummy TCD cell placement unit 52 determines a reference instance. For example, the reference instance is an instance having the largest bottom left segment among the instances a to c. In the example in FIG. 25, the instance a is determined as the reference instance.

(3) The dummy TCD cell placement unit 52 determines the processing order. The dummy TCD cell placement unit 52 sets, among the four segments of the instance a as the reference instance, a segment as a reference area, for example, in the ascending order of the x and y coordinates (the bottom left corner of each of the instances a to c is x=y=0). In the example in FIG. 25, the bottom left segment, the bottom right segment, the top left segment, and the top right segment are each determined as a reference area in this order (processing order). Hereinafter, these segments will sequentially be referred to as reference area No. 1, reference area No. 2, reference area No. 3, and reference area No. 4 in the above order.

FIG. 26 illustrates processing performed on reference area No. 1 in the reference instance.

(4) The dummy TCD cell placement unit 52 detects, in each of the instances b and c, an area (contact area) in which at least one segment comes into contact with the reference area No. 1 when the instances a to c are overlapped with each other.

(5) The dummy TCD cell placement unit 52 determines, in each contact area, the largest segment overlapping with reference area No. 1 as a segment (maximum overlapping area) at a location corresponding to reference area No. 1. Next, the dummy TCD cell placement unit 52 detects an AND area in which all the maximum overlapping areas at the location corresponding to reference area No. 1 overlap with each other at least partly as an optimum placement area.

FIG. 27 illustrates processing performed on reference area No. 2 in the reference instance.

(6) The dummy TCD cell placement unit 52 detects, in each of the instances b and c, at least one segment (a contact area) that comes into contact with reference area No. 2 when the instances a to c are overlapped with each other. The dummy TCD cell placement unit 52 excludes a segment in which an optimum placement area has been detected from the corresponding contact area.

(7) The dummy TCD cell placement unit 52 determines, in each contact area, the largest segment overlapping with reference area No. 2 as a segment (maximum overlapping area) at the location corresponding to reference area No. 2. Next, the dummy TCD cell placement unit 52 detects an AND area in which the maximum overlapping areas at the location corresponding to reference area No. 2 overlap with each other at least partly as an optimum placement area.

FIG. 28 illustrates processing performed on reference area No. 3 in the reference instance, and FIG. 29 illustrates processing performed on reference area No. 4 in the reference instance. As illustrated in (8) to (11) in FIGS. 28 and 29, optimum placement areas are detected in accordance with the same processing as described above.

Figure 30:
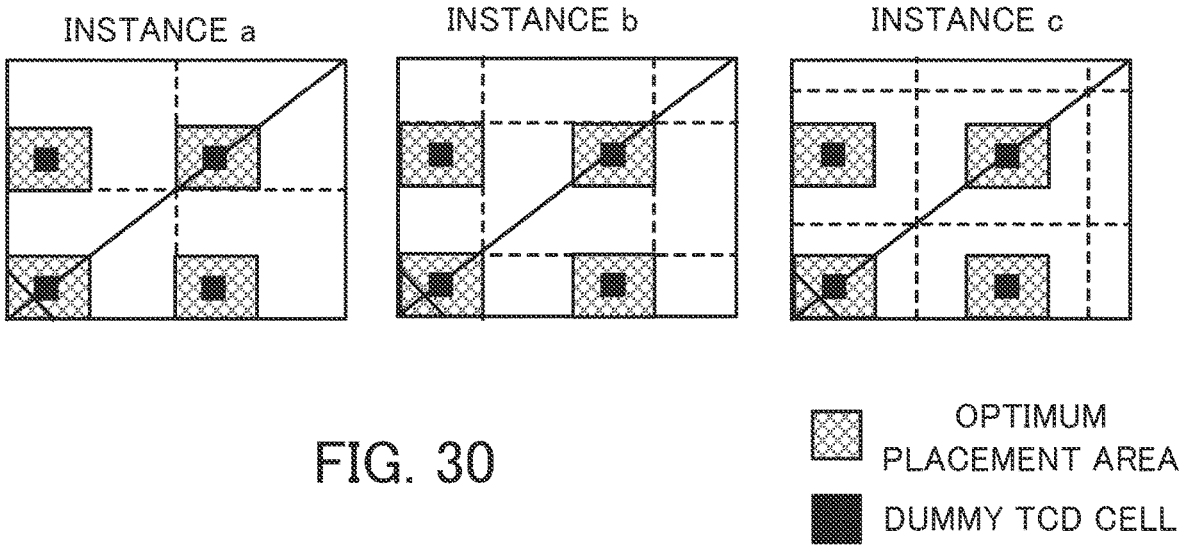
FIG. 30 illustrates an example of dummy TCD cell placement processing.

FIG. 30 illustrates an example of dummy TCD cell placement processing.

FIG. 30 illustrates an example in which, in each of the instances a to c, dummy TCD cells have been placed in the four optimum placement areas detected in the processing in FIGS. 25 to 29. The dummy TCD cell placement unit 52 places one dummy TCD cell in the middle of each optimum placement area, for example.

(Dummy TCD Cell Placement Processing Using Interactive Editor)

Figure 31:
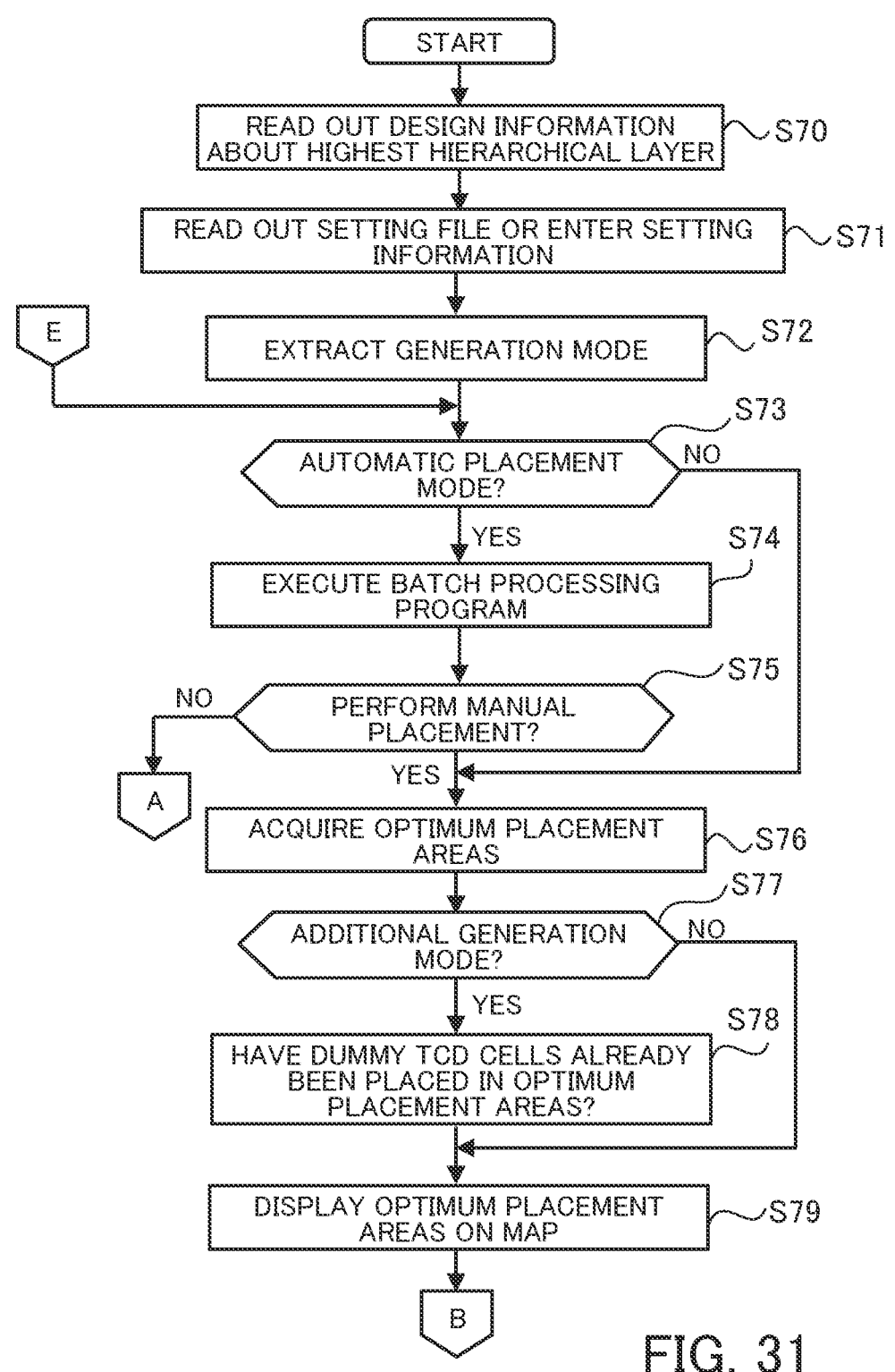
FIG. 31 is a first flowchart illustrating an example of the dummy TCD cell placement processing using the interactive editor.
Figure 32:
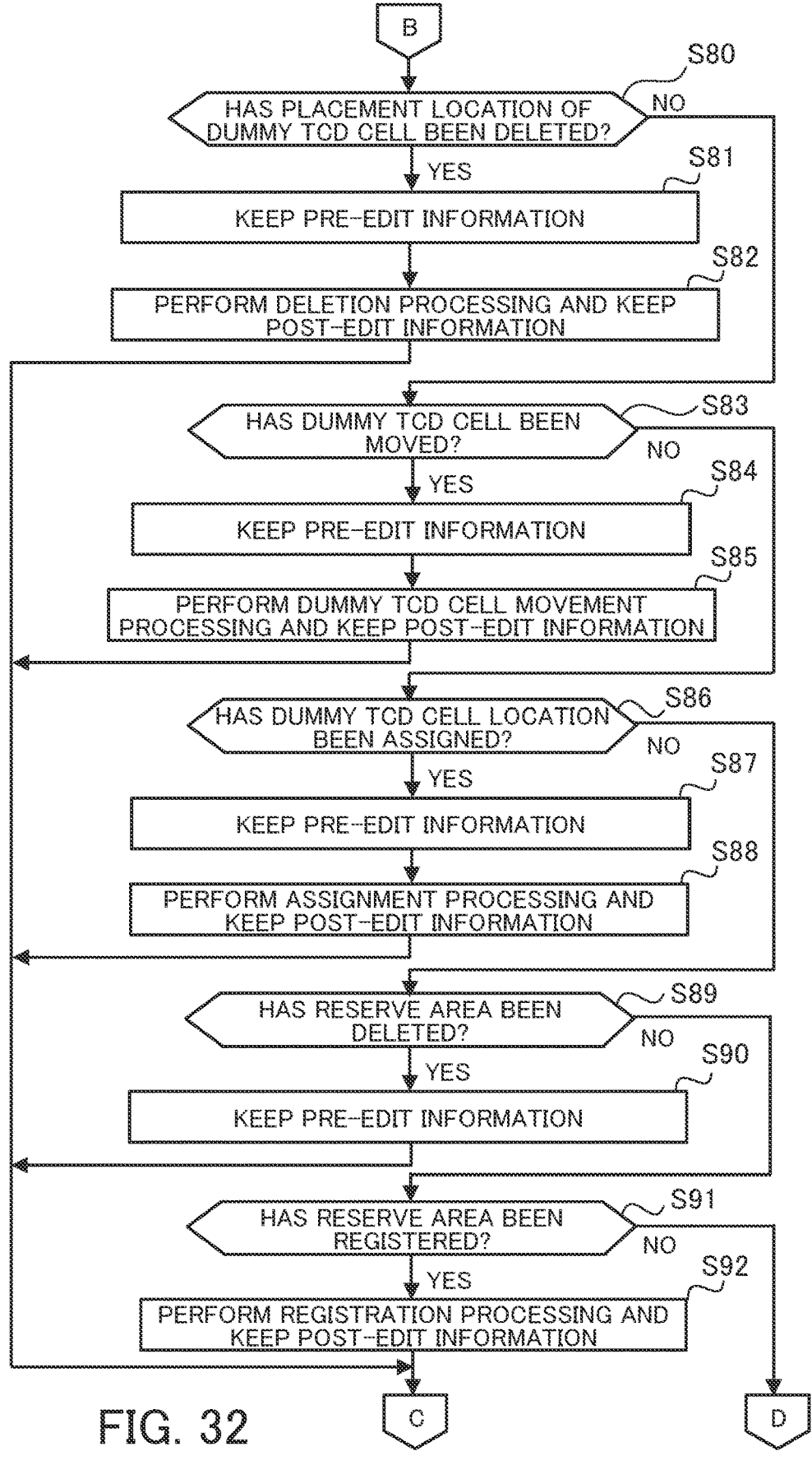
FIG. 32 is a second flowchart illustrating the example of the dummy TCD cell placement processing using the interactive editor.
Figure 33:
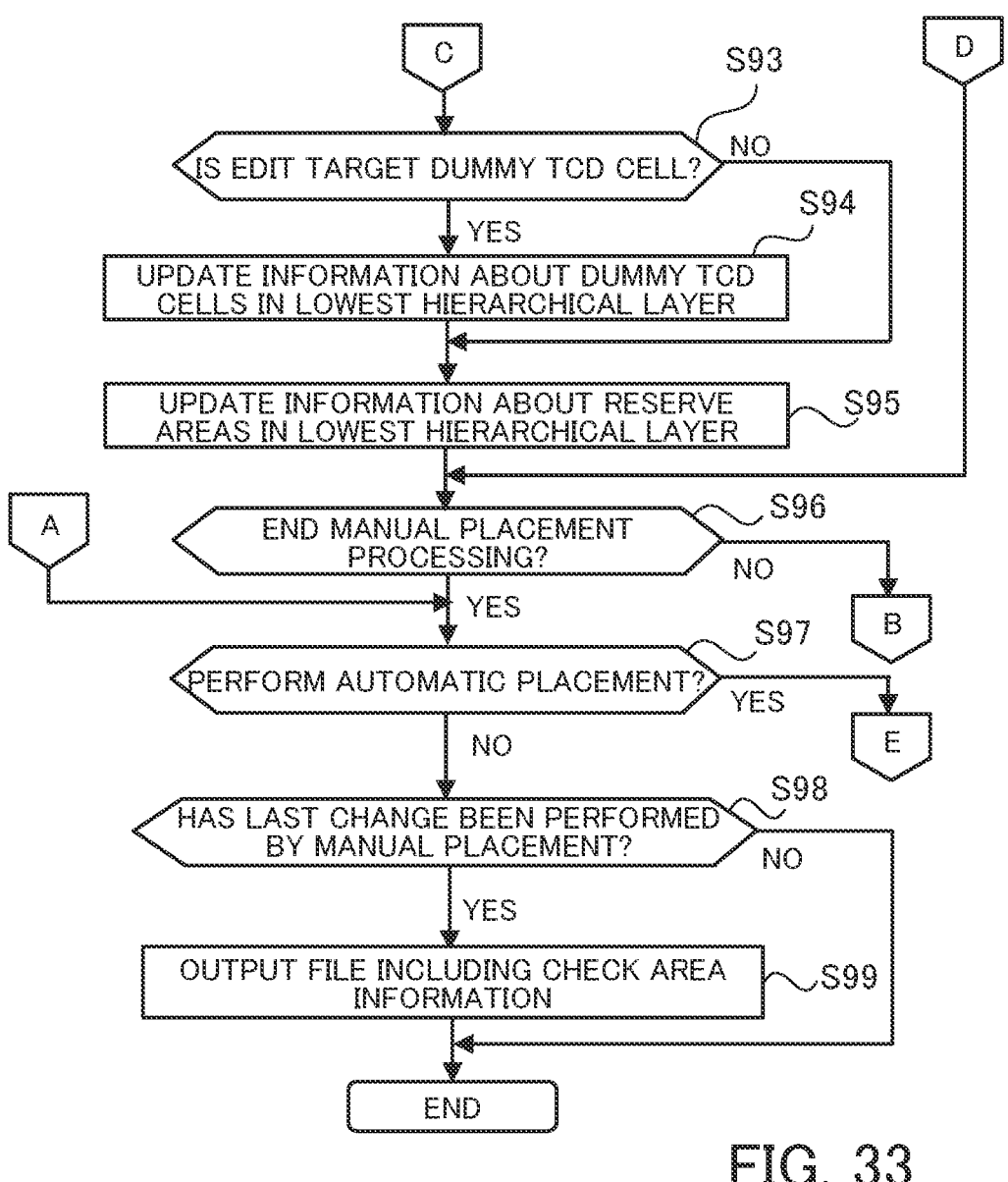
FIG. 33 is a third flowchart illustrating the example of the dummy TCD cell placement processing using the interactive editor.

FIGS. 31 to 33 are a flowchart illustrating an example of dummy TCD cell placement processing using an interactive editor.

Step S70: The dummy TCD cell placement unit 52 reads out the design information about the highest hierarchical layer from the highest hierarchical layer DB 53.

Step S71: The dummy TCD cell placement unit 52 reads out the setting file (see FIG. 11) about the above highest hierarchical layer. Alternatively, for example, the setting information is entered by using the interactive editor as described above, and the dummy TCD cell placement unit 52 acquires the entered setting information.

Step S72: The dummy TCD cell placement unit 52 extracts a generation mode. For example, the user specifies the generation mode by using the interactive editor. Examples of the generation mode include the additional generation mode, the new generation mode, an automatic placement mode, and a manual placement mode.

Step S73: The dummy TCD cell placement unit 52 determines whether the dummy TCD cell generation mode is the automatic placement mode. If the dummy TCD cell placement unit 52 determines that the dummy TCD cell generation mode is the automatic placement mode, the processing proceeds to step S74. If the dummy TCD cell placement unit 52 determines that the dummy TCD cell generation mode is not the automatic placement mode, the processing proceeds to step S76.

Step S74: The dummy TCD cell placement unit 52 executes a program that performs batch processing, so as to perform the automatic dummy TCD cell placement processing as illustrated in FIGS. 22 to 24.

Step S75: The dummy TCD cell placement unit 52 receives an instruction that the user has entered by using, for example, the interactive editor and determines whether to perform manual placement. If the dummy TCD cell placement unit 52 determines to perform manual placement, the dummy TCD cell placement unit 52 sets the generation mode again, and the processing proceeds to step S76. If the dummy TCD cell placement unit 52 determines not to perform manual placement, the processing proceeds to step S97 in FIG. 33.

Step S76: The dummy TCD cell placement unit 52 acquires optimum placement areas. If optimum placement areas have not been detected yet, the dummy TCD cell placement unit 52 detects optimum placement areas by performing the above steps as illustrated in FIGS. 25 to 29.

Step S77: The dummy TCD cell placement unit 52 determines whether the dummy TCD cell generation mode is the additional generation mode. If the dummy TCD cell placement unit 52 determines that the dummy TCD cell generation mode is the additional generation mode, the dummy TCD cell placement unit 52 keeps the information in the internal database relating to the placement status about the dummy TCD cells, the information having been created in the highest hierarchical layer DB 53, and the processing proceeds to step S78. If the dummy TCD cell placement unit 52 determines that the dummy TCD cell generation mode is not the additional generation mode (determines that the dummy TCD cell generation mode is the new generation mode), the dummy TCD cell placement unit 52 clears the information in the internal data stored in the highest hierarchical layer DB 53, and the processing proceeds to step S79.

Step S78: The dummy TCD cell placement unit 52 checks whether dummy TCD cells have already been placed in the optimum placement areas.

Step S79: The dummy TCD cell placement unit 52 displays the optimum placement areas on a map (see FIG. 34) of the interactive editor. For example, the optimum placement areas in which dummy TCD cells have already been placed, the optimum placement areas in which dummy TCD cells have not been placed, and the reserve areas are displayed in different colors.

Step S80: The dummy TCD cell placement unit 52 determines whether the placement location of a dummy TCD cell has been deleted by a manual operation by using the interactive editor. If the dummy TCD cell placement unit 52 determines that the placement location of a dummy TCD cell has been deleted, the processing proceeds to step S81. If the dummy TCD cell placement unit 52 determines that the placement location of a dummy TCD cell has not been deleted, the processing proceeds to step S83.

Step S81: The dummy TCD cell placement unit 52 keeps the information about the placement location of the dummy TCD cell that has not been deleted yet (pre-edit information). Next, the processing proceeds to step S82.

Step S82: The dummy TCD cell placement unit 52 performs dummy TCD cell placement location deletion processing and keeps the deletion information (post-edit information). Next, the processing proceeds to step S93 in FIG. 33.

Step S83: The dummy TCD cell placement unit 52 determines whether a dummy TCD cell has been moved by a manual operation using the interactive editor. If the dummy TCD cell placement unit 52 determines that a dummy TCD cell has been moved, the processing proceeds to step S84. If the dummy TCD cell placement unit 52 determines that a dummy TCD cell has not been moved, the processing proceeds to step S86.

Step S84: The dummy TCD cell placement unit 52 keeps the information about the dummy TCD cell that has not been moved yet (pre-edit information). Next, the processing proceeds to step S85.

Step S85: The dummy TCD cell placement unit 52 performs dummy TCD cell movement processing and keeps the information about the placement location of the dummy TCD cell that has been moved (post-edit information). Next, the processing proceeds to step S93 in FIG. 33.

Step S86: The dummy TCD cell placement unit 52 determines whether a dummy TCD cell location has been assigned (a dummy TCD cell placement location has been determined) by a manual operation using the interactive editor. If the dummy TCD cell placement unit 52 determines that a dummy TCD cell placement has been assigned, the processing proceeds to step S87. If the dummy TCD cell placement unit 52 determines that a dummy TCD cell placement has not been assigned, the processing proceeds to step S89.

Step S87: The dummy TCD cell placement unit 52 keeps the information about the dummy TCD cell placement that has not been assigned yet (pre-edit information). Next, the processing proceeds to step S88.

Step S88: The dummy TCD cell placement unit 52 performs dummy TCD cell placement assignment processing and keeps the information about the assigned placement location (post-edit information). Next, the processing proceeds to step S93 in FIG. 33.

Step S89: The dummy TCD cell placement unit 52 determines whether a reserve area has been deleted by a manual operation using the interactive editor. If the dummy TCD cell placement unit 52 determines that a reserve area has been deleted, the processing proceeds to step S90. If the dummy TCD cell placement unit 52 determines that a reserve area has not been deleted, the processing proceeds to step S91.

Step S90: The dummy TCD cell placement unit 52 keeps the information about the selected reserve area that has not been deleted yet (pre-edit information). Next, the processing proceeds to step S93 in FIG. 33.

Step S91: The dummy TCD cell placement unit 52 determines whether a reserve area has been registered by a manual operation using the interactive editor. If the dummy TCD cell placement unit 52 determines that a reserve area has been registered, the processing proceeds to step S92. If the dummy TCD cell placement unit 52 determines that a reserve area has not been registered, the processing proceeds to step S96 in FIG. 33.

Step S92: The dummy TCD cell placement unit 52 performs reserve area registration processing and keeps the registered information (post-edit information). Next, the processing proceeds to step S93 in FIG. 33.

Step S93: The dummy TCD cell placement unit 52 determines whether the edit target is a dummy TCD cell. If any one of the determination results in the above steps S80, S83, and S86 is "YES", the dummy TCD cell placement unit 52 determines that the edit target is a dummy TCD cell. If the dummy TCD cell placement unit 52 determines that the edit target is a dummy TCD cell, the processing proceeds to step S94. If the dummy TCD cell placement unit 52 determines that the edit target is not a dummy TCD cell, the processing proceeds to step S95.

Step S94: The dummy TCD cell placement unit 52 updates the information about the dummy TCD cells in the lowest hierarchical layer (the information about the temporary placement locations of the TCD cells included in the above check area information (the placement locations of the dummy TCD cells)), based on the pre-edit information and the post-edit information.

Step S95: The dummy TCD cell placement unit 52 updates the information about the reserve areas included in the check area information about the lowest hierarchical layer whose reserve areas have been changed. Next, the processing proceeds to step S96.

Step S96: The dummy TCD cell placement unit 52 receives a user instruction entered by using, for example, the interactive editor and determines whether to end the manual placement processing. If the dummy TCD cell placement unit 52 determines to end the manual placement processing, the processing proceeds to step S97. If the dummy TCD cell placement unit 52 determines not to end the manual placement processing, the processing returns to step S80.

Step S97: The dummy TCD cell placement unit 52 receives a user instruction entered by using, for example, the interactive editor and determines whether to perform automatic placement of dummy TCD cells. If the dummy TCD cell placement unit 52 determines to perform the automatic placement, the generation mode (the additional generation mode, the new generation mode, or the automatic placement mode) is set again, and the processing returns to step S73. If the dummy TCD cell placement unit 52 determines not to perform the automatic placement, the processing proceeds to step S98.

Step S98: The dummy TCD cell placement unit 52 determines whether the last change about the placement of the dummy TCD cells and the reserve areas has been performed by manual placement. If the dummy TCD cell placement unit 52 determines that the last change has been performed by manual placement, the processing proceeds to step S99. If the dummy TCD cell placement unit 52 determines that the last change has not been performed by manual placement, the dummy TCD cell placement unit 52 ends the processing.

Step S99: The dummy TCD cell placement unit 52 outputs a file including the check area information including the updated dummy TCD cell information or reserve area information. Next, the dummy TCD cell placement unit 52 ends the processing.

The order of the steps of the above processing is an example, and thus, the order may be changed as needed.

Figure 34:
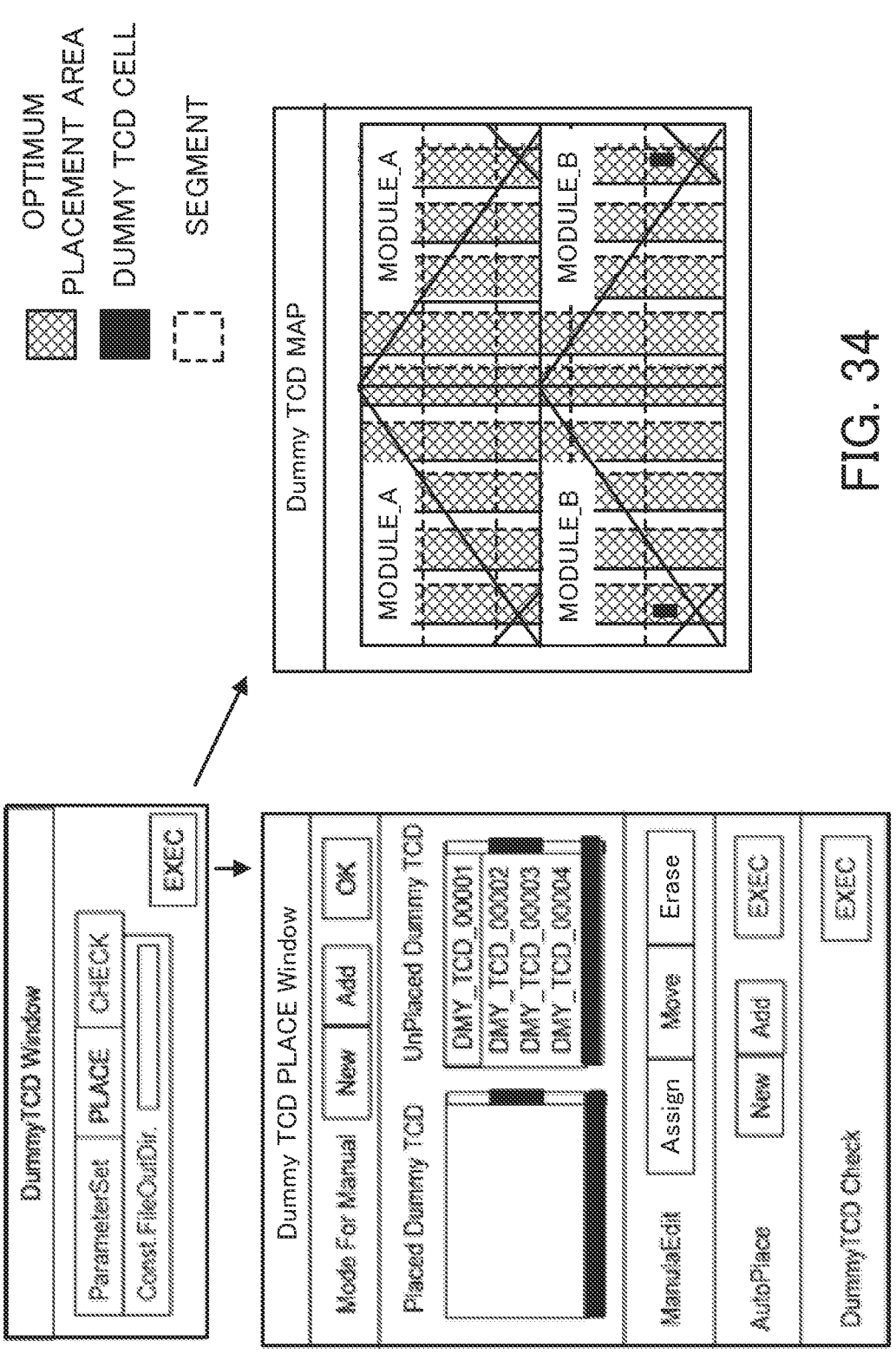
FIG. 34 illustrates an example of an operation of placing dummy TCD cells using the interactive editor.

FIG. 34 illustrates an example of an operation of placing dummy TCD cells by using an interactive editor.

First, "Dummy TCD Window" as illustrated in FIG. 34 is displayed on the screen of the display 44a. When the user selects "PLACE" and presses "EXEC" by operating the input device 45a, "Dummy TCD PLACE Window" and "Dummy TCD MAP" are displayed.

When "New" (the new generation mode) or "Add" (the additional generation mode) is selected and "OK" is pressed on "Dummy TCD PLACE Window", a screen for selecting a dummy TCD cell not placed is displayed. Herein, if any one of the dummy TCD cells not placed is selected, "Assign" is pressed, and a dummy TCD cell is placed in an optimum placement area, the placement location of the dummy TCD cell is determined.

On "Dummy TCD MAP" in FIG. 34, "MODULE_A" and "MODULE_B", which indicate two lowest hierarchical layers, are placed in the highest hierarchical layer. "MODULE_A" and "MODULE_B" each have two instances. For example, when a dummy TCD cell is placed in an optimum placement area of the instance of the bottom left "MODULE_B", the dummy TCD cell placement unit 52 reflects the placement of the dummy TCD cell on the other instance (the bottom right instance) of "MODULE_B", which is the same library.

An example of this function (a dummy TCD cell expansion function) will be described in more detail.

Figure 35:
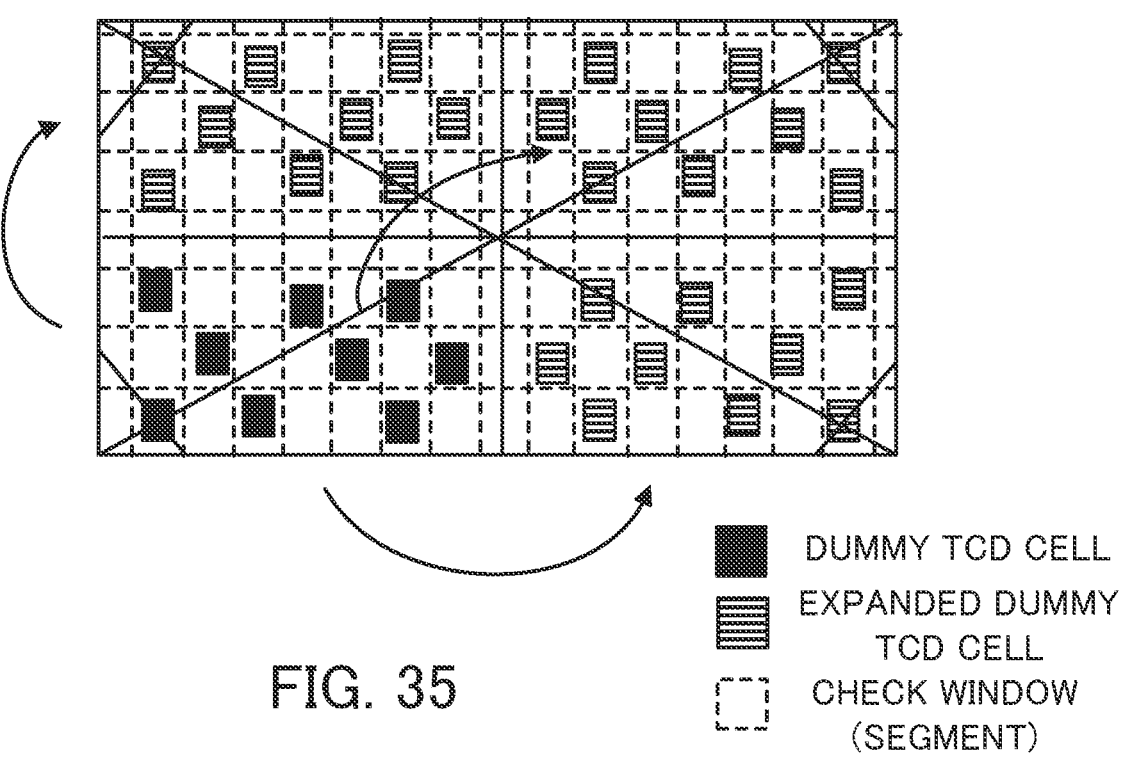
FIG. 35 illustrates an example of a dummy TCD cell expansion function.

FIG. 35 illustrates an example of a dummy TCD cell expansion function.

FIG. 35 illustrates, as an example, four instances in a lowest hierarchical layer. Nine dummy TCD cells placed in the bottom left instance are expanded to corresponding locations in the other three instances as expanded dummy TCD cells by a function of the dummy TCD cell placement unit 52.

In this way, when the dummy TCD cell placement validation is performed in the highest hierarchical layer, the user does not need to place dummy TCD cells on all the instances.

Next, the dummy TCD cell placement validation in the highest hierarchical layer illustrated in FIG. 10 will be described in detail. The following description will be made on a case in which the dummy TCD cell placement unit 52 automatically performs the dummy TCD cell placement validation and a case in which the dummy TCD cell placement validation is performed by using an interactive editor.
(Automatic Dummy TCD Cell Placement Validation)

Figure 36:
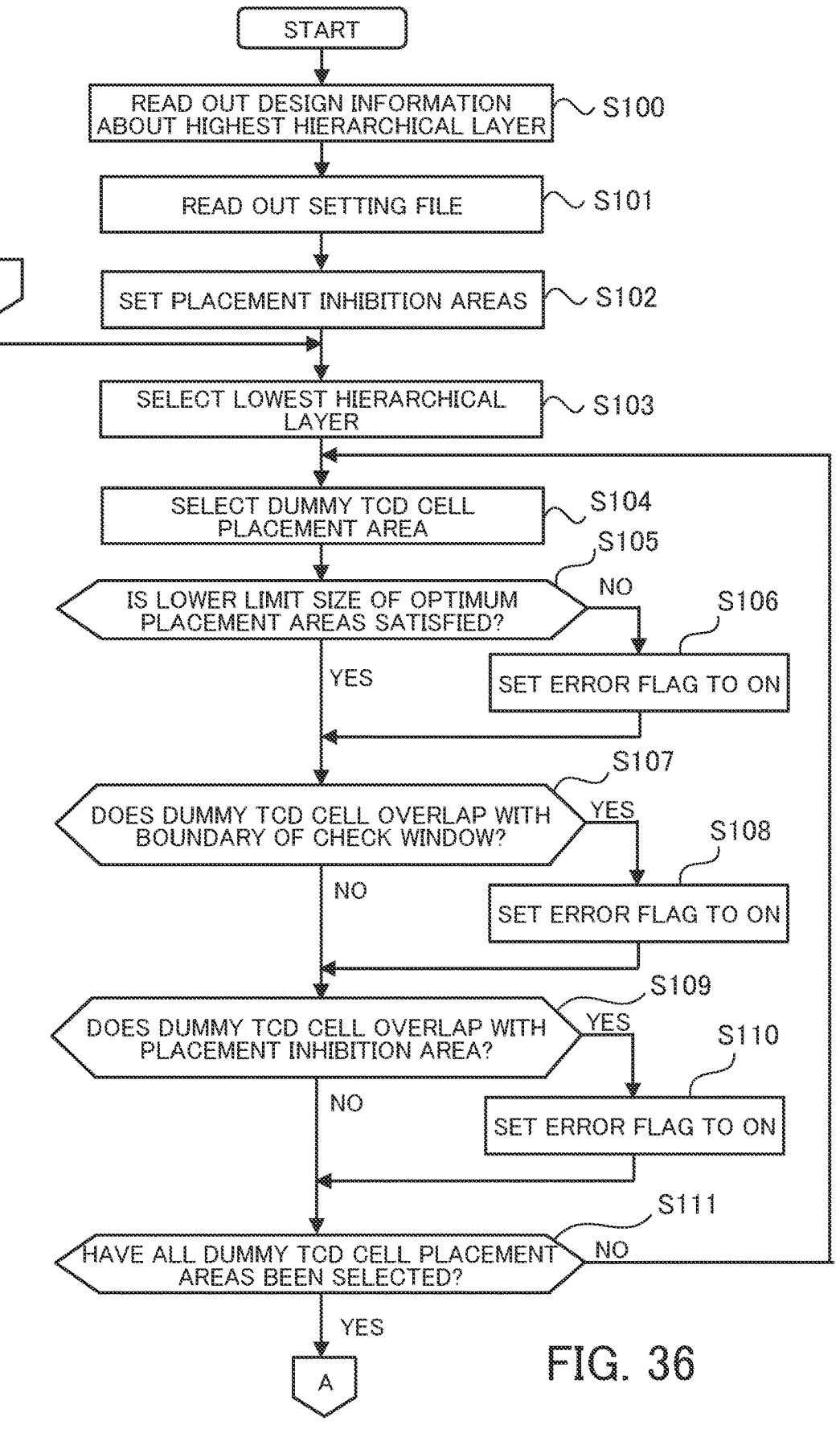
FIG. 36 is a first flowchart illustrating an example of automatic dummy TCD cell placement validation.
Figure 37:
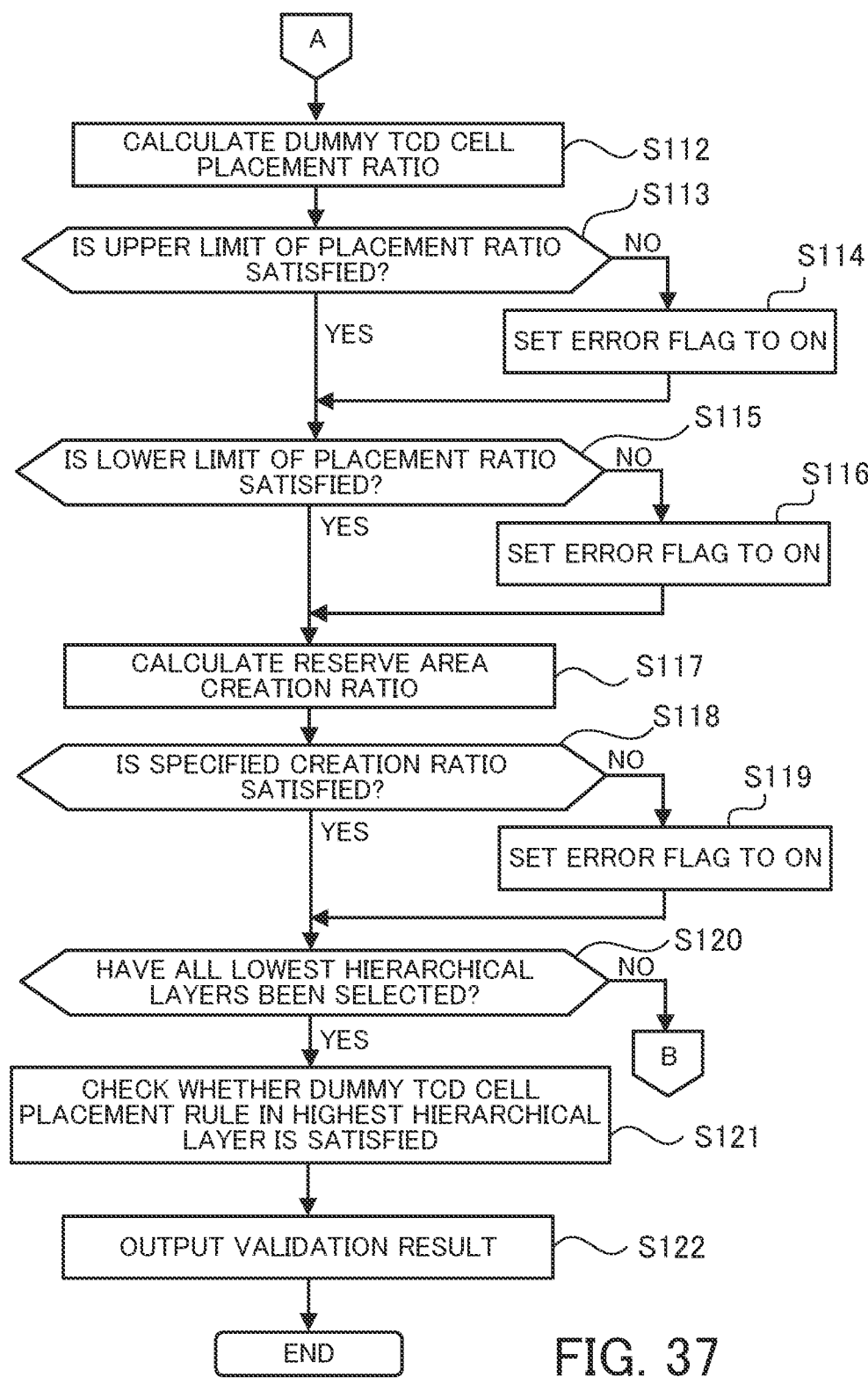
FIG. 37 is a second flowchart illustrating the example of the automatic dummy TCD cell placement validation.

FIGS. 36 and 37 are a flowchart illustrating an example of automatic dummy TCD cell placement validation.

Step S100: The dummy TCD cell placement unit 52 reads out the design information about the highest hierarchical layer from the highest hierarchical layer DB 53.

Step S101: The dummy TCD cell placement unit 52 reads out the setting file about the highest hierarchical layer (see FIG. 11).

Step S102: The dummy TCD cell placement unit 52 sets the dummy TCD cell placement inhibition areas specified in the setting file in the highest hierarchical layer.

Step S103: If a plurality of lowest hierarchical layers (modules) are included in the highest hierarchical layer, the dummy TCD cell placement unit 52 selects one of the lowest hierarchical layers.

Step S104: The dummy TCD cell placement unit 52 selects one of the optimum placement areas (the dummy TCD cell placement areas) in which the dummy TCD cells are placed in the selected lowest hierarchical layer.

Step S105: The dummy TCD cell placement unit 52 determines whether the selected dummy TCD cell placement area satisfies the lower limit size of the optimum placement areas. If the dummy TCD cell placement unit 52 determines that the dummy TCD cell placement area satisfies the lower limit size of the optimum placement areas, the processing proceeds to step S107. If the dummy TCD cell placement unit 52 determines that the dummy TCD cell placement area does not satisfy the lower limit size of the optimum placement areas, the processing proceeds to step S106.

Step S106: The dummy TCD cell placement unit 52 sets an error flag indicating occurrence of an error to ON.

Step S107: The dummy TCD cell placement unit 52 determines whether the dummy TCD cell placed in the selected dummy TCD cell placement area overlaps with the boundary of a check window (a segment). If the dummy TCD cell placement unit 52 determines that the dummy TCD cell overlaps with the boundary of a check window, the processing proceeds to step S108. If the dummy TCD cell placement unit 52 determines that the dummy TCD cell does not overlap with the boundary of a check window, the processing proceeds to step S109.

Step S108: The dummy TCD cell placement unit 52 sets an error flag indicating occurrence of an error to ON, determines the optimum placement area, which is the selected dummy TCD cell placement area, to be invalid, and sets the dummy TCD cell placed in the dummy TCD cell placement area to be invalid.

Step S109: The dummy TCD cell placement unit 52 determines whether the dummy TCD cell placed in the selected dummy TCD cell placement area overlaps with a placement inhibition area. If the dummy TCD cell placement unit 52 determines that the dummy TCD cell overlaps with a placement inhibition area, the processing proceeds to step S110. If the dummy TCD cell placement unit 52 determines that the dummy TCD cell does not overlap with a placement inhibition area, the processing proceeds to step S111.

Step S110: The dummy TCD cell placement unit 52 sets an error flag indicating occurrence of an error to ON, determines the optimum placement area, which is the selected dummy TCD cell placement area, to be invalid, and determines the dummy TCD cell placed in the dummy TCD cell placement area to be invalid.

Step S111: The dummy TCD cell placement unit 52 determines whether all the dummy TCD cell placement areas have been selected in the selected lowest hierarchical layer. If the dummy TCD cell placement unit 52 determines that all the dummy TCD cell placement areas have been selected, the processing proceeds to step S112 in FIG. 37. If the dummy TCD cell placement unit 52 determines that all the dummy TCD cell placement areas have not been selected, the processing returns to step S104.

Step S112: The dummy TCD cell placement unit 52 calculates the dummy TCD cell placement ratio.

Step S113: The dummy TCD cell placement unit 52 determines whether the calculated dummy TCD cell placement ratio satisfies the upper limit of the placement ratio specified in the above setting file. If the dummy TCD cell placement unit 52 determines that the calculated dummy TCD cell placement ratio satisfies the upper limit of the placement ratio, the processing proceeds to step S115. If the dummy TCD cell placement unit 52 determines that the calculated dummy TCD cell placement ratio does not satisfy the upper limit of the placement ratio, the processing proceeds to step S114.

Step S114: The dummy TCD cell placement unit 52 sets an error flag indicating occurrence of an error to ON. This error indicates that the calculated dummy TCD cell placement ratio does not satisfy the upper limit of the placement ratio.

Step S115: The dummy TCD cell placement unit 52 determines whether the calculated dummy TCD cell placement ratio satisfies the lower limit of the placement ratio specified in the above setting file. If the dummy TCD cell placement unit 52 determines that the placement ratio satisfies the lower limit, the processing proceeds to step S117. If the dummy TCD cell placement unit 52 determines that the placement ratio does not satisfy the lower limit, the processing proceeds to step S116.

Step S116: The dummy TCD cell placement unit 52 sets the error flag indicating occurrence of an error to ON. This error indicates that the calculated dummy TCD cell placement ratio does not satisfy the lower limit of the placement ratio.

Step S117: The dummy TCD cell placement unit 52 calculates a reserve area creation ratio.

Step S118: The dummy TCD cell placement unit 52 determines whether the calculated reserve area creation ratio satisfies the creation ratio specified in the above setting file.

If the dummy TCD cell placement unit 52 determines that the calculated reserve area creation ratio satisfies the specified creation ratio, the processing proceeds to step S120. If the dummy TCD cell placement unit 52 determines that the calculated reserve area creation ratio does not satisfy the specified creation ratio, the processing proceeds to step S119.

Step S119: The dummy TCD cell placement unit 52 sets an error flag indicating occurrence of an error to ON. This error indicates that the calculated reserve area creation ratio does not satisfy the specified creation ratio.

Step S120: The dummy TCD cell placement unit 52 determines whether all the lowest hierarchical layers have been selected. If the dummy TCD cell placement unit 52 determines that all the lowest hierarchical layers have been selected, the processing proceeds to step S121. If the dummy TCD cell placement unit 52 determines that all the lowest hierarchical layers have not been selected, the processing returns to step S103.

Step S121: The dummy TCD cell placement unit 52 checks whether the dummy TCD cell placement rule in the highest hierarchical layer is satisfied.

Step S122: The dummy TCD cell placement unit 52 causes the output unit 55 to output a placement validation result. Next, the dummy TCD cell placement unit 52 ends the validation processing.

The order of the steps of the above processing is an example, and thus, the order may be changed as needed.

FIG. 38 illustrates an example of an outputted validation result.

The validation result includes "TCD placement rule check result" checked in step S121 (good (indicating no error) or failure (indicating an error)), details of the result, and information about the validation result about the individual lowest hierarchical layer.

(Dummy TCD Cell Placement Validation Using Interactive Editor)

Figure 39:
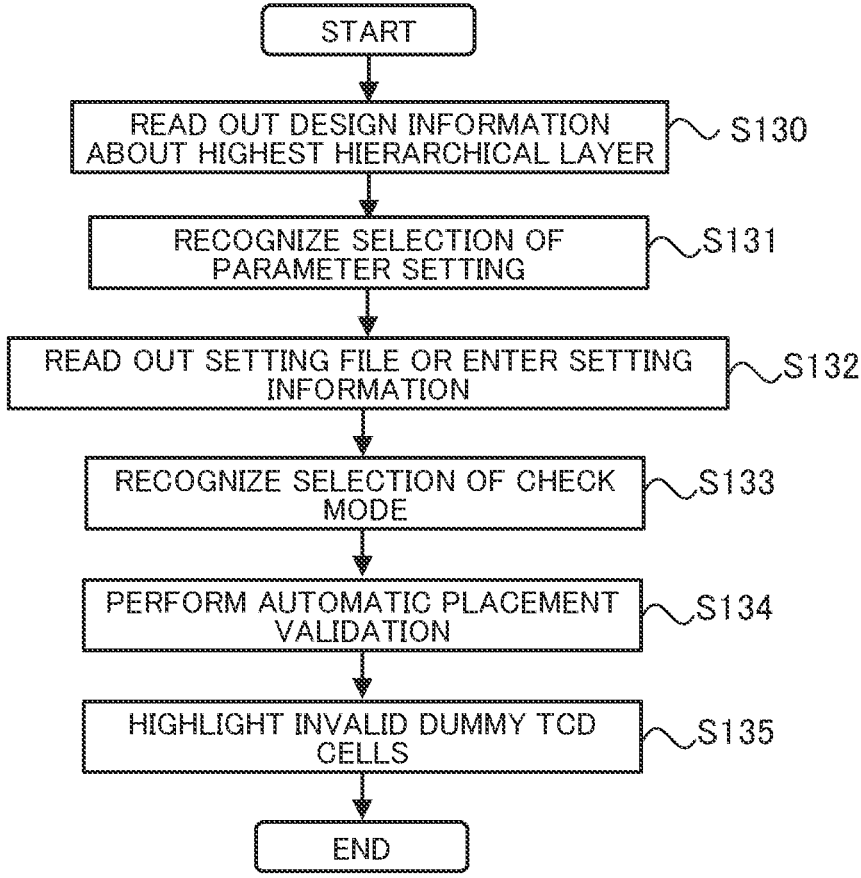
FIG. 39 is a flowchart illustrating an example of dummy TCD cell placement validation using the interactive editor.

FIG. 39 is a flowchart illustrating an example of dummy TCD cell placement validation using an interactive editor.

Step S130: The dummy TCD cell placement unit 52 reads out the design information about the highest hierarchical layer from the highest hierarchical layer DB 53.

Step S131: If the parameter setting is selected on the screen of the interactive editor, the dummy TCD cell placement unit 52 recognizes the setting.

Step S132: The dummy TCD cell placement unit 52 reads out the setting file about the highest hierarchical layer. Alternatively, for example, setting information is entered by using the interactive editor as described above, and the dummy TCD cell placement unit 52 acquires the entered setting information.

Step S133: If the check mode is selected on the screen of the interactive editor, the dummy TCD cell placement unit 52 recognizes the check mode.

For example, if "CHECK" is selected and "EXEC" is pressed on "Dummy TCD Window" illustrated in FIG. 34, the selection of the check mode is recognized. Also, if "EXEC" in the section "Dummy TCD Check" on "Dummy TCD PLACE Window" illustrated in FIG. 34 is pressed, the selection of the check mode is recognized.

Step S134: The dummy TCD cell placement unit 52 executes a program that performs batch processing, so as to perform the automatic placement validation processing as illustrated in FIGS. 36 and 37.

Step S135: The dummy TCD cell placement unit 52 causes the output unit 55 to emphasize (for example, highlight) the dummy TCD cells determined as invalid by the placement validation. Next, the dummy TCD cell placement unit 52 ends the processing.

The order of the steps of the above processing is an example, and thus, the order may be changed as needed.

Figure 40:
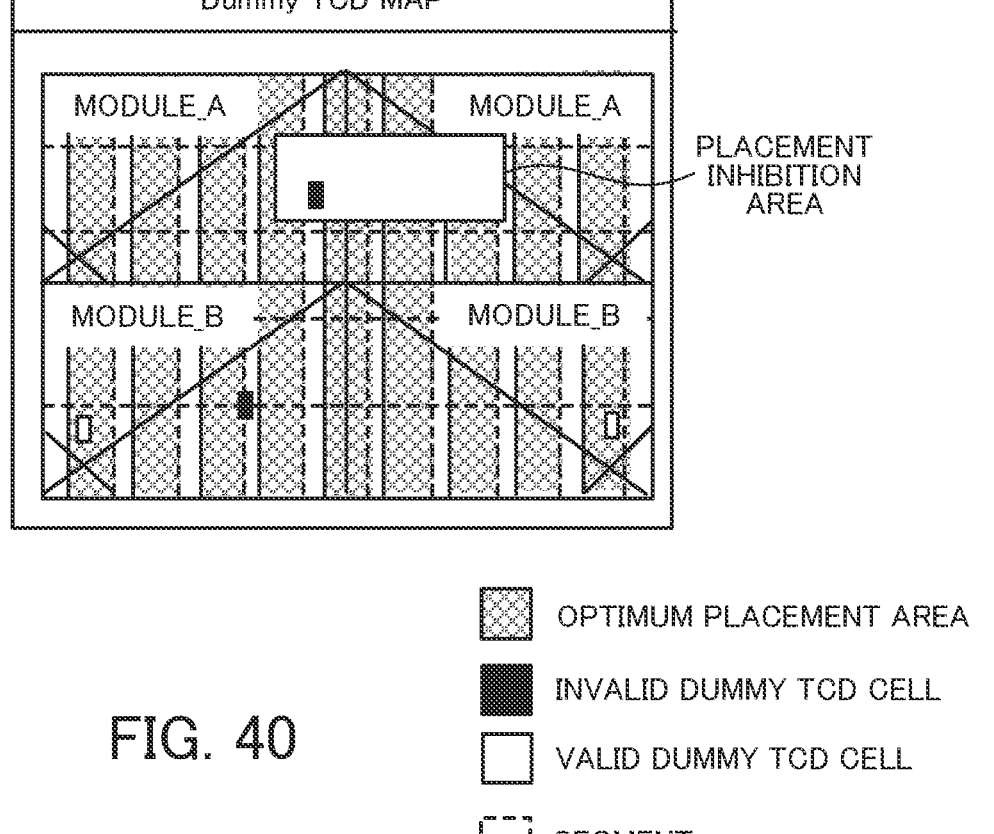
FIG. 40 illustrates a display example of a result of placement validation using the interactive editor.

FIG. 40 illustrates a display example of a result of placement validation using an interactive editor.

"Dummy TCD MAP" illustrates examples of an invalid dummy TCD cell located on the boundary of a check window (segment) and an invalid dummy TCD cell that overlaps a placement inhibition area. These invalid dummy TCD cells are highlighted by using, for example, different colors so that the invalid dummy TCD cells are distinguished from the valid dummy TCD cells.

Next, the processing for placing TCD cells in the lowest hierarchical layer illustrated in FIG. 10 will be described in detail. The following description will be made on a case in which the TCD cell placement unit 54*a*1 in the module 54*a* illustrated in FIG. 9 automatically places TCD cells and a case in which TCD cells are placed by using an interactive editor. The placement processing performed by the TCD cell placement unit 54*b*1 in the module 54*b* and the TCD cell placement unit 54*c*1 in the module 54*c* is the same as the placement processing performed by the TCD cell placement unit 54*a*1.

(Automatic TCD Cell Placement Processing)

Figure 41:
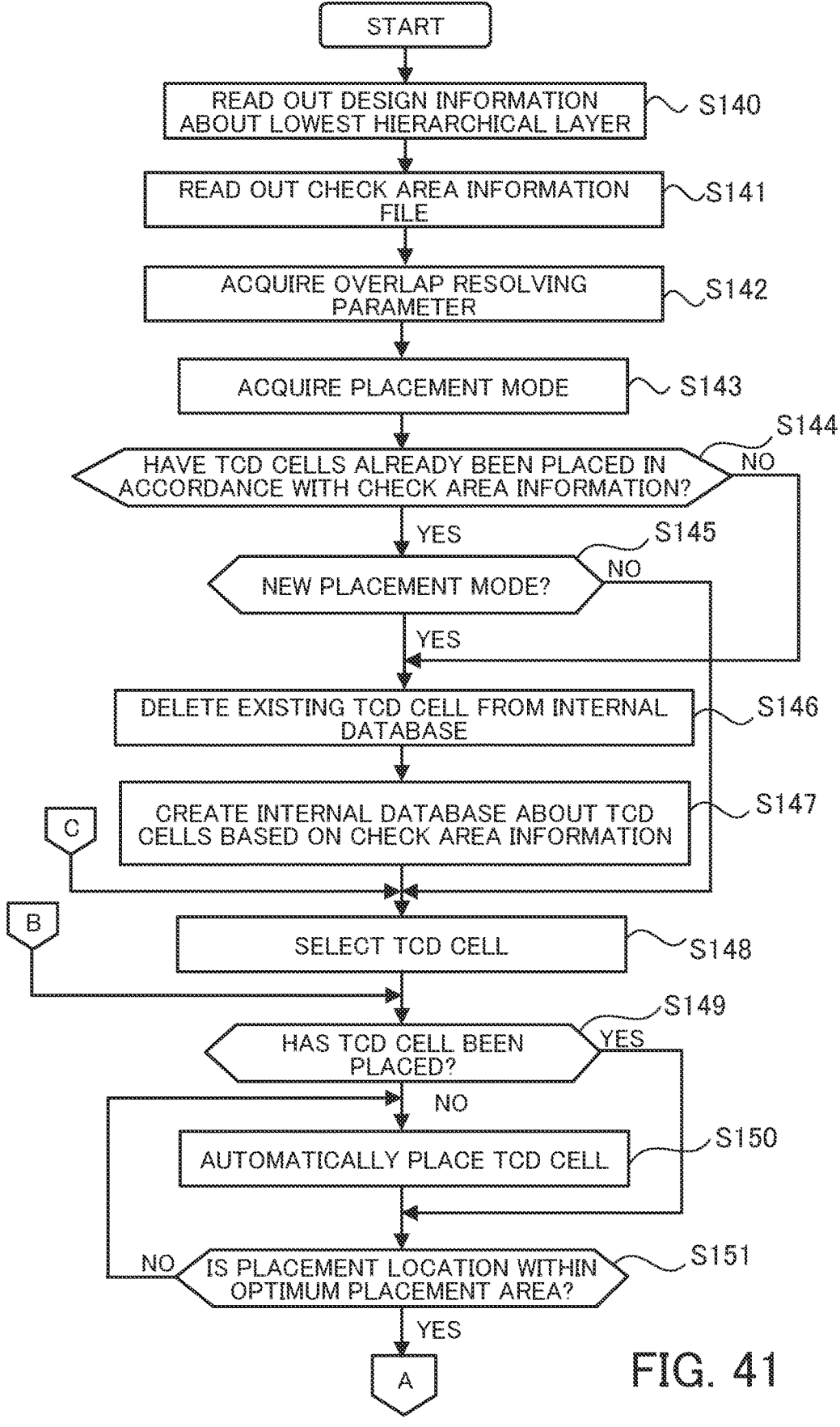
FIG. 41 is a first flowchart illustrating an example of automatic TCD cell placement processing in a lowest hierarchical layer.
Figure 42:
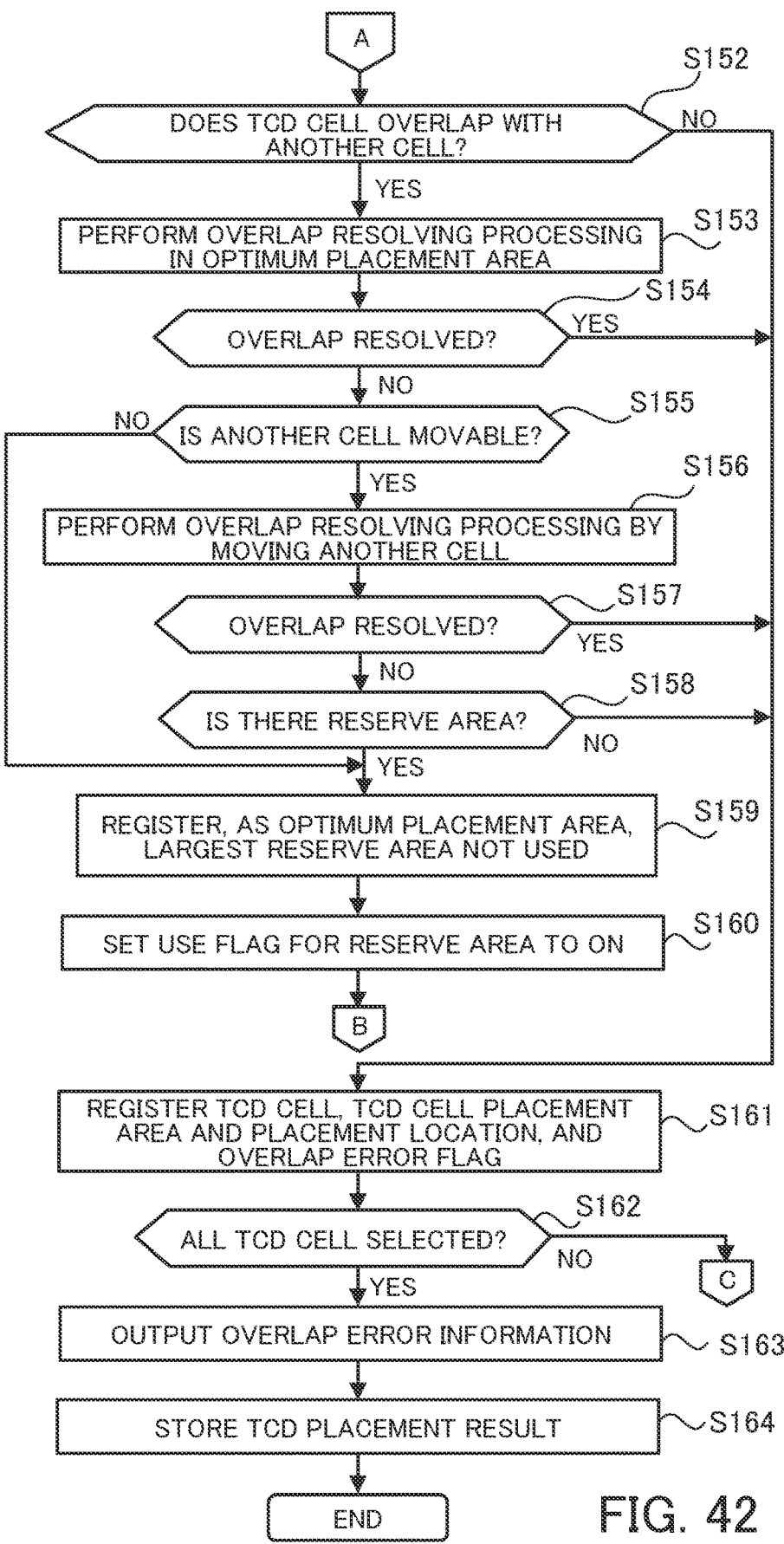
FIG. 42 is a second flowchart illustrating the example of the automatic TCD cell placement processing in the lowest hierarchical layer.

FIGS. 41 and 42 are a flowchart illustrating an example of automatic TCD cell placement processing in a lowest hierarchical layer.

Step S140: The TCD cell placement unit 54*a*1 reads out the design information about the lowest hierarchical layer from the lower hierarchical layer DB 54*a*2.

Step S141: The TCD cell placement unit 54*a*1 reads out the check area information file outputted from the highest hierarchical layer (see FIG. 21).

Step S142: The TCD cell placement unit 54*a*1 acquires an overlap resolving parameter that is previously set or entered. The overlap resolving parameter represents whether movement of another cell is allowed or not. The overlap resolving parameter may be set per cell.

Step S143: The TCD cell placement unit 54*a*1 acquires the placement mode that is previously set or entered. Examples of the placement mode include a repair mode and a new placement mode.

Step S144: If an internal database about TCD cells has already been created in the lower hierarchical layer DB 54*a*2, the TCD cell placement unit 54*a*1 refers to the internal database and determines whether TCD cells have already been placed in accordance with the check area information. If the TCD cell placement unit 54*a*1 determines that TCD cells have already been placed in accordance with the check area information, the processing proceeds to step S145. If the TCD cell placement unit 54*a*1 determines that TCD cells have not been placed in accordance with the check area information, the processing proceeds to step S146.

Step S145: The TCD cell placement unit 54*a*1 determines whether the placement mode is the new placement mode. If the TCD cell placement unit 54*a*1 determines that the placement mode is the new placement mode, the processing proceeds to step S146. If the TCD cell placement unit 54*a*1 determines that the placement mode is not the new placement mode, the processing proceeds to step S148.

Step S146: If there is an existing TCD cell, the TCD cell placement unit 54*a*1 deletes the existing TCD cell from the internal database.

Step S147: The TCD cell placement unit 54*a*1 creates an internal database about TCD cells based on the check area information.

Step S148: The TCD cell placement unit 54*a*1 selects one of the plurality of TCD cells to be placed, based on the check area information.

Step S149: The TCD cell placement unit 54*a*1 determines whether the selected TCD cell has been placed. If the TCD cell placement unit 54*a*1 determines that the selected TCD cell has not been placed yet, the processing proceeds to step S150. If the TCD cell placement unit 54*a*1 determines that the selected TCD cell has already been placed, the processing proceeds to step S151.

Step S150: The TCD cell placement unit 54*a*1 automatically places the selected TCD cell in a site area around a center portion in an optimum placement area, based on check area information.

Step S151: The TCD cell placement unit 54*a*1 determines whether the TCD cell placement location is within the optimum placement area. If the TCD cell placement unit 54*a*1 determines that the TCD cell placement location is within the optimum placement area, the processing proceeds to step S152 in FIG. 42. If the TCD cell placement unit 54*a*1 determines that the TCD cell placement location is not within the optimum placement area, the processing returns to step S150.

Step S152: The TCD cell placement unit 54*a*1 determines whether the placed TCD cell overlaps with another cell. If the TCD cell placement unit 54*a*1 determines that the placed TCD cell overlaps with another cell, the TCD cell placement unit 54*a*1 sets an overlap error flag to ON, and the processing proceeds to step S153. If the TCD cell placement unit 54*a*1 determines that the placed TCD cell does not overlap with another cell, the TCD cell placement unit 54*a*1 sets the overlap error flag to OFF, and the processing proceeds to step S161.

Step S153: The TCD cell placement unit 54*a*1 performs overlap resolving processing by finding an available space for the TCD cell in the optimum placement area.

Step S154: The TCD cell placement unit 54*a*1 determines whether the overlap has been resolved. If the TCD cell placement unit 54*a*1 determines that the overlap has been resolved, the TCD cell placement unit 54*a*1 sets the overlap error flag to OFF, and the processing proceeds to step S161. If the TCD cell placement unit 54*a*1 determines that the overlap has not been resolved, the TCD cell placement unit 54*a*1 keeps the overlap error flag ON, and the processing proceeds to step S155.

Step S155: The TCD cell placement unit 54*a*1 checks the overlap resolving parameter and determines whether movement of another cell is allowed. If the TCD cell placement unit 54*a*1 determines that movement of another cell is allowed, the processing proceeds to step S156. If the TCD cell placement unit 54*a*1 determines that movement of another cell is not allowed, the processing proceeds to step S159.

Step S156: To create an available space for the TCD cell in the optimum placement area, the TCD cell placement unit 54*a*1 performs the overlap resolving processing by moving a cell other than a cell whose placement location needs to be fixed.

Step S157: The TCD cell placement unit 54*a*1 determines whether the overlap has been resolved. If the TCD cell placement unit 54*a*1 determines that the overlap has been resolved, the TCD cell placement unit 54*a*1 sets the overlap error flag to OFF, and the processing proceeds to step S161. If the TCD cell placement unit 54*a*1 determines that the overlap has not been resolved yet, the TCD cell placement unit 54a1 keeps the overlap error flag ON, and the processing proceeds to step S158.

Step S158: The TCD cell placement unit 54a1 checks the check area information and determines whether there is a reserve area. If the TCD cell placement unit 54a1 determines that there is a reserve area, the processing proceeds to step S159. If the TCD cell placement unit 54a1 determines that there is no reserve area, the processing proceeds to step S161.

Step S159: The TCD cell placement unit 54a1 registers, as an optimum placement area, the largest reserve area that is not used.

Step S160: The TCD cell placement unit 54a1 sets a use flag indicating that the reserve area registered as an optimum placement area is in use to ON, and the processing returns to step S149 in FIG. 41.

Step S161: The TCD cell placement unit 54a1 registers the TCD cell, the optimum placement area in which the TCD cell has been placed, the placement location of the TCD cell, and the overlap error flag.

Step S162: The TCD cell placement unit 54a1 determines whether all the TCD cells have been selected. If the TCD cell placement unit 54a1 determines that all the TCD cells have been selected, the processing proceeds to step S163. If the TCD cell placement unit 54a1 determines that all the TCD cells have not been selected, the processing returns to step S148 in FIG. 41.

Step S163: If the overlap error flag is ON, the TCD cell placement unit 54a1 outputs an overlap error information indicating occurrence of an overlap error.

Step S164: The TCD cell placement unit 54a1 stores a TCD placement result including the TCD cells, the optimum placement areas in which the TCD cells have been placed, the TCD cell placement locations, etc. in an internal database about the TCD cells. Next, the TCD cell placement unit 54a1 ends the TCD cell placement processing.

The order of the steps of the above processing is an example, and thus, the order may be changed as needed.

(TCD Cell Placement Processing Using Interactive Editor)

Figure 43:
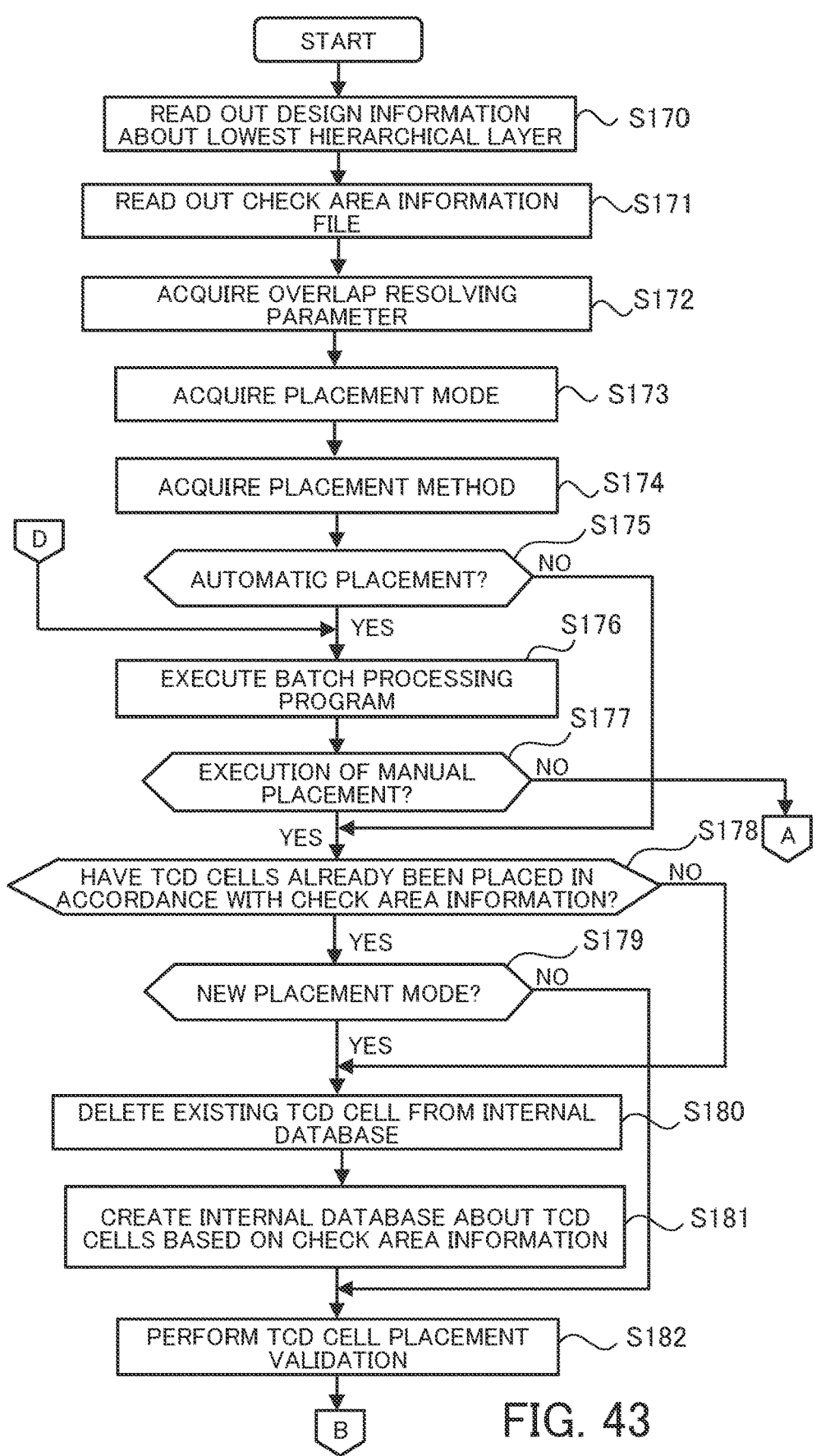
FIG. 43 is a first flowchart illustrating an example of TCD cell placement processing using the interactive editor.
Figure 44:
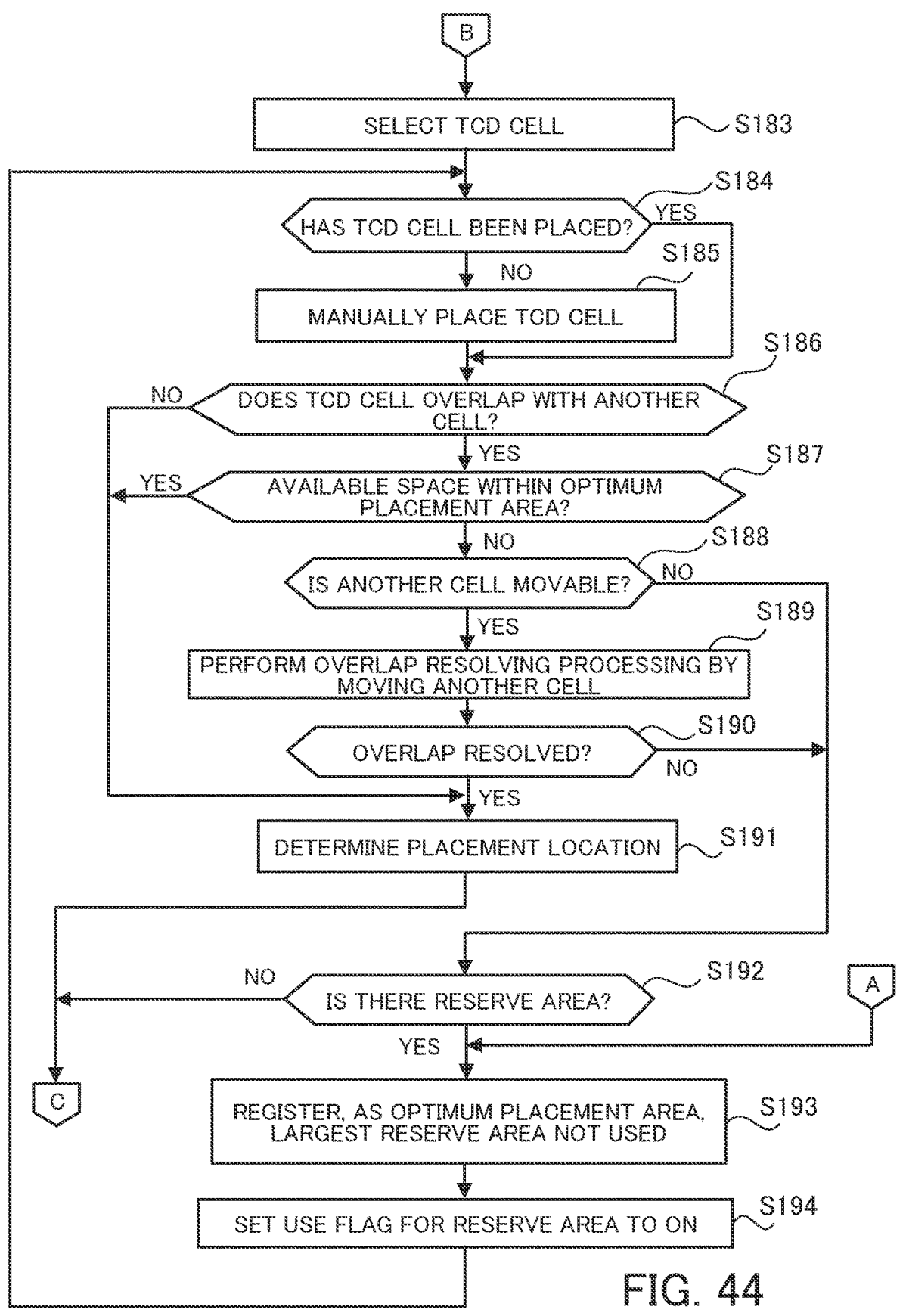
FIG. 44 is a second flowchart illustrating the example of the TCD cell placement processing using the interactive editor.
Figure 45:
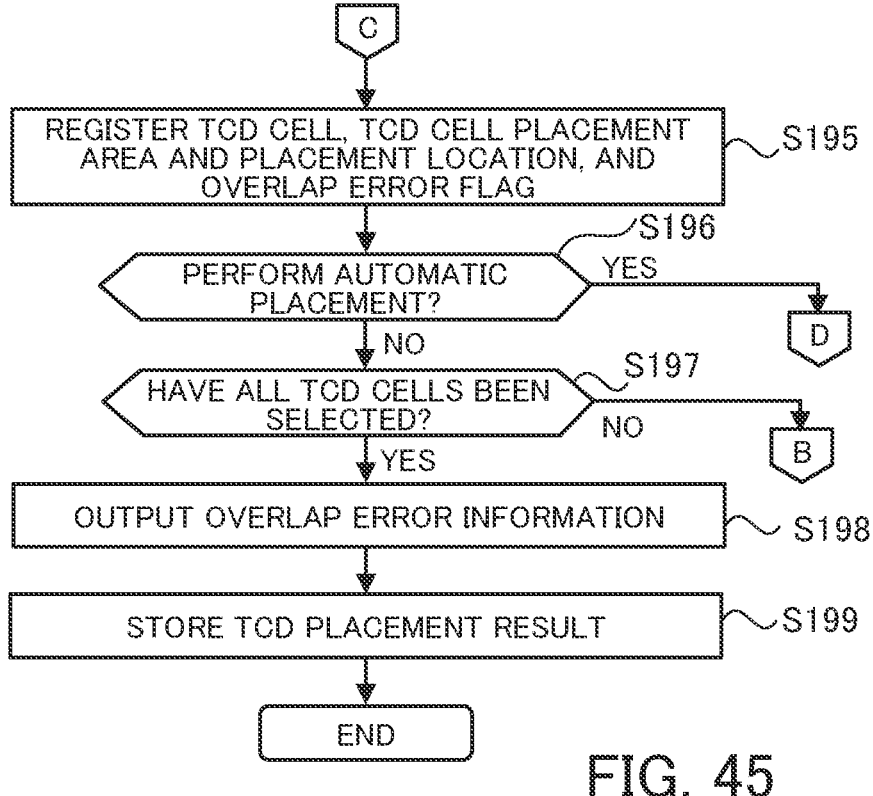
FIG. 45 is a third flowchart illustrating the example of the TCD cell placement processing using the interactive editor.

FIGS. 43 to 45 are a flowchart illustrating an example of TCD cell placement processing using an interactive editor.

Steps S170 to S173 are the same as steps S140 to S143 illustrated in FIG. 41.

Step S174: The TCD cell placement unit 54a1 acquires a placement method that is previously set or entered. The placement method is automatic placement or manual placement.

Step S175: The TCD cell placement unit 54a1 determines whether the placement method is automatic placement. If the TCD cell placement unit 54a1 determines that the placement method is automatic placement, the processing proceeds to step S176. If the TCD cell placement unit 54a1 determines that the placement method is not automatic placement, the processing proceeds to step S178.

Step S176: The TCD cell placement unit 54a1 executes a program that performs batch processing, so as to perform the automatic TCD cell placement processing as illustrated in FIGS. 41 and 42 as described above.

Step S177: The TCD cell placement unit 54a1 receives an entered user instruction and determines whether to perform manual placement. If the TCD cell placement unit 54a1 determines to perform manual placement, the TCD cell placement unit 54a1 sets the generation mode again, and the processing proceeds to step S178. If the TCD cell placement unit 54a1 determines not to perform manual placement, the processing proceeds to step S193 in FIG. 44.

Step S178: If an internal database about the TCD cells has already been created in the lower hierarchical layer DB 54a2, the TCD cell placement unit 54a1 refers to the internal database and determines whether the TCD cells have been placed in accordance with the check area information. If the TCD cell placement unit 54a1 determines that the TCD cells have been placed in accordance with the check area information, the processing proceeds to step S179. If the TCD cell placement unit 54a1 determines that the TCD cells have not been placed in accordance with the check area information, the processing proceeds to step S180.

Step S179: The TCD cell placement unit 54a1 determines whether the placement mode is the new placement mode. If the TCD cell placement unit 54a1 determines that placement mode is the new placement mode, the processing proceeds to step S180. If the TCD cell placement unit 54a1 determines that placement mode is not the new placement mode, the processing proceeds to step S182.

Step S180: If there is an existing TCD cell, the TCD cell placement unit 54a1 deletes the existing TCD cell from the internal database.

Step S181: The TCD cell placement unit 54a1 creates an internal database about TCD cells based on the check area information.

Step S182: The TCD cell placement unit 54a1 performs TCD cell placement validation. The placement validation will be described in detail below. Next, the processing proceeds to step S183 in FIG. 44.

Step S183: The TCD cell placement unit 54a1 selects one of the plurality of TCD cells to be placed, based on the check area information.

Step S184: The TCD cell placement unit 54a1 determines whether the selected TCD cell has been placed. If the TCD cell placement unit 54a1 determines that the selected TCD cell has not been placed yet, the processing proceeds to step S185. If the TCD cell placement unit 54a1 determines that the selected TCD cell has already been placed, the processing proceeds to step S186.

Step S185: TCD cell manual placement is performed by using an interactive editor. The TCD cell placement unit 54a1 acquires information about the placement location of the TCD cell manually placed, for example.

Step S186: The TCD cell placement unit 54a1 determines whether the placed TCD cell overlaps with another cell. If the TCD cell placement unit 54a1 determines that the placed TCD cell overlaps with another cell, the TCD cell placement unit 54a1 sets the overlap error flag to ON, and the processing proceeds to step S187. If the TCD cell placement unit 54a1 determines that the placed TCD cell does not overlap with another cell, the TCD cell placement unit 54a1 sets the overlap error flag to OFF, and the processing proceeds to step S191.

Step S187: The TCD cell placement unit 54a1 determines whether there is an available space for the TCD cell within the optimum placement area. If the TCD cell placement unit 54a1 determines that there is an available space for the TCD cell within the optimum placement area, the TCD cell placement unit 54a1 sets the overlap error flag to OFF, and the processing proceeds to step S191. If the TCD cell placement unit 54a1 determines that there is no available space for the TCD cell within the optimum placement area, the TCD cell placement unit 54a1 keeps the overlap error flag ON, and the processing proceeds to step S188.

Step S188: The TCD cell placement unit 54a1 checks the overlap resolving parameter and determines whether this another cell is movable. If the TCD cell placement unit 54a1 determines that this another cell is movable, the processing proceeds to step S189. If the TCD cell placement unit 54*a*1 determines that this another cell is not movable, the processing proceeds to step S192.

Step S189: In order to create an available space for the TCD cell within the optimum placement area, the TCD cell placement unit 54*a*1 performs the overlap resolving processing by moving a cell other than a cell whose placement location needs to be fixed.

Step S190: The TCD cell placement unit 54*a*1 determines whether the overlap has been resolved. If the TCD cell placement unit 54*a*1 determines that the overlap has been resolved, the TCD cell placement unit 54*a*1 sets the overlap error flag to OFF, and the processing proceeds to step S191. If the TCD cell placement unit 54*a*1 determines that the overlap has not been resolved, the TCD cell placement unit 54*a*1 keeps the overlap error flag ON, and the processing proceeds to step S192.

Step S191: The TCD cell placement unit 54*a*1 determines the placement location of the TCD cell in accordance with a user instruction entered by using an interactive editor. Next, the processing proceeds to step S195 in FIG. 45.

Step S192: The TCD cell placement unit 54*a*1 checks the check area information and determines whether there is a reserve area. If the TCD cell placement unit 54*a*1 determines that there is a reserve area, the processing proceeds to step S193. If the TCD cell placement unit 54*a*1 determines that there is no reserve area, the processing proceeds to step S195.

Step S193: The TCD cell placement unit 54*a*1 registers, as an optimum placement area, the largest reserve area that is not used.

Step S194: The TCD cell placement unit 54*a*1 sets a use flag indicating that the reserve area registered as an optimum placement area is in use to ON, and the processing returns to step S184.

Step S195: The TCD cell placement unit 54*a*1 registers the TCD cell, the optimum placement area in which the TCD cell has been placed, and the placement location of the TCD cell, and the overlap error flag.

Step S196: The TCD cell placement unit 54*a*1 receives a user instruction entered by using, for example, the interactive editor and determines whether to perform the automatic TCD cell placement. If the TCD cell placement unit 54*a*1 determines to perform the automatic placement, the processing returns to step S176 in FIG. 43. If the TCD cell placement unit 54*a*1 determines not to perform the automatic placement, the processing proceeds to step S197.

Step S197: The TCD cell placement unit 54*a*1 determines whether all the TCD cells have been selected. If the TCD cell placement unit 54*a*1 determines that all the TCD cells have been selected, the processing proceeds to step S198. If the TCD cell placement unit 54*a*1 determines that all the TCD cells have not been selected, the processing returns to step S183 in FIG. 44.

Step S198: If the overlap error flag is ON, the TCD cell placement unit 54*a*1 outputs the overlap error information indicating occurrence of an overlap error.

Step S199: The TCD cell placement unit 54*a*1 stores a TCD placement result indicating, for example, the TCD cells, the optimum placement areas in which the TCD cells have been placed, and the placement locations of the TCD cells in the internal database about the TCD cells. Next, the TCD cell placement unit 54*a*1 ends the TCD cell placement processing.

The order of the steps of the above processing is an example, and thus, the order may be changed as needed.

Figure 46:
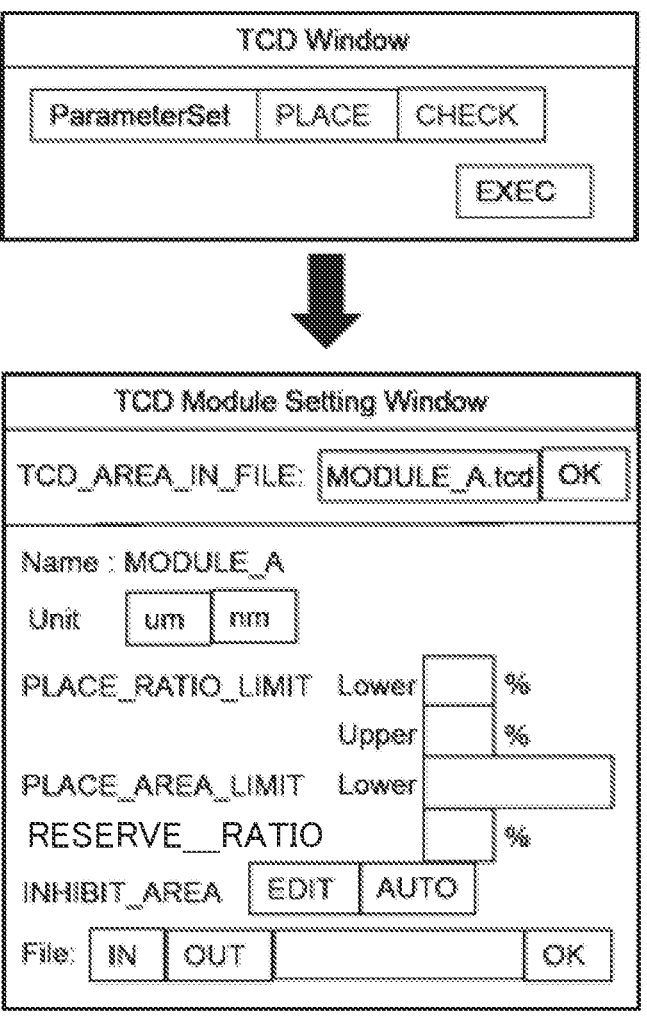
FIG. 46 illustrates a first example of an operation of placing TCD cells using the interactive editor.
Figure 47:
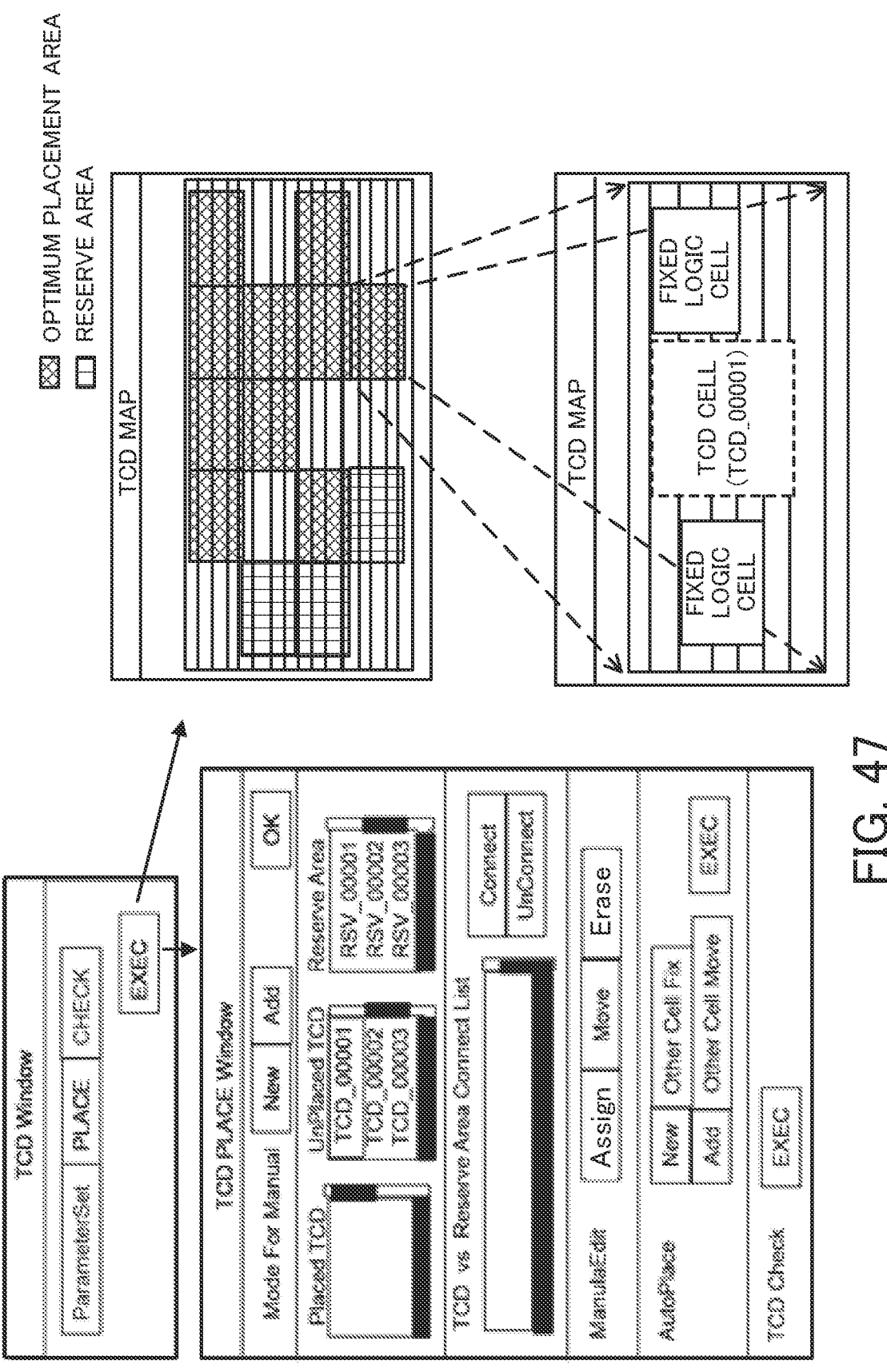
FIG. 47 illustrates a second example of the operation of placing TCD cells using the interactive editor.

FIGS. 46 and 47 illustrate an example of an operation of placing TCD cells using an interactive editor.

First, "TCD Window" as illustrated in FIG. 46 is displayed on the screen of the display 44*a*. When the user selects "Parameter Set" and presses "EXEC" by operating the input device 45*a*, "TCD Module Setting Window" is displayed.

When a check area information file name is entered in a box indicated by "TCD_AREA_IN_FILE" and "OK" is pressed on "TCD Module Setting Window", the check area information is displayed on the screen.

Next, when "PLACE" is selected and "EXEC" is pressed on "TCD Window" as illustrated in FIG. 47, "TCD PLACE Window" and "TCD MAP" are displayed.

When "New" (the new generation mode) or "Add" (the additional generation mode) is selected and "OK" is pressed on "TCD PLACE Window", an unplaced TCD cell selection screen is displayed. On this screen, when an unplaced TCD cell is selected, "Assign" is pressed, and a TCD cell is placed in an optimum placement area, the placement location of the TCD cell is determined.

For example, when an optimum placement area is selected, the selected optimum placement area is enlarged as illustrated in FIG. 47. FIG. 47 illustrates an example in which a TCD cell (a TCD cell whose TCD cell name is "TCD_00001") is placed between two fixed logic cells.

The TCD cell placement unit 54*a*1 also performs the following placement modification, in addition to the above overlap resolving processing.

FIG. 48 illustrates TCD cell placement modification examples.

Case 1 is a placement modification example in which, when a TCD cell is misaligned from the grid of a site area, the TCD cell is properly placed with respect to the grid of the site area. This placement modification is called suction to a site area (or legalizing).

Case 2 is a placement modification example in which, when there are logic cells at locations where a TCD cell is to be placed, the TCD cell is moved to an available space within the optimum placement area. This placement modification is the above overlap resolving processing.

Case 3 is a case in which, for example, in a later phase of the design of the implementation (in a phase in which the TCD cells have already been placed), the user wishes to move a logic cell to a location near another logic cell to satisfy timing constraints but the user is not able to move the logic cell because there is no available space for the logic cell due to the placement location of a TCD cell. In this case, by moving the placement location of the TCD cell to an available space in the optimum placement area and by moving the logic cell to an area where the TCD cell has been placed, wiring that satisfies the timing constraints becomes possible.

Next, the TCD cell placement validation in the lowest hierarchical layer illustrated in FIG. 10 will be described in detail. The following description will be made on a case in which the TCD cell placement unit 54*a*1 automatically performs the TCD cell placement validation and on a case in which the user performs the TCD cell placement validation by using an interactive editor. The placement validation performed by the TCD cell placement unit 54*b*1 in the module 54*b* and the TCD cell placement unit 54*c*1 in the module 54*c* is the same as the placement validation performed by the TCD cell placement unit 54*a*1.

(Automatic TCD Cell Placement Validation)

Figure 49:
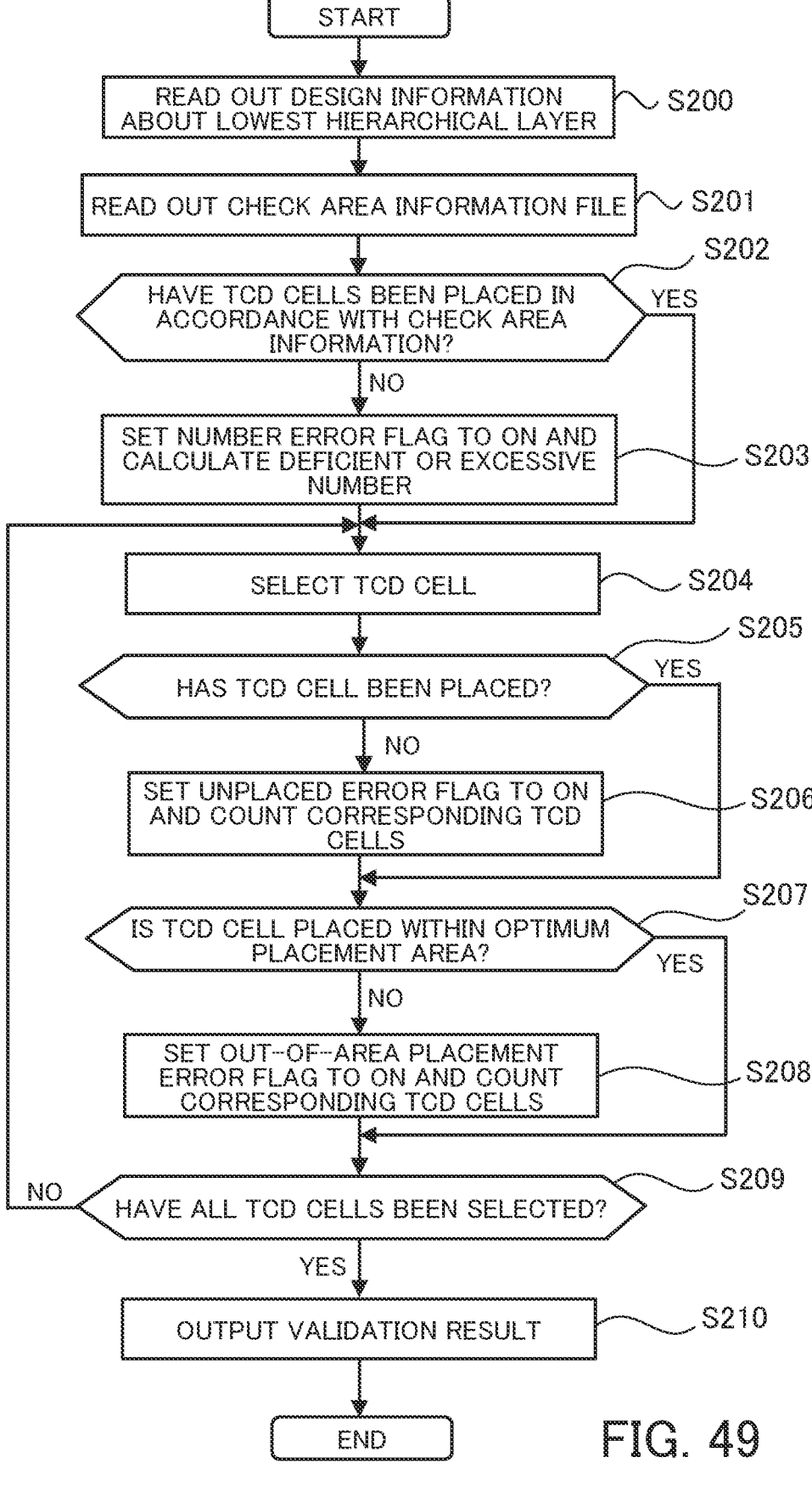
FIG. 49 is a flowchart illustrating an example of automatic TCD cell placement validation.

FIG. 49 is a flowchart illustrating an example of automatic TCD cell placement validation.

Step S200: The TCD cell placement unit 54a1 reads out the design information about the lowest hierarchical layer from the lower hierarchical layer DB 54a2.

Step S201: The TCD cell placement unit 54a1 reads out the check area information file outputted from the highest hierarchical layer side.

Step S202: If the TCD cell placement unit 54a1 determines whether the number of TCD cells in accordance with the check area information has been placed. If the TCD cell placement unit 54a1 determines that the number of TCD cells in accordance with the check area information has been placed, the processing proceeds to step S204. If the TCD cell placement unit 54a1 determines that the number of TCD cells in accordance with the check area information has not been placed, the processing proceeds to step S203.

Step S203: The TCD cell placement unit 54a1 sets a number error flag indicating occurrence of an error about the number of TCD cells to ON and calculates a deficient or excessive number of TCD cells, for example.

Step S204: The TCD cell placement unit 54a1 selects one of the TCD cells registered in the internal database about TCD cells, the database having been generated in step S181 in FIG. 43.

Step S205: The TCD cell placement unit 54a1 determines whether the selected TCD cell has been placed. If the TCD cell placement unit 54a1 determines that the selected TCD cell has not been placed yet, the processing proceeds to step S206. If the TCD cell placement unit 54a1 determines that the selected TCD cell has been placed, the processing proceeds to step S207.

Step S206: The TCD cell placement unit 54a1 sets an unplaced error flag indicating that the TCD cell has not been placed yet to ON and counts the TCD cells not placed yet.

Step S207: The TCD cell placement unit 54a1 determines whether the selected TCD cell is placed within an optimum placement area. If the TCD cell placement unit 54a1 determines that the selected TCD cell is placed within an optimum placement area, the processing proceeds to step S209. If the TCD cell placement unit 54a1 determines that the selected TCD cell is not placed within an optimum placement area, the processing proceeds to step S208.

Step S208: The TCD cell placement unit 54a1 sets an out-of-area placement error flag to ON. This error indicates that the TCD cell is not placed within an optimum placement area. In addition, the TCD cell placement unit 54a1 counts the TCD cells not within optimum placement areas.

Step S209: The TCD cell placement unit 54a1 determines whether all the TCD cells have been selected. If The TCD cell placement unit 54a1 determines that all the TCD cells have been selected, the processing proceeds to step S210. If the TCD cell placement unit 54a1 determines that all the TCD cells have not been selected, the processing returns to step S204.

Step S210: The TCD cell placement unit 54a1 causes the output unit 55 to output a placement validation result. Next, the TCD cell placement unit 54a1 ends the validation processing.

The order of the steps of the above processing is an example, and thus, the order may be changed as needed.

FIG. 50 illustrates an example of an outputted validation result.

The validation result includes "TOTAL check result" (good (indicating no errors) or failure (indicating an error)) and information about details of the result.

(TCD Cell Placement Validation Using Interactive Editor)

Figure 51:
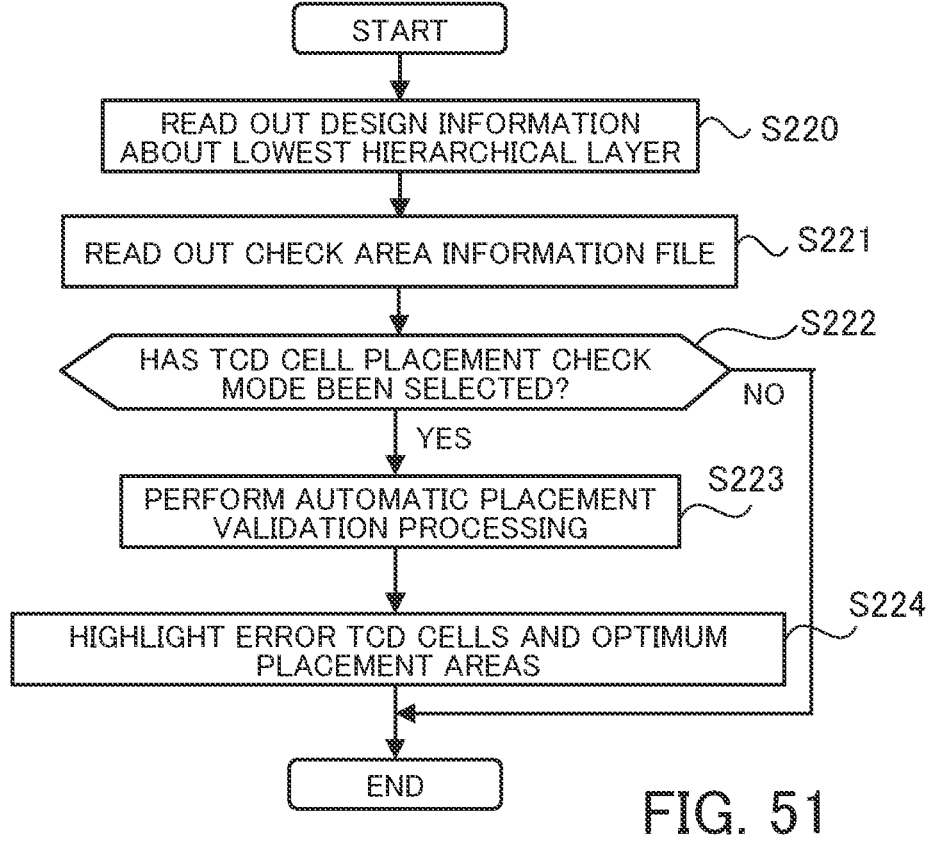
FIG. 51 is a flowchart illustrating an example of TCD cell placement validation using the interactive editor.

FIG. 51 is a flowchart illustrating an example of TCD cell placement validation using the interactive editor.

Step S220: The TCD cell placement unit 54a1 reads out the design information about the lowest hierarchical layer from the lower hierarchical layer DB 54a2.

Step S221: The TCD cell placement unit 54a1 reads out the check area information file outputted from the highest hierarchical layer side.

Step S222: The TCD cell placement unit 54a1 determines whether a TCD cell placement check mode has been selected by using an interactive editor. If the placement check mode has been selected on the screen of the interactive editor, the TCD cell placement unit 54a1 recognizes the placement check mode.

For example, if "CHECK" is selected and "EXEC" is pressed on "TCD Window" in FIG. 46, the selection of the placement check mode is recognized. The selection of the placement check mode is also recognized if "EXEC" in the section "TCD Check" on "TCD PLACE Window" illustrated in FIG. 47 is pressed.

If the TCD cell placement unit 54a1 determines that the TCD cell placement check mode has been selected, the processing proceeds to step S223. If the TCD cell placement unit 54a1 determines that the TCD cell placement check mode has not been selected, the TCD cell placement unit 54a1 ends the processing.

Step S223: The TCD cell placement unit 54a1 performs a program that performs batch processing, so as to perform the automatic placement validation processing as illustrated in FIG. 49.

Step S224: The TCD cell placement unit 54a1 causes the output unit 55 to emphasize (for example, highlight) the error TCD cells (a TCD cell that is not placed in an optimum placement area and a TCD cell that overlaps with another cell) and the optimum placement areas. Next, the TCD cell placement unit 54a1 ends the processing.

The order of the steps of the above processing is an example, and thus, the order may be changed as needed.

Figure 52:
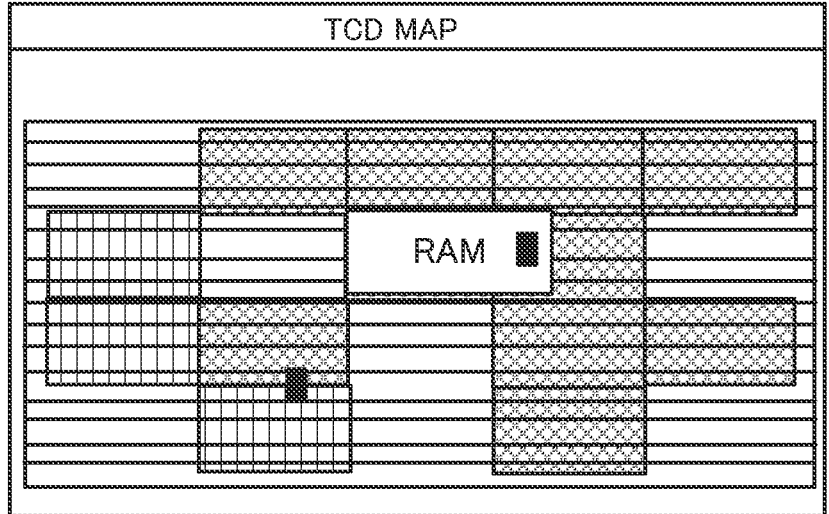
FIG. 52 illustrates a display example of a result of placement validation using the interactive editor.

FIG. 52 illustrates a display example of a result of placement validation using the interactive editor.

On "TCD MAP", a TCD cell that is not within an optimum placement area and a TCD cell that overlaps with another cell (a RAM in the example in FIG. 52) are highlighted as error TCD cells.

The design apparatus 40 and the design method of the second embodiment as described above also provide the same advantageous effects provided by the design apparatus 40 and the design method of the first embodiment. That is, occurrence of TCD cells determined invalid in the highest hierarchical layer is reduced, and the number of times that TCD cells are placed again in the lowest hierarchical layer, the number of times that the highest hierarchical layer is assembled, and the number of times that validation is performed again in the highest hierarchical layer are reduced. Therefore, the design period (design TAT) in hierarchical design is shortened.

In addition, since optimization of the placement areas such that TCD cells are not determined invalid is performed in the highest hierarchical layer, the TCD cell placement number is minimized. Thus, there is no need to place TCD cells excessively in the lowest hierarchical layer in order to prevent occurrence of a validation error in the placement validation in the highest hierarchical layer, and therefore, the placement and wiring properties are improved.

In addition, in the lowest hierarchical layer, even when a TCD cell overlaps with the placement area of another cell, the placement location is adjustable within the optimum placement area. In this way, even after the highest hierarchical layer is assembled, the TCD cell will not be determined invalid. Thus, the placement location is modified easily, and the design TAT is not significantly extended by the modification of the placement location. In addition, as illustrated in FIG. 48, because it is possible to modify the placements of TCD cells even in a later phase of the design of the implementation (in a phase in which the TCD cells have already been placed) (see FIG. 48), the placement and wiring properties are improved.

As described above, the above processing contents are realized by causing the design apparatus 40 to execute a program.

The program may be recorded in a computer-readable recording medium (for example, the recording medium 46a). Examples of the recording medium include a magnet disk, an optical disc, a magneto-optical disk, and a semiconductor memory. Examples of the magnet disk include an FD and an HDD. Examples of the optical disc include a CD, a CD-R (Recordable)/RW (Rewritable), a DVD, and a DVD-R/RW. The program may be recorded in portable recording media and distributed. In this case, the program may be copied from a portable recording medium to another recording medium (for example, the HDD 43) and executed.

An aspect of each of the design program, the design method, and the design apparatus has been described based on the above embodiments. However, the individual aspect is only an example and is not limited to the above description.

In one aspect, the embodiments shorten the design period in hierarchical design.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A non-transitory computer-readable recording medium storing therein a design program that causes a computer to execute a process comprising:
  reading out first design information about a highest hierarchical layer included in a plurality of layers stacked each other from a memory;
  dividing the highest hierarchical layer into a plurality of segments based on the first design information;
  detecting overlapping areas in which segments, among the plurality of segments, at a corresponding location among a plurality of instances in a lowest hierarchical layer included in the highest hierarchical layer overlap with each other at least partly when the plurality of instances are overlapped with each other;
  setting, in each of the overlapping areas in the plurality of instances, a temporary placement location in which a test cell used for testing of manufacturing variation in critical dimension is temporarily placed; and
  outputting information indicating the overlapping areas and the temporary placement locations.

2. The non-transitory computer-readable recording medium according to claim 1, wherein the process includes
  determining one of the plurality of instances as a reference instance, and detecting, in each of the plurality of instances other than the reference instance, a contact area formed by at least one segment that comes into contact with a first segment included in the reference instance among the plurality of segments when the plurality of instances placed in a same direction are overlapped with each other,
  wherein the segments at the corresponding location among the plurality of instances are an individual second segment which overlaps with the first segment most among the at least one segment included in the corresponding contact area and the first segment.

3. The non-transitory computer-readable recording medium according to claim 1, wherein the process includes
  placing a dummy cell having a same size as the test cell in each of the overlapping areas in the plurality of instances, and
  performing placement validation of the test cells in the highest hierarchical layer including the plurality of instances in which the dummy cells have been placed.

4. The non-transitory computer-readable recording medium according to claim 3, wherein the process includes
  placing, when a dummy cell has been placed in the overlapping area in a first instance among the plurality of instances based on user input, dummy cells also in the overlapping areas in the instances other than the first instance.

5. The non-transitory computer-readable recording medium according to claim 1, wherein the process includes
  placing the test cells in the temporary placement locations based on information indicating the overlapping areas and the temporary placement locations.

6. The non-transitory computer-readable recording medium according to claim 1, wherein the process includes
  placing, when a cell is already placed in any one of the temporary placement locations in the lowest hierarchical layer, the corresponding test cell in an available space in the corresponding overlapping area based on information indicating the overlapping areas and the temporary placement locations.

7. The non-transitory computer-readable recording medium according to claim 1, wherein the process includes
  modifying, when any one of the temporary placement locations in the lowest hierarchical layer is shifted from a site area as a cell placement area, the placement location of the corresponding test cell.

8. The non-transitory computer-readable recording medium according to claim 1, wherein the process includes
  acquiring information indicating a placement inhibition area in which placement of any one of the test cells is inhibited and deleting the overlapping area that overlaps with the placement inhibition area.

9. The non-transitory computer-readable recording medium according to claim 1, wherein the process includes
  outputting, when a plurality of overlapping areas including the overlapping areas are detected in the lowest hierarchical layer, information indicating that overlapping areas corresponding to a predetermined ratio among the plurality of overlapping areas are reserve areas in which the temporary placement locations are not set.

10. A design method comprising:
  reading out, by a computer, first design information about a highest hierarchical layer included in a plurality of layers stacked each other from a memory;
  dividing the highest hierarchical layer into a plurality of segments based on the first design information;

detecting, by the computer, overlapping areas in which segments, among the plurality of segments, at a corresponding location among a plurality of instances in a lowest hierarchical layer included in the highest hierarchical layer overlap with each other at least partly when the plurality of instances are overlapped with each other;

setting, by the computer, in each of the overlapping areas in the plurality of instances, a temporary placement location in which a test cell used for testing of manufacturing variation in critical dimension is temporarily placed; and outputting, by the computer, information indicating the overlapping areas and the temporary placement locations.

11. A design apparatus comprising:

a memory configured to store first design information about a highest hierarchical layer included in a plurality of layers stacked each other; and a processor configured to execute a process including:

reading out the first design information from the memory;

dividing the highest hierarchical layer into a plurality of segments based on the first design information, detecting overlapping areas in which segments, among the plurality of segments, at a corresponding location among a plurality of instances in a lowest hierarchical layer included in the highest hierarchical layer overlap with each other at least partly when the plurality of instances are overlapped with each other, setting, in each of the overlapping areas in the plurality of instances, a temporary placement location in which a test cell used for testing of manufacturing variation in critical dimension is temporarily placed, and outputting information indicating the overlapping areas and the temporary placement locations.

\* \* \* \* \*